United States Patent
Kawashima et al.

(10) Patent No.: US 8,623,511 B2
(45) Date of Patent: Jan. 7, 2014

(54) SPUTTERING TARGET FOR OXIDE THIN FILM AND PROCESS FOR PRODUCING THE SPUTTERING TARGET

(75) Inventors: Hirokazu Kawashima, Sodegaura (JP); Koki Yano, Sodegaura (JP); Futoshi Utsuno, Sodegaura (JP); Kazuyoshi Inoue, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 368 days.

(21) Appl. No.: 12/996,598

(22) PCT Filed: Jun. 5, 2009

(86) PCT No.: PCT/JP2009/060349
§ 371 (c)(1),
(2), (4) Date: Mar. 10, 2011

(87) PCT Pub. No.: WO2009/148154
PCT Pub. Date: Dec. 10, 2009

(65) Prior Publication Data
US 2011/0168994 A1   Jul. 14, 2011

(30) Foreign Application Priority Data

Jun. 6, 2008  (JP) .................. 2008-149752
Jun. 6, 2008  (JP) .................. 2008-149753
Jun. 13, 2008 (JP) .................. 2008-155669

(51) Int. Cl.
*B32B 33/00*   (2006.01)

(52) U.S. Cl.
USPC .......................................... 428/412; 428/697

(58) Field of Classification Search
USPC .................................... 428/697, 412
See application file for complete search history.

(56) References Cited

U.S. PATENT DOCUMENTS

| 5,622,653 A | 4/1997 | Orita et al. |
| 5,681,671 A | 10/1997 | Orita et al. |
| 5,843,341 A | 12/1998 | Orita et al. |

(Continued)

FOREIGN PATENT DOCUMENTS

| CN | 1 545 567 | 11/2004 |
| JP | 08-245220 | 9/1996 |

(Continued)

OTHER PUBLICATIONS

International Search Report PCT/J P2009/060349 Date of Completion Aug. 17, 2009, Date of Mailing Sep. 1, 2009 4pages.

(Continued)

*Primary Examiner* — Howard Weiss
*Assistant Examiner* — Steven Rao
(74) *Attorney, Agent, or Firm* — Millen, White, Zelano & Branigan, P.C.

(57) ABSTRACT

Disclosed is a sputtering target that can suppress the occurrence of anomalous discharge in the formation of an oxide semiconductor film by sputtering method and can continuously and stably form a film. Also disclosed is an oxide for a sputtering target that has a rare earth oxide C-type crystal structure and has a surface free from white spots (a poor appearance such as concaves and convexes formed on the surface of the sputtering target). Further disclosed is an oxide sintered compact that has a bixbyite structure and contains indium oxide, gallium oxide, and zinc oxide. The composition amounts (atomic %) of indium (In), gallium (Ga), and zinc (Zn) fall within a composition range satisfying the following formula: $In/(In+Ga+Zn)<0.75$.

25 Claims, 22 Drawing Sheets

(56) References Cited

U.S. PATENT DOCUMENTS

| | | |
|---|---|---|
| 5,955,178 A | 9/1999 | Orita et al. |
| 5,972,527 A * | 10/1999 | Kaijou et al. ............ 428/697 |
| 2004/0180217 A1 | 9/2004 | Inoue et al. |
| 2008/0308774 A1 | 12/2008 | Inoue et al. |
| 2009/0308635 A1 | 12/2009 | Yano et al. |
| 2012/0068130 A1 | 3/2012 | Inoue et al. |

FOREIGN PATENT DOCUMENTS

| | | |
|---|---|---|
| JP | 08-295514 | 11/1996 |
| JP | 2008-295514 | 11/1996 |
| JP | 10-063429 A | 3/1998 |
| JP | 2000-044236 A | 2/2000 |
| JP | 3644647 B2 | 2/2005 |
| JP | 2005-307269 A | 11/2005 |
| JP | 2007-73312 A | 3/2007 |
| JP | 3947575 B2 | 4/2007 |
| JP | 2007-223849 A | 9/2007 |
| WO | WO-2007/037191 A1 | 4/2007 |

OTHER PUBLICATIONS

Kenji Nomura et al. Room-temperature fabrication of transparent flexible thin-film transistors using amorphous oxide semiconductors, Nature, Nov. 25, 2004, vol. 432, pp. 488-492.

Office Action for Chinese Patent Application No. 200980129196 dated Jul. 4, 2012.

English Translation of Office Action for Chinese Patent Application No. 200980129196 dated Jul. 4, 2012.

\* cited by examiner

COMPARATIVE EXAMPLE B

SPUTTERING TARGET FOR OXIDE THIN FILM AND PROCESS FOR PRODUCING THE SPUTTERING TARGET

BACKGROUND OF THE INVENTION

1. Technical Field

The present invention relates to a sputtering target suitable for forming a oxide thin film and a process for producing thereof, wherein the oxide thin film is composed of an oxide sintered body which comprises indium oxide having a bixbyite structure, and a $Yb_2Fe_3O_7$ structure compound represented by the formula: $In_2Ga_2ZnO_7$.

The present invention also relates to a sputtering target suitable for forming a oxide semi-conductor and a method for producing thereof, wherein the oxide semi-conductor comprises oxides of indium (In), gallium (Ga) and zinc (Zn), and is composed of an oxide sintered body which comprises indium oxide having a bixbyite structure and a homologous structure compound $InGaO_3(ZnO)_m$ (m is a natural number of 1 to 4).

The present invention relates to a sintered body having a crystal structure of rare-earth oxide C type.

The present invention relates to a target having a crystal structure of rare-earth oxide C type, especially relates to a target suitable for forming an amorphous oxide film by sputtering and a method for producing thereof.

2. Background of the Art

An oxide semi-conductor film composed of a metallic composite oxide includes, for example, an oxide semi-conductor film composed of oxides of In, Ga and Zn (IGZO) (hereinafter also referred to as "oxide thin film"). An oxide semi-conductor film which film is formed by IGZO sputtering target draws attention as one having mobility greater than that of an amorphous Si film. Such an oxide semi-conductor film has mobility and visible light permeability greater than that of an amorphous Si film, and thus the film also draws attention as one to be applied for a switching element (thin film transistor) such as a liquid crystal display device or a thin film electroluminescence display device.

The IGZO sputtering target is known as one containing a compound represented by $InGaO_3(ZnO)_m$ (m is a natural number of 1 to 20) as a main component. However, when a sputtering (DC sputtering) is conducted by using the IGZO sputtering target, an abnormal electrical discharge caused by anomalous growth of the compound shown by $InGaO_3(ZnO)_m$, and thus there was a problem about defects on the obtained film. In addition, specific resistance of the obtained sputtering target was at least around $1 \times 10^{-2}$ Ωcm, this resistance is high and thus a plasma discharge is not stable, and DC sputtering was thus difficult, on top of that, a target which causes cracks during sputtering could not obtained.

A sputtering target intended to form an amorphous oxide film is known (Patent Document 1). In this document, a sintered body indicating crystal structure having homologous phase ($InGa(ZnO)_m$; m is natural number of less than 6) is used, and then the major component thereof is different from that of the present invention. In addition, the specific resistance of the target is around $1 \times 10^{-2}$ Ωcm or more which is so high, the target is not appropriate for conducting DC sputtering method having good productivity. The spattering target composed of a compound single phase represented by homologues structure $InGaO_3(ZnO)_m$ (m is natural number of 1 to 4) disclosed in the Patent Document 1 has different structure compounds of a sintered body from those of the present invention. The production process to obtain the sintered body of the compound single phase is complicated, sintering time is long, and thus a target sintered body having low cost could not be obtained. In addition, sintering conditions for forming a (single phase) sintered body consisting only of this homologues structure $InGaO_3(ZnO)_m$ are limited. Furthermore, bulk resistance of this homologues structure $InGaO_3(ZnO)_m$ (m is natural number of 1 to 4) was usually high such as $10^2$ to $10^3$ Ωcm, therefore, the bulk resistance was reduced by conducting reduction treatment after sintering. However, the bulk resistance after the reduction was at most around $1 \times 10^{-1}$ Ωcm, and thus effect of reducing the bulk resistance was small compared to a high number of production steps thereof. Further, the sputtering target composed of a sintered body only consisting of a compound represented by the homologues structure $InGaO_3(ZnO)_m$ causes an abnormal electrical discharge by anomalous growth during film-forming by sputtering, and thus there was a problem about defects on the obtained film.

In addition, a compound represented by $In_2Ga_2ZnO_7$ or $In_2Ga_2ZnO_{7-d}$ which has oxygen defect d is known as an oxide sintered body used as an electrode for a liquid crystal display, an EL display and a solar cell (Patent Documents 2 and 3). In this case, electrically conductive is applied by introducing an amount of oxygen defect d to a compound represented by $In_2Ga_2ZnO_7$, but the inventions of these documents have different crystal structure from that of the present invention. Therefore, in the production steps of an oxide sintered body, it was impossible to shorten a reduction step and to elongate a sintering time, and thus neither productivity could be heightened, nor cost could be lowered.

There is a report by Kimizuka, et. al. concerning a phase diagram of $In_2O_3$—$Ga_2ZnO_4$—$ZnO$ at 1350° C. However, the invention of this document has different crystal structure from that of the present invention. Therefore, in the production steps of an oxide sintered body, it was impossible to shorten a reduction step and to elongate a sintering time, and thus neither productivity could be heightened, nor cost could be lowered.

A field effect type transistor such as a thin-film transistor (TFT) is widely used for a unit electron device for a semi-conductor memory integrated circuit, a high-frequency signal amplifier device, a device for driving a liquid crystal, and is the most practically used electric device.

Among the above, because of recent dramatic progress in a display device, TFT is heavily used as a switching device for driving a display device by adding drive voltage to a display device among various kind of a display device such as a liquid crystal display device (LCD), an electroluminescence display device (EL), or a field emotion display (FED).

A silicon semi-conductor compound is most widely used as a material for a semi-conductor layer which is a primary member of a field effect type transistor. A silicon single crystal is generally used for a high-frequency signal amplifier device or a device for an integrated circuit where high-speed operation is required. For a device for driving a liquid crystal, an amorphous silicon semi-conductor (amorphous silicon) is used because of a request for one having large-area.

For example, as the TFT, there is an opposite stagger structure which laminates a gate electrode, a gate insulation layer, a semi-conductor layer such as a hydrogenated amorphous silicon (a-Si:H), a source electrode and drain electrode on a substrate such as a glass. This TFT is used for an image sensor, as well as a driving device for a flat panel display represented by an active matrix type liquid crystal display, within a field of a large-area device. Among these usages, high-speed driving is required based on high-functionalization, even though conventional amorphous silicon is used.

Currently, a switching device for driving a display device mainly uses a device using a silicon semi-conductor film, because a silicon thin film has various good properties such as stability, good workability, and high switching speed. This silicon thin film is generally prepared by a chemical vapor deposition (CVD) method.

A crystalline silicon thin film requires, for example, high temperature of 800° C. or more during crystallization, and thus it is difficult to compose it on a glass substrate or an organic material substrate. Therefore, there are several problems, for example, the film can be formed only on an expensive substrate having high heat resistance such as a silicon wafer or quartz, and the production thereof requires a lot of energy and many steps.

A crystalline silicon thin film is limited to a top-gate structure for a devise structure of an ordinary TFT, and thus it is difficult to reduce costs by cutting a number of masks down.

An amorphous silicon thin film can form under comparatively low temperature. However, switching speed of the film is slower than that of the crystalline film, and therefore, when the film is used for a switching device for driving a display device, displaying high-speed motion picture cannot be achieved sometimes.

Specifically, a liquid crystal television having VGA definition can use an amorphous silicon having 0.5 to 1 cm$^2$/Vs in mobility. But if the definition becomes SXGA, UXGA, QXGA, or higher, the mobility requires 2 cm$^2$/Vs or more. If driving frequency is raised for enhancing image quality, the mobility also must become higher.

An organic light emitting display is driven by current. Therefore, if an amorphous silicon which varies its properties by DC stress is used, there is a problem where image quality is degraded based on its long-term use.

In addition, if a crystalline silicon is used for the above usages, it becomes difficult to apply it to large-area. There is also a problem where production cost becomes higher, because high temperature heating treatment is needed.

Under these situations, recently, an oxide semi-conductor thin film using oxides is coming up as one having excellent stability rather than that of a silicon semi-conductor thin film For example, TFT using zinc oxide as a semi-conductor layer is released.

However, this semi-conductor layer has low mobility: about 1 cm$^2$/V·sec, and low ON-OFF ratio. In addition, leak current is easy to occur, and thus it was difficult to put it into industrial, practical use. Furthermore, many attempts were taken place for an oxide semi-conductor containing crystalline material using zinc oxide, but the following problems were present when a film was formed by a sputtering method which is commercially and commonly used.

That is, mobility is low, ON-OFF ratio is low, leak current is high, pinch-off is unclear, normally-ON is easy to occur, and thus properties in TFT are lowered. The obtained film has less chemical resistance, and thus process or usage environment is limited, for example, wet-etching is difficult. Further, a film must be formed under high pressure in order to improve its properties, but film-forming speed is slow as well as 700° C. or more of high temperature is required, and thus there are problems in industrialization. In addition, TFT properties such as mobility in a bottom-gate structure is low, and thus a TFT device structure is also limited, for example, top-gate structure and 50 nm or more of thickness are required for raising its properties.

In order to solve these problems, a method for producing an amorphous oxide semi-conductor film composed of indium oxide, zinc oxide and gallium oxide so as to drive a thin film transistor is discussed.

For instance, a target composed of a sintered body indicating a homologous crystal structure comprising indium oxide, zinc oxide and gallium oxide is disclosed (Patent Documents 4 and 5). However, the homologous crystal structure has less heat stability, and thus crystalline morphology is varied based on small change of sintering temperature or sintering time. Therefore, there are problems concerning instability in properties such as density in a target, bulk resistance, bending strength and surface roughness. In addition, if the target is used as one for making a thin film transistor, there are problems particularly for a homologous crystal structure where properties of the transistor is significantly varied between at the start of forming a film and at the end of forming a film.

A target composed of indium oxide, zinc oxide, and gallium oxide having 2.2 to 40 atom % of Ga, 50 to 90 atom % of In and 95% or more of relative density is disclosed (Patent Document 6). However, there is no discussion about a target having less than 50 atom % of In.

It is known that $In_2O_3$ (indium oxide) has a crystal structure of rare-earth oxide C type, and having high mobility caused by the crystal structure of rare-earth oxide C type. However, it has been difficult to make a sintered body which can readily incorporate oxygen at the time of sintering to have low resistance. A sputtering target composed of $In_2O_3$ (indium oxide) or containing plenty of $In_2O_3$ (indium oxide) has problems concerning that nodules (agglomerates found on a surface of the sputtering target) are easily created, that there are many particles (dusts of a sputter material found during sputtering), and that an abnormal electrical discharge during sputtering is easily occurred. It is known that if $In_2O_3$ (indium oxide) contains an atom other than In, a crystalline type other than rare-earth oxide C type such as $\beta$-$GaInO_3$, $\beta$-$Ga_2O_3$, $ZnGa_2O_4$ is formed. Especially, it is also known that if $Ga_2O_3$ is contained in an amount of 10 mass % or more ($In_2O_3$ becomes 90 mass % or less), $\beta$-$Ga_2O_3$ is formed (Non-Patent Document 1). If a crystalline type other than rare-earth oxide C type, especially $\beta$-$Ga_2O_3$ is formed, problems such as crack being formed, bulk resistance being high, relative density being low, bending strength (JIS R1601) being low, difficulty in obtaining a sputtering target being uniformity in various physical properties such as a structure, are easily occurred, and thus it becomes not appropriate for applying it to a sputtering target for industrial use. If it is used for forming a semi-conductor film, there are possibilities to cause ununiformity parts so as not to obtain in-plain uniformity, to cause reduction in yield ratio, or to cause reduction in reliability (stability).

Patent Document 1: JP-A-2007-73312
Patent Document 2: JP-B-3947575
Patent Document 3: JP-B-3644647
Patent Document 4: JP-A-2000-044236
Patent Document 5: JP-A-2007-73312
Patent Document 6: JP-A-H10-63429
Patent Document 7: JP-A-2007-223849
Non-Patent Document 1; Journal of the American Ceramic Society 1997, 80, pp. 253 to 257

DISCLOSURE OF THE PRESENT INVENTION

Problems to be Solved by the Present Invention

The first object of the present invention is to provide a sputtering target having reduced occurrence of abnormal electrical discharge during film-forming of an oxide thin film using a sputtering method.

The second object of the present invention is to provide a sputtering target capable of film-forming continuously and stably.

The third object of the present invention is to provide a sputtering target using a sintered body having an excellent effect on reducing bulk resistance, high productivity, and low cost.

The forth object of the present invention is to provide a sputtering target for an oxide thin film having reduced occurrence of abnormal electrical discharge during film-forming of an oxide thin film using a sputtering method, and capable of film-forming continuously and stably.

The fifth object of the present invention is to provide a method for producing a thin film transistor comprising an oxide thin film and an oxide insulation layer by using the above-mentioned sputtering target.

The sixth object of the present invention is to provide a sputtering target having no White-spot (defective appearance such as concavo-convex created on a surface of a sputtering target) on a surface.

The seventh object of the present invention is to provide a sputtering target having fast sputtering rate.

The eighth object of the present invention is to provide a sputtering target capable of direct current (DC) sputtering during the formation of a film by sputtering, as well as not causing arcing; less creating particles (dusts) or nodules; and providing high density, less scattering in its quality and advanced mass productivity.

The ninth object of the present invention is to provide an oxide suitable for the above-mentioned sputtering target.

The tenth object of the present invention is to provide a thin film, preferably a protective film, obtained by using the sputtering target; and a method for producing a thin film transistor comprising the film.

Means for Solving the Problems

The present inventors intently made their studies and then the inventors conceived the present invention, since they found that if an oxide sintered body composed of indium oxide having a bixbyite structure and an oxide comprising $Yb_2Fe_3O_7$ structure compound represented by the formula: $In_2Ga_2ZnO_7$, which is obtained by combining indium (In), gallium (Ga) and zinc (Zn) in the specific composition ratio and then sintering it under the specific condition, is used as a sputtering target, occurrence of abnormal electrical discharge during film-forming of an oxide thin film using a sputtering method is reduced, and then the film can be formed continuously and stably.

The present inventors intently made their studies and then the inventors conceived the present invention, since they also found that if an oxide sintered body which comprises indium oxide having a bixbyite structure, and a homologous structure compound of $InGaO_3(ZnO)_m$ (m is a natural number of 1 to 4) is used as a oxide sintered body used for a sputtering target, then an excellent effect on reducing bulk resistance is acquired, manufacture steps can be simplified, occurrence of abnormal electrical discharge during film-forming of an oxide thin film using a sputtering method is reduced, and then the film can be formed continuously and stably.

In addition, as stated above, a sintered body of an oxide of indium (In) ($In_2O_3$ (indium oxide)) only comprising indium (In) as a metal atom has a crystal structure of rare-earth oxide C type. However, if atoms other than In are contained as a metal atom, a crystalline structure such as $\beta$-$GaInO_3$, $\beta$-$Ga_2O_3$, $ZnGa_2O_4$ is formed, and then the crystalline structure of rare-earth oxide C type is disappeared.

However, the present inventors found that when 100 atom % is based on the atomicity of all the atoms included in oxides at issue other than oxide, even if an oxide only contains indium (In) in an atom ratio of 49 atom % or less, in accordance with the combination of composition ratio in the oxide and sintering condition of the oxide, a crystalline structure of rare-earth oxide C type which was supposed to be disappeared because of the present of a metal atom other than In can be re-constructed. Unexpectedly, by using a sintered body of the finally obtained oxide, even if the content of In is low, a sputtering target having low bulk resistance, high relative density, and high bending strength can be provided. In addition, a target which creates extremely less nodules release during sputtering can also be provided, comparing it with a target containing a lot of In.

By preparing a thin film transistor using this sputtering target, a thin film transistor having high transistor properties and manufactural stability is obtained.

The present invention may relate to the followings.

[1] An oxide sintered body having a bixbyite structure and comprising indium oxide, gallium oxide, and zinc oxide, in which a composition amount of indium (In), gallium (Ga) and zinc (Zn) by atom ratio is in a composition range of the following formula.

$In/(In+Ga+Zn)<0.75$

[2] The oxide sintered body of [1], in which the composition amount of indium (In), gallium (Ga) and zinc (Zn) by atom ratio meets the following formula.

$0.10<Ga/(In+Ga+Zn)<0.49$

[3] The oxide sintered body of [1] or [2], in which the composition amount of indium (In), gallium (Ga) and zinc (Zn) by atom ratio meets the following formula.

$0.05<Zn/(In+Ga+Zn)<0.65$

[4] An oxide sintered body comprising indium oxide having a bixbyite structure, and a $Yb_2Fe_3O_7$ structure compound represented by the formula: $In_2Ga_2ZnO_7$.

[5] The oxide sintered body of [4], in which a composition amount of indium (In), gallium (Ga) and zinc (Zn) by atom ratio is in a composition range of the following formula.

$0.5<In/(In+Ga)<0.98, 0.6<Ga/(Ga+Zn)<0.99$

[6] The oxide sintered body of [4] or [5], in which a part of In in said indium oxide and $In_2Ga_2ZnO_7$ is subjected to solid solution substitution by a metal element (X) having positive four or more valences.

[7] An oxide sintered body comprising indium oxide having a bixbyite structure, and one or more homologous structure compounds represented by $InGaO_3(ZnO)_m$ (m is a natural number of 1 to 4).

[8] The oxide sintered body of [7], in which a composition amount of indium (In), gallium (Ga) and zinc (Zn) in said oxide sintered body by atom ratio is in a composition range of the following formula.

$0.5<In/(In+Ga)<0.99, 0.2<Zn/(In+Ga+Zn)<0.7$

[9] The oxide sintered body of [7] or [8], in which a part of In in said indium oxide or said one or more homologous structure compounds is subjected to solid solution substitution by a metal element having positive four or more valences.

[10] An oxide sintered body comprising In (indium) in an amount of 24 to 49 atom % based on the atomicity of all the atoms included in oxides at issue other than oxide as 100 atom %, and having a crystalline structure of rare-earth oxide C type.

[11] The oxide sintered body of [10] comprising In (indium) in an amount of 24 to 49 atom %, Ga (gallium) in an amount of 10 to 49 atom %, and Zn (zinc) in an amount of 5 to 65 atom % based on the atomicity of all the atoms included in oxides at issue other than oxide as 100 atom %, and having a crystalline structure of rare-earth oxide C type.

[12] The oxide sintered body of [10] or [11], in which a part of In constructing said crystalline structure of rare-earth oxide C type is subjected to solid solution substitution by a metal element having positive four or more valences.

[13] The oxide sintered body of any one of [10] to [12] having said crystalline structure of rare-earth oxide C type in which an average crystalline particle diameter is 20 μm or less.

[14] The oxide sintered body of any one of [1] to [13] in which relative density is 80% or more.

[15] The oxide sintered body of any one of [1] to [13] in which relative density is 90% or more.

[16] The oxide sintered body of any one of [1] to [15] in which bulk resistance is in a range of 0.1 to 100 mΩ·cm.

[17] The oxide sintered body of any one of [1] to [15] in which bulk resistance is $1 \times 10^{-2}$ Ωcm or less.

[18] The oxide sintered body of any one of [1] to [17] in which lattice constant a is a<10.12 Å.

[19] The oxide sintered body of any one of [6], [9], [12] to [18], comprising a metal element having positive four or more valences in an amount of 10 to 10000 ppm based on the atomicity of all the atoms other than oxide as 100 atom %.

[20] The oxide sintered body of any one of [6], [9], [12] to [18], in which said metal element (X) having positive four or more valences is subjected to solid solution substitution at a ratio of (the metal element (X) having positive four or more valences)/(all the metal elements in the oxide sintered body)= 100 ppm to 10000 ppm.

[21] The oxide sintered body of [19] or [20], in which said metal element (X) having positive four or more valences is one or more elements selected from the group consisting of tin, zirconium, germanium, cerium, niobium, tantalum, molybdenum, tungsten, and titanium.

[22] A sputtering target composed of the oxide sintered body of any one of [1] to [21].

[23] A method for preparing the oxide sintered body of any one of [4] to [9] and [14] to [21] comprising the following steps;
(a) mixing a crude oxide powder;
(b) forming the obtained mixture; and
(c) sintering the obtained formed body at 1200° C. or more and less than 1600° C.

[24] A method for preparing the oxide sintered body of any one of [4] to [9] and [14] to [21] comprising the following steps;
(a) mixing a crude oxide powder;
(b) forming the obtained mixture; and
(c) sintering the obtained formed body at 1200° C. or more and 1400° C. or less.

[25] A method for preparing the oxide sintered body of any one of [10] to [21] comprising the following steps;
(a) mixing a crude oxide powder;
(b) forming the obtained mixture; and
(c) sintering the obtained formed body at 1450° C. or more and less than 1600° C.

[26] An oxide thin film formed by a sputtering method using said sputtering target of [22].

[27] A method for forming an amorphous oxide thin film having electric carrier concentration of less than $1 \times 10^{18}/cm^3$, in which said method comprises a step of conducting sputtering using the sputtering target of [22] at a film forming temperature from 25 to 450° C.

[28] The method of [27] wherein the amorphous oxide thin film is a thin film used for a channel layer of a thin film transistor.

[29] A method for producing a thin film transistor containing an amorphous oxide thin film and an oxide insulation layer, comprising the steps of (i) heat-treating the amorphous oxide thin film formed by the method of [27] within oxidation atmosphere; and (ii) forming the oxide insulation layer on the heat-treated amorphous oxide thin film.

[30] A semi-conductor device having the thin film transistor prepared by the method for producing a thin film transistor of [29].

Effect of the Present Invention

The present invention provides a sputtering target having reduced bulk resistance and high relative density with retaining properties possessed by an IGZO sputtering target. By using the present invention, a sputtering target capable of reducing an abnormal electrical discharge during film-forming of an oxide thin film using a sputtering method, and also capable of film-forming continuously and stably is provided.

The present invention also provides an oxide sintered body comprising indium oxide having a bixbyite structure and a $Yb_2Fe_3O_7$ structure compound represented by the formula: $In_2Ga_2ZnO_7$, by controlling sintering time and composition.

An excellent oxide or TFT can be prepared by using the sputtering target of the present invention for manufacturing a semi-conductor.

The present invention provides a sputtering target having high reducing effect in bulk residence, high productivity, low cost, capable of reducing an abnormal electrical discharge during film-forming of an oxide thin film using a sputtering method, capable of film-forming continuously and stably, and capable of forming an oxide semi-conductor film having wider composition range than that of a conventional sputtering target composed of oxides of In, Ga and Zn.

By using the present invention, an oxide sintered body comprising indium oxide having a bixbyite structure and a homologous structure compound of $InGaO_3(ZnO)_m$ (m is a natural number of 1 to 4) can be formed by the specific manufacturing method or the specific manufacturing condition (sintering temperature or sintering time).

By using the sputtering target of the present invention for manufacturing a semi-conductor, an excellent oxide or TFT can be prepared.

The present invention provides an oxide comprising In (indium) in an amount of 49 atom % or less based on the atomicity of all the atoms included in oxides at issue other than oxide as 100 atom %, and having a crystalline structure of rare-earth oxide C type. Even though the oxide of the present invention contains low In, a sputtering target having low bulk resistance, high relative density, and high bending strength can be provided. In addition, the oxide of the present invention can provide a target which creates extremely less nodules release during sputtering, comparing it with a target containing a lot of In.

By preparing a thin film transistor using this sputtering target, a thin film transistor having high transistor properties and manufactural stability can be obtained.

PREFERRED EMBODIMENTS OF THE INVENTION (1) Sputtering Target

A sputtering target of the present invention is composed of an oxide sintered body containing indium oxide having a bixbyite structure and a $Yb_2Fe_3O_7$ structure compound represented by the formula: $In_2Ga_2ZnO_7$.

The oxide sintered body concerning the sputtering target of the present invention has reduced bulk resistance caused by oxygen defect on indium oxide, and thus d=0 may be allowed in $In_2Ga_2ZnO_{7-d}$. That is, by combining indium oxide having a bixbyite structure and $In_2Ga_2ZnO_7$, bulk resistance on the oxide sintered body can be lowered.

In this connection, an oxide sintered body is one sintered a crude oxide burned under high temperature.

As for another embodiment, the sputtering target of the present invention may be a sputtering target composed of oxides of indium (In), gallium (Ga) and zinc (Zn), and may be composed of an oxide sintered body comprising indium oxide having a bixbyite structure and a homologous structure compound $InGaO_3(ZnO)_m$ (m is a natural number of 1 to 4).

(2) Bixbyite Structure

A bixbyite structure is a structure showing the peak pattern of 06-0416 of X-ray diffraction JCPDS (Joint Committee of Powder Diffraction Standards) data base or an analogous (or shifted) pattern thereof. In general, indium oxide having a bixbyite structure is easy to cause oxygen defect, and is a transparent and electric conductive oxide. Although the present invention does not limit the amount of the oxygen defect, presence of oxygen defect is preferable, since bulk resistance of a target sintered body can be lowered.

A part of In in indium oxide having a bixbyite structure may be subjected to solid solution substitution by another element. Such an element subjected to solid solution substitution by In is preferably Ga or Zn, ether or both of Ga and Zn may be subjected to solid solution substitution. By solid solution substitution of a part of elements of In by another element, an electron can be injected into an oxide. The solid solution substitution of a part of elements of In by another element can be confirmed by a shift of lattice constant (interstitial distance) calculated from X-ray diffraction, or structural analysis using high brightness emitted light. Specifically, based on a peak shift of X-ray diffraction pattern, it can be confirmed by a change in axis length of a crystalline structure. If the axis length becomes shortened by the solid solution substitution, a peak of X-ray diffraction pattern shifts to high angle side. Further, the lattice constant is decided by Rietveld analysis.

(3) Homologous Structure Compound

Homologous structure compound is a compound having Homologous phase. Homologous phase (homologated product series phase) is Magneli phase, for example, represented by the formula $Ti_nO_{2n-1}$ wherein n is natural number. Such a phase includes a group of compounds where n is changed continuously. Specific example of a homologous stricture compound includes $In_2O_3(ZnO)_m$ (m is a natural number of 2 to 20). A homologous stricture compound $InGaO_3(ZnO)_m$ (m is a natural number) includes the compound having m=1 to 20 ("Solid Physics (Kotai-Butsuri)", vol. 28, No. 5 p. 317 (1993)). In case of m=1, $nGaO_3(ZnO)$ shows a peak pattern of 38-1104 of JCPDS data base or an analogous (or shifted) pattern thereof. In case of m=2, $InGaO_3(ZnO)_2$ shows a peak pattern of 40-0252 of JCPDS data base or an analogous (or shifted) pattern thereof. In case of m=3, $InGaO_3(ZnO)_3$ shows a peak pattern of 40-0253 of JCPDS data base or an analogous (or shifted) pattern thereof. In case of m=4, $InGaO_3(ZnO)_4$ shows a peak pattern of 40-0254 of JCPDS data base or an analogous (or shifted) pattern thereof. Crystal structure of the homologous phase is confirmed by, for example, X-ray diffraction pattern of a target ground powder, or by the correspondence with X-ray diffraction pattern of a crystal structure of homologous phase assumed by composition ratio. Specifically, it is confirmed when the pattern corresponds to X-ray diffraction pattern of a crystal structure of homologous phase obtained from JCPDS (Joint Committee of Powder Diffraction Standards) cards.

In the present invention, since bulk resistance is lowered by oxygen defect on indium oxide having a bixbyite structure, and thus bulk resistance is lowered rather than that of a sintered body consisting only of a compound represented by a homologous structure $InGaO_3(ZnO)_m$ (m is a natural number). Namely, by combining indium oxide having a bixbyite structure and $InGaO_3(ZnO)_m$ (m is a natural number of 1 to 4), bulk resistance on the sputtering target can be lowered.

(4) Physical Properties of Oxide Sintered Body (a) Composition Ratio

A composition amount of In and Ga included in the sputtering target of the present invention by atom ratio is preferably in $0.5<In/(In+Ga)<0.98$, and a composition amount of Ga and Zn by atom ratio is preferably in $0.6<Ga/(Ga+Zn)<0.99$. If the amount is in $0.5<In/(In+Ga)$, the ratio of indium oxide becomes higher, and bulk resistance does not become higher. If the amount is in $In/(In+Ga)<0.98$ and $0.6<Ga/(Ga+Zn)<0.99$, it is preferable that a compound represented by $In_2Ga_2ZnO_7$ can be formed. Further, if the amount is in $0.6<In/(In+Ga)<0.98$, it is preferable that the ratio of a phase of indium oxide becomes more higher, and that bulk resistance of a target becomes more lower.

The ratio of In contained in the sputtering target of the present invention may be $0.50<In/(In+Ga+Zn)<0.98$, preferably $0.50<In/(In+Ga+Zn)<0.75$, and more preferably $0.50<In/(In+Ga+Zn)<0.72$. The ratio of Ga contained in the sputtering target of the present invention may be $0<Ga/(In+Ga+Zn)<0.99$, preferably $0.15<Ga/(In+Ga+Zn)<0.45$, and more preferably $0.19<Ga/(In+Ga+Zn)<0.32$. The ratio of Zn contained in the sputtering target of the present invention may be $0<Zn/(In+Ga+Zn)<0.25$, preferably $0.05<Zn/(In+Ga+Zn)<0.20$, and more preferably $0.08<Zn/(In+Ga+Zn)<0.19$.

A ratio between indium oxide having a bixbyite structure and a $Yb_2Fe_3O_7$ structure represented by the formula $In_2Ga_2ZnO_7$ can be confirmed by a ratio among each maximum peak of X-ray diffraction in each phase. Atom ratio of each element in a target sintered body can be determined by measuring an amount of each element based on ICP (Inductivity Coupled Plasma) measurement.

The $Yb_2Fe_3O_7$ structure is a structure showing the peak pattern of 38-1097 of X-ray diffraction JCPDS data base or an analogous (or shifted) pattern thereof. There is a report by Kimizuka, et. al. concerning an analysis of crystal structure with respect to an oxide represented by $In_2Ga_2ZnO_7$ (K. Kato, I. Kawada, N. Kimizuka and T. Katsura Z. Kristallogr vol. 143, p. 2'78, (1976), and N. Kimizuka, T. Matsui and K. Shiratori J. Solid State Chem. vo. 74, p. 98, (1988)). In addition, there are results examined about the relationship among each phase including $In_2Ga_2ZnO_7$, $ZnGa_2O_4$, and ZnO at 1350° C. (M. Nakamura, N. Kimizuka and T. Mohri, J. Solid State Chem. vol. 93, No. 2, p. 298, (1991)).

Composition amounts of In and Ga included in the sputtering target of the present invention by atom ratio is preferably $0.5<In/(In+Ga)<0.99$, and composition amounts of Ga and Zn in a target sintered body by atom ratio is preferably $0.2<Zn/(In+Ga+Zn)<0.7$. $0.5<In/(In+Ga)<0.90$ is more preferable. If In/(In+Ga) is 0.99 or more, a compound represented by $In_2O_3(ZnO)_m$ (m is a natural number), or a compound where Ga element is doped on the above compound is formed, and then the present invention cannot be practiced.

If the amount is in 0.5<In/(In+Ga) or Zn/(In+Ga+Zn)<0.7, the ratio of indium oxide becomes higher, bulk resistance does not become higher, and thus it is preferable that a compound represented by a homologous structure $InGaO_3(ZnO)_m$ (m is a natural number of 1 to 4) is formed within the composition ratio of 0.5<In/(In+Ga)<0.99 or 0.2<Zn/(In+Ga+Zn).

The ratio of In contained in the sputtering target of the present invention may be 0.0<In/(In+Ga+Zn)<0.75, preferably 0.30<In/(In+Ga+Zn)<0.65, more preferably 0.34<In/(In+Ga+Zn)<0.61. The ratio of Ga contained in the sputtering target of the present invention may be 0.0<Ga/(In+Ga+Zn)<0.45, preferably 0.05<Ga/(In+Ga+Zn)<0.30, more preferably 0.10<Ga/(In+Ga+Zn)<0.20. The ratio of Zn contained in the sputtering target of the present invention may be 0.20<Zn/(In+Ga+Zn)<0.70, preferably 0.23<Zn/(In+Ga+Zn)<0.60, more preferably 0.25<Zn/(In+Ga+Zn)<0.55.

A ratio between indium oxide having a bixbyite structure and a homologous structure compound $InGaO_3(ZnO)_m$ (m is a natural number of 1 to 4) can be confirmed by a ratio among each maximum peak of X-ray diffraction in each phase. Atom ratio of each element in a target sintered body can be determined by measuring an amount of each element based on ICP (Inductivity Coupled Plasma) measurement.

A part of In in said indium oxide having a bixbyite structure and a $Yb_2Fe_3O_7$ structure compound represented by the formula $In_2Ga_2ZnO_7$, which are contained in the oxide sintered body of the sputtering target of the present invention, is preferably subjected to solid solution substitution by a metal element (X) having positive four or more valences. In a case of solid solution substitution by a metal element (X) having positive four valences, bulk resistance preferably becomes more lowered. The metal element (X) having positive four or more valences contains one or more elements selected from the group consisting of tin, zirconium, germanium, cerium, niobium, tantalum, molybdenum, tungsten, and titanium. The substitution of a part of elements of In by a metal element (X) having positive four or more valences can be confirmed by a shift of interstitial distance calculated from X-ray diffraction, or structural analysis using high brightness emitted light. Specifically, lattice constant may be decided by Rietveld analysis.

As for another embodiment, a part of In in said indium oxide having a bixbyite structure and one or more homologous structure compounds represented by the formula $InGaO_3(ZnO)_m$ (m is a natural number of 1 to 4), which are contained in the oxide sintered body of the sputtering target of the present invention, is preferably subjected to solid solution substitution by a metal element (X) having positive four or more valences. In a case of solid solution substitution by a metal element (X) having positive four valences, bulk resistance preferably becomes more lowered. The metal element (X) having positive four or more valences contains one or more elements selected from the group consisting of tin, zirconium, germanium, cerium, niobium, tantalum, molybdenum, tungsten, and titanium. The substitution of a part of elements of In by a metal element (X) having positive four or more valences can be confirmed by a shift of interstitial distance calculated from X-ray diffraction, or structural analysis using high brightness emitted light. Specifically, lattice constant may be decided by Rietveld analysis.

If the sputtering target of the present invention contains a metal element (X) having positive four valences, an atom ratio of of (the metal element (X) having positive four or more valences)/(all the metal elements in the oxide sintered body) is preferably 100 ppm to 10000 ppm, more preferably 200 ppm to 5000 ppm, especially preferably 500 ppm to 3000 ppm. An atom ratio of (the metal element (X) having positive four or more valences)/(all the metal elements in the oxide sintered body) is preferably 100 ppm or more, since effect from the addition becomes increase, and bulk resistance becomes lowered. 10000 ppm or less of an atom ratio of (the metal element (X) having positive four or more valences)/(all the metal elements in the oxide sintered body) is also preferable, because a compound having a homologous structure $InGaO_3(ZnO)_m$ (m is a natural number of 1 to 4) can be formed, and the oxide semi-conductor film formed by using the sputtering target of the present invention is stable.

(b) Relative Density

Relative density is density relatively calculated from theoretical density obtained by weighted average.

A density calculated by weighted average of the density of each crude material is the theoretical density, which density is set as 100%.

Relative density of the sputtering target of the present invention is preferably 80% or more, more preferably 85% or more, and especially preferably 90% or more. If relative density of the sputtering target is 80% or more, cracks of a sputtering target in the sputtering target can be restrained by heightening bending strength of the sputtering target, and an abnormal electric discharge caused by blacking the surface of the sputtering target is also inhibited, and thus it is preferable. Since bulk resistance becomes lowered if the density becomes high, density of the sputtering target is more preferably 85%, and especially preferably 90% or more.

In order to obtain a sintered body having high relative density, sintering in the production method of the sputtering target stated below preferably follows after cold isostatic press (CIP) or hot isostatic press (HIP).

The number of occurrence of abnormal discharge during sputtering film-forming can be confirmed by checking appearance of abnormal discharge by constantly recording discharge voltage within a chamber and observing momentary change of discharge voltage within a chamber.

(c) Bulk Resistance

Bulk resistance of the target sintered body of the sputtering target of the present invention is preferably $1 \times 10^{-2}$ Ωcm or less, and more preferably $5 \times 10^{-3}$ Ωcm or less. If the bulk resistance is $1 \times 10^{-2}$ Ωcm or less, abnormal discharge during sputtering is inhibited, creation of foreign substances (nodule) can be inhibited, and thus it is preferable. If the bulk resistance is $5 \times 10^{-3}$ Ωcm or less, DC magnetron sputtering method which is industrially advantageous can preferably be used.

The bulk resistance of the sputtering target of the present invention can be determined by four-point probe method.

In the Examples and Comparative Examples of the present invention, a low resistivity meter "LORESTA EP" (JIS K 7194) produced by Mitsubishi chemical Co. was used for measurement.

The number of occurrence of abnormal discharge during sputtering film-forming can be confirmed by checking appearance of abnormal discharge by constantly recording discharge voltage within a chamber and observing momentary change of discharge voltage within a chamber.

(5) Method for Preparing a Sputtering Target

The sputtering target of the present invention is desirably prepared by the following steps.

(a) mixing a crude oxide powder;
(b) forming the obtained mixture; and (c) sintering the obtained formed body at 1200° C. or more and less than 1600° C.

In addition, the sputtering target of the present invention may be prepared by a method including the following essential steps and the following optional steps.
(a) an essential step for weighing, mixing and grinding a crude oxide powder composed of at least indium oxide, gallium oxide, and zinc oxide (mixing step);
(a)' an optional step for heating the obtained mixture at 500 to 1200° C. for 1 to 100 hours (calcining step);
(b) an essential step for forming the mixture obtained at the step (a) or (a)' (forming step);
(c) an essential step for sintering the obtained formed body at 1200° C. or more and less than 1600° C. (sintering step);
(d) an optional step for reducing the sintered body obtained by the sintering step (reducing step); and
(e) an optional step for processing the sintered body to a configuration suitable for loading the body to a sputtering device (processing step).

(a) Mixing Step

Mixing step is an essential step for mixing metal oxides used as crude materials for a sputtering target.

Crude materials may comprise metal oxides such as oxides of Indium element (In), Gallium element (Ga), Zinc element (Zn) and a metal element (X) having positive four or more valences.

An average diameter of a zinc compound powder used as the crude material is preferably smaller than that of an indium compound powder. The average diameter of a metal oxide powder used as the crude materials can be measured by a method described in JIS R 1619. Indium compounds include, for example, indium oxide and indium hydroxide. Gallium compounds include, for example, gallium oxide. Zinc compounds include, for example, zinc oxide and zinc hydroxide. Oxide is preferable for each compound because of its ease of sintering or small amount of by-products to be appeared.

Each of the above crude materials is mixed and ground by known mixing and grinding processes. Purity of each crude material is normally 99.9 mass % (3N) or more, preferably 99.99 mass % (4N) or more, further preferably 99.995 mass % or more, and especially preferably 99.999 mass % (5N) or more. If the purity of each crude material is 99.9 mass % (3N) or more, properties of a semi-conductor is not declined by impurities such as Fe, Al, Si, Ni, and Cu, and thus credibility is sufficiently kept. Specifically, if Na content is less than 100 ppm, credibility at the time of making a thin-film transistor is preferably going up.

The above-mentioned crude oxide powder is mixed. The mixing is preferably conducted by using a normal mixing and grinding machine, for example, a wet-type ball mill, a beads mill or an ultrasonic device so as to mix and grind it uniformly. Average particle diameter of the mixture obtained after the mixing and grinding is usually 10 μm or less, preferably 1 to 9 μm, and especially preferably 1 to 6 μm. If the average particle diameter is 10 μm or less, density of a sputtering target to be obtained is preferably high. The average particle diameter can be determined by a method described in JIS R 1619.

Specific surface area of the crude oxide powder is, for example, 2 to 10 m$^2$/g, and preferably 4 to 8 m$^2$/g. The difference in the specific surface areas for each crude oxide powder is 5 m$^2$/g or less, preferably 3 m$^2$/g. If the difference in the specific surface area is smaller, the crude oxide powder can be ground and mixed more efficiently, and especially, it is preferable that no gallium oxide particle is remained in an obtained oxide. In addition, the specific surface area for an indium oxide powder is preferably the same as that for a gallium oxide powder, so that the crude oxide powder can be ground and mixed more efficiently. In this connection, the specific surface area can be determined by, for example, BET method. Further, it is preferable that the crude material contains a mixed powder comprising an oxide indium powder, an oxide gallium powder, a zinc powder or a complex oxide powder having the specific surface area of 3 to 16 m$^2$/g in which the specific area of the whole powder is 3 to 16 m$^2$/g. The specific surface area of each oxide powder is preferably almost the same as one another. This crude material makes grinding and mixing more effectively. Specifically, a ratio of the specific surface area is preferably in ¼ to 4 times, especially preferably in ½ to 2 times.

The mixed powder is mixed and ground by, for example, a wet-type medium agitating mill. In this connection, the mixed powder is preferably ground so that the specific surface area after the grinding is 1.0 to 3.0 m$^2$/g higher than that of the crude mixed powder, or so that an average median diameter (d50) after the grinding is around 0.6 to 1 μm.

By using such a crude powder controlled by the above, an oxide sintered body having a high density can be obtained without any calcining step. A reducing step is also unnecessary.

It is preferable that increase in the specific surface area of the above-mentioned crude mixed powder is 1.0 m$^2$/g or more, or that the average median diameter after grinding the crude mixed powder is 1 μm or less, since sintered density is sufficiently high. It is also preferable that increase in the specific surface area of the crude mixed powder is 3.0 m$^2$/g or less, or that the average median diameter after grinding the crude mixed powder is 0.6 μm or more, since contamination (the amount of impurity contaminated) from grind devices during grinding is not increase.

The value of the specific surface area for each powder is determined by BET method. The value of the median diameter of grain size distribution for each powder is determined by a grain size distribution meter. These values can be adjusted by grinding the powder using a dry-type grinding method or a wet-type grinding method.

During the mixing and grinding, water or ethanol containing about 1 vol. % of polyvinyl alcohol (PVA) may be used as a medium.

Median diameter (d50) of the crude oxide powder is, for example, 0.5 to 20 μm, and preferably 1 to 10 μm. The median diameter (d50) of the crude oxide powder is preferably 0.5 μm or more so that sintered density is not reduced so as not to make any air vessels in a sintered body. The median diameter (d50) of the crude oxide powder is preferably 20 μm or less so that particle diameter of the sintered body is not increased.

(a)' Calcining Step

A method for preparing a sputtering target of the present invention may contain (a)' step for calcining the obtained mixture after the step (a).

In this calcining step, the mixture obtained by the above-mentioned (a) step is calcined. By the calcining, density of a sputtering target obtained at the end can be readily increased.

The mixture obtained by (a) step is desirably heated at 500 to 1200° C., preferably at 800 to 1200° C. for 1 to 100 hours, and preferably for 2 to 50 hours at the calcining step. Such a heating condition at 500° C. or more for 1 hour or more is desirable, since thermal decomposition of an indium compound, a zinc compound and a tin compound is sufficiently conducted. A heating condition at 1200° C. or less for 100 hours or less is also desirable, since particles rarely create a bulk.

The calcined products are preferably ground before the following forming step and the sintering step. This grinding of the calcined products is preferably conducted by a ball mill, a roll mill, a palm mill, or a jet mill. Average particle diameter of the calcined products after the grinding is, for example, 0.01 to 3.0 μm, and preferably 0.1 to 2.0 μm. It is preferable that the average particle diameter of the calcined products is 0.01 μm or higher, since sufficient bulk specific gravity is retained, and it is easy to handling it. It is also preferable that the average particle diameter of the calcined products is 1.0 μm or less, since density of a sputtering target obtained at the end can be readily increased.

The average particle diameter of the calcined products can be determined by a method described in JIS R 1619.

(b) Forming Step

The forming step is a step of press forming a mixture of metal oxides (or calcined mixture if the above calcining step is present) so as to make a formed body. By this step, the mixture (or mixture after calcination) is formed in a configuration appropriate for a sputtering target. If there is a calcining step, micro powders of the obtained calcined mixture may be granulated and then formed in a desirable configuration by a press forming.

Forming processing which can be used in the present invention includes, for example, uniaxial compression, metal molding, casting forming, injection molding, and so on. In order to obtain a sintered body (a sputtering target) having high sintered density, forming by cold isostatic press (CIP) is preferable.

During the forming processing, a forming auxiliary agent such as polyvinyl alcohol, methyl cellulose, polywax, or oleic acid may be used.

Known forming methods such as Cold Press method and Hot Press method can be used for the press forming. The press forming is conducted, for example, by filling an obtained mixed powder in a metal mold and press forming it by a Cold Press device. The press forming is also conducted at ambient temperature (25° C.), under 100 to 100000 kg/cm$^2$, and preferably 500 to 10000 kg/cm$^2$. As for temperature profile, rate of temperature increase is preferably 30° C./hour or more for up to 1000° C., and rate of temperature decrease for cooling is preferably 30° C./hour or more. If the rate of temperature increase is 30° C./hour or more, decomposition of oxides does not progress, and no pinhole is appeared. If the rate of temperature decrease for cooling is preferably 30° C./hour or more, the composition ratio of In or Ga does not change.

The Cold Press method and Hot Press method are explained in detail below. By the Cold Press method, a mixed powder is filled in a forming die to prepare a formed body and then the body is sintered. By the Hot Press method, a mixed powder is directly sintered in a forming die.

As for the Cold Press method of the wet-processes, a crude material obtained after a grinding step is dried by a spray dryer and so on, and then formed. The forming may be conducted by methods known in the prior art, for example, press forming, cold isostatic press, metal molding, casting forming, or injection molding. In order to obtain a sintered body (a sputtering target) having high sintered density, the forming is preferably conducted by a method accompany with cold isostatic press (CIP). During the forming processing, a forming auxiliary agent such as polyvinyl alcohol, methyl cellulose, polywax, or oleic acid may be used.

A filtering forming method (see Japanese published unexamined application No. 11-286002) is preferably used as the above-mentioned wet-processes. This filtering forming method uses a filtering forming die comprising a water-insoluble material which is used for obtaining a formed body by being vacuum-pumped water out from ceramic crude material slurry. The body comprises a lower forming die having one or more drain holes, a filter having water flowable property in which filter is placed on the lower forming die, and a forming die flame which clips the filter from the upper side through a seal material for sealing it. Each of the lower forming die, the forming die flame, the sealing material and the filter is disassemblably structured. By using the filtering forming die which vacuum-pumps out water in the slurry only from the filter side, slurry containing mixed powder, ion-exchange water and an organic additive is prepared. This slurry is injected in the filtering forming die, and then a formed body is prepared by vacuum-pumping out water in the slurry only from the filter side. After the obtained ceramic formed body is dry-delipidated, the body is sintered.

In order to homogenize bulk resistance of the sintered body obtained by the dry- or wet-processes as a whole oxide, a reducing step is preferably contained. An applicable reducing step includes, for example, a method using a reducing gas, reduction by vacuum heating or reduction by an inert gas.

The reducing process by a reducing gas may use hydrogen, methane, carbon monoxide, or a mixed gas containing these gases and oxygen. The reducing process by sintering in an inert gas may use nitrogen, argon, or a mixed gas containing these gases and oxygen. Temperature at the reducing step is usually 300 to 1200° C., and preferably 500 to 800° C. Time period for the reducing process is usually 0.01 to 10 hours, preferably 0.5 to 5 hours.

Obtained Oxide is then Properly Processed.

Processing step is an optional step of cutting processing a sintered body obtained by sintering it as stated above in an appropriate form so as to attach a sputtering device, and then loading an attaching device such as backing plates. Thickness of a sputtering target is usually 2 to 20 mm, preferably 3 to 12 mm, especially preferably 4 to 6 mm, and thus the oxide of the present invention should also be processed at the same thickness as the above. Plural of oxides may be loaded to one backing plate (support) so as to be used as substantially one sputtering target. The surface thereof is preferably finished by #200 to 10,000 of diamond whetstone, and especially preferably finished by #400 to 5,000 of diamond whetstone. If #200 to 10,000 of diamond whetstone is used, it is preferable that the oxide does not break up.

After processing the oxide to form a sputtering target, the oxide is bonded to a backing plate (support), and then a sputtering target which can be used for loading on a film-forming device is obtained. The backing plate is preferably made of oxygen free copper. The bonding preferably uses an indium solder.

(c) Sintering Step

Sintering step is a step of sintering the formed body obtained by the above forming step.

Conditions of the sintering step are sintering under oxygen gas atmosphere, under ambient or compressed pressure, usually 1200 to 1600° C. or 1200 to 1450° C., more preferably 1250 to 1500° C., further preferably 1200 to 1400° C., especially preferably 1300 to 1400° C., further especially preferably 1300 to 1450° C., usually for 30 minutes to 360 hours, preferably 8 minutes to 180 hours, and more preferably 12 to 96 hours. If the sintering temperature is 1200° C. or more, density of a sputtering target is readily increased so that the sintering is conducted within an appropriate time period. If the sintering temperature is 1600° C. or less, less components preferably vaporize, and it is preferable that there is no possibility to change the sintered body's composition by evaporating zinc, and/or to creating voids (pores) in the target. If the sintering time period is 30 minutes or more, density of a sputtering target is readily increased. If the sintering time period is 360 hours or less, the sintering is conducted within an appropriate time period. When the sintering is conducted under oxygen atmosphere or oxygen gas atmosphere, density of a sputtering target is readily increased and appearance of abnormal discharge is preferably inhibited during sputtering. The oxygen gas atmosphere is an atmosphere where oxygen concentration is, for example, 10 to 1000%. The sintering can be conducted under ambient or compressed pressure. The compression is desirably, for example, 98000 to 1000000 Pa, and preferably 100000 to 500000 Pa.

Rate of temperature increase at the sintering is normally 20° C./min. or less, preferably 8° C./min. or less, more preferably 4° C./min. or less, further preferably 2° C./min. or less, and especially preferably 0.5° C./min. or less. If the rate is 20° C./min. or less, homologous crystal is sufficiently formed.

In temperature profile, rate of temperature increase is desirably 0.1° C./min. or more for up to 600° C., preferably 0.5 to 10° C./min., 0.1° C./min. or more for up to 800° C., preferably 0.5 to 10° C./min., and 0.5° C./min. or more for up to 1500° C., preferably 1 to 10° C./min. Rate of temperature decrease for cooling is desirably 0.1° C./min. or more, preferably 0.5 to 10° C./min. If the rate of temperature increase is 1° C./min. or more, decomposition of oxides does not progress, and no pinhole is appeared. If the rate of temperature decrease for cooling is 0.5° C./min. or more, the composition ratio of In or Ga does not change.

(d) Reducing Step

Reducing step is an optional step for conducting reducing process so as to homogenize bulk resistance of the sintered body obtained by the sintering step as a whole target.

Reducing methods applicable to the present step include, for example, a method for circulating a reducing gas, a method for sintering it in vacuum, and a method for sintering it in an inert gas.

The reducing gas may include, for example, hydrogen, methane, carbon monoxide, or a mixed gas containing these gases and oxygen.

The inert gas may include nitrogen, argon, or a mixed gas containing these gases and oxygen.

Temperature at the reducing step is usually 100 to 800° C., and preferably 200 to 800° C. Time period for the reducing process is usually 0.01 to 10 hours, preferably 0.01 to 5 hours, more preferably 0.05 to 5 hours, and further preferably 0.05 to 1 hour.

Pressure of the reducing gas or the inert gas is, for example, 9800 to 1000000 Pa, preferably 98000 to 500000 Pa. When the sintering is conducted in vacuum, the vacuum specifically means around $10^{-1}$ to $10^{-8}$ Pa, preferably $10^{-2}$ to $10^{-5}$ Pa, and a residual gas may be argon, nitrogen, etc.

(e) Processing Step

Processing step is an optional step of cutting processing a sintered body obtained by the above sintering in an appropriate form so as to attach a sputtering device, and loading an attaching device such as backing plates. Thickness of a sputtering target is usually 2 to 20 mm, preferably 3 to 12 mm, especially preferably 4 to 6 mm. The surface of a sputtering target is preferably finished by #200 to 10,000 of a diamond whetstone, and especially preferably finished by #400 to 5,000 of a diamond whetstone. If #200 to 10,000 of diamond whetstone is used, it is preferable that the oxide does not break up. Plural of sputtering targets are loaded to one backing plate so as to be used as substantially one sputtering target. The backing plate is preferably made of oxygen free copper.

(6) Method for Producing a Thin Film (6-1) Forming of an Amorphous Oxide Thin Film By using a sputtering target of the present invention, an amorphous oxide thin film can be formed on a substrate by a sputtering method. Specifically, the step of (i) conducting sputtering using the sputtering target of the present invention under a film forming temperature of 25 to 450° C. is included. By this step, an amorphous oxide thin film having an electric carrier concentration of less than $1 \times 10^{18}/cm^3$ can be obtained.

The sputtering method may include a DC (direct current) sputter method, an AC (alternating current) sputter method, an RF (radio frequency) magnetron sputter method, an electron beam vapor-deposition method, an ion plating method, etc. The DC (direct current) sputter method and the RF (radio frequency) sputter method are preferably used.

The film forming temperature during sputtering may differ based on sputtering methods, but for example 25 to 450° C., preferably 30 to 250° C., and more preferably 35 to 150° C. are desirable. The film forming temperature is a temperature of a substrate where a thin film is formed.

Pressure in a sputtering chamber at sputtering may differ based on sputtering methods, but for example, when a DC (direct current) sputter method is used, 0.1 to 2.0 MPa, and preferably 0.3 to 0.8 MPa are desirable. When an RF (radio frequency) sputter method is used, 0.1 to 2.0 MPa, and preferably 0.3 to 0.8 MPa are desirable.

Electric power output supplied at sputtering may differ based on sputtering methods, but for example, when a DC (direct current) sputter method is used, 10 to 1000 W, and preferably 100 to 300 W are desirable. When an RF (radio frequency) sputter method is used, 10 to 1000 W, and preferably 50 to 250 W are desirable.

Power supply frequency during the RF (radio frequency) sputter method, for example 50 Hz to 50 MHz, and preferably 10 k to 20 MHz are desirable.

A carrier gas at the sputtering may differ based on sputtering methods, but for example, oxygen, helium, argon, xenon, and krypton are included. A mixed gas of argon and oxygen is preferable. When the mixed gas of argon and oxygen is used, flow ratio of argon:oxygen of $Ar:O_2=100$ to 80:0 to 20, and preferably 99.5 to 90:0.5 to 10 are desirable.

Prior to a sputtering, a sputtering target is adhered (bonding) on a support. This is for fixing a target to a sputtering device.

Sputtering is carried out using the bonded sputtering target to obtain an amorphous oxide thin film containing In, Ga and Zn oxides as major ingredients on a substrate. The "major ingredients" means that 50% or more in atom ratio of each of In, Ga and Zn elements is contained when total atom ratio of elements other than oxygen is 100 atom %.

Glass or resin (PET, PES, etc.) can be used as the substrate.

Film thickness of the obtained amorphous oxide thin film may differ based on film forming time or sputtering methods, but the thickness is for example, 5 to 300 nm, and preferably 10 to 90 nm.

Electric carrier concentration of the obtained amorphous oxide thin film is, for example, less than $1 \times 10^{18}/cm^3$, and preferably $5 \times 10^{17}$ to $1 \times 10^{12}/cm^3$.

Relative density of the obtained amorphous oxide thin film is desirably 6.0 g/cm$^3$ or more, and preferably 6.1 to 7.2 g/cm$^3$. If the thin film has such high density, the obtained oxide thin film has less forming of nodules or particles, and then an oxide thin film having excellent film properties may be obtained.

(6-2) Making a Thin Film Transistor

When a thin film transistor comprising the amorphous oxide thin film of the present invention and an oxide insulation layer is made, the following steps are appropriately included.

(i) heat treating an amorphous oxide thin film of the present invention within oxidation atmosphere; and (ii) forming an oxide insulation layer on the heat treated amorphous oxide thin film.

In this connection, the heat treating is desirably conducted, for example, at 100 to 450° C., and preferably 150 to 350° C. for 1 to 10 hours, and preferably 0.5 to 2 hours in view of stability of semi-conductor properties.

The method of forming an oxide insulation layer on the heat treated amorphous oxide thin film may include a CVD method or a sputter method.

The oxide insulation layer may include, for example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiN_x$, $Al_2O_3$, $Y_2O_3$, $Hf_2O_3$, and $CaHfO_3$ are preferable, $SiO_2$, $SiN_x$, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as $SiO_x$ are allowed). $SiN_x$ may contain hydrogen element.

A laminated structure containing two or more of insulation films is also applicable.

Although a crystalline material, a multi-crystalline material or an amorphous material may be used, a multi-crystalline material or an amorphous material each of which is readily produced is preferable. It is especially preferable that a protective layer is an amorphous material. If a protective layer is an amorphous material, interfacial smoothness is improved, high carrier mobility is kept, and neither threshold voltage nor S value becomes too high.

S value (Swing Factor) is a value for indicating steepness of drain current which rises rapidly from OFF position to ON position when gate voltage is increased from Off position. As defined by the following formula, increment of gate voltage when drain current increases single digit (10 times) is S value.

$$S \text{ value} = dVg/d\log (Ids)$$

Lower S value means higher steepness in rising (cf. Yasuhiro Ukai, "Hakumaku-trangista gijutu no subete (All about Thin Film Transistor Technique)", Kogyo Chosa Kai, 2007). If S value is high, high gate voltage is required for switching from ON to OFF, and then electric power consumption becomes higher.

S value is preferably 0.8V/dec or less, more preferably 0.3V/dec or less, further preferably 0.25V/dec or less, and especially preferably 0.2V/dec or less. If S value is more than 0.8V/dec, driving voltage becomes higher and then electric power consumption becomes higher.

Especially, when the thin film transistor is used for an organic light emitting display, because of direct current drive, S value is preferably 0.3V/dec or less so as to enormously reduce electric power consumption.

(6-3) Specific Making Method of a Thin Film Transistor

The following explanation is made by using a thin film transistor as an example with reference to FIG. 6.

Substrate (1) such as a grass substrate is prepared, and then Ti having thickness of 1 to 100 nm (a contact layer), Au having thickness of 10 to 300 nm (a connecting layer), and Ti having thickness of 1 to 100 nm (a contact layer) are laminated in this order. A gate electrode (2) is formed from the laminated layers by a photo-lithography method and a lift-off method.

$SiO_2$ film having thickness of 50 to 500 nm is formed on the laminated layers by a TEOS-CVD method, and then a gate insulation film (3) is formed. A film forming method for a gate insulation film (3) may be a sputter method, but a CVD method such as a TEOS-CVD method or a PECVD method is preferable.

A sputtering target composed of the oxide of the present invention is used as a target, and then an amorphous oxide thin film (semi-conductor) composed of In—Ga—Zn—O oxide having thickness of 5 to 300 nm is deposited as a channel layer (4) by a RF sputter method. An element on which the obtained thin film is deposited is cut into an appropriate size, and then heat treatment is conducted under ambient pressure at 100 to 450° C. for 6 for 600 minutes. The obtained element is further laminated by Ti having thickness of 1 to 100 nm (a contact layer), Au having thickness of 10 to 300 nm (a connecting layer), and Ti having thickness of 1 to 100 nm (a contact layer) in this order to form a source electrode (5) and a drain electrode (6) by a photo-lithography method and a lift-off method. $SiO_2$ film having thickness of 50 to 500 nm is further formed on the laminated layers by a sputter method as a protective film (7). A method for film-forming a protective film (7) may be a CVD method. In this connection, by changing order of steps, making of a protective film as shown in FIGS. 7(1) and (2) (etching stopper) may be conducted prior to the preparation of the above source electrode and drain electrode.

(7) Oxide

As for another embodiment, the oxide of the present invention may contain In (indium) in an amount of 24 to 49 atom % based on the atomicity of all the atoms other than oxide as 100 atom %, and have a crystalline structure of rare-earth oxide C type. This oxide of the present invention as another embodiment is explained below.

(7-1) Crystalline Structure

The crystalline structure of rare-earth oxide C type (also called as a bixbyite structure) is a cubic system having ($T_h^7$, $I_{a3}$) space group, also called as $Mn_2O_3$(I) type oxide crystalline structure. It shows JCPDS Card No. 6-0416 pattern. $Sc_2O_3$, $Y_2O_3$, $Tl_2O_3$, $Pu_2O_3$, $Am_2O_3$, $Cm_2O_3$, $In_2O_3$, and ITO ($In_2O_3$ with doping Sn in an amount of about 10 wt % or less) show this crystalline structure (Committee for Japan Society for Promotion of Science, transparent oxide light photoelectron material No. 166 ed., "Tomei Dodenmaku no Gijutu (Technique for Transparent Conductive Layer) 2nd edition" Ohm Co., (2006)). Presence of a crystalline structure of rare-earth oxide C type can be confirmed from the indication of JCPDS Card No. 6-0416 pattern by X-ray diffraction.

The crystalline structure of rare-earth oxide C type is the same structure as a fluorite type crystalline structure which is one of the crystalline structures of compounds indicated by $MX_2$ (M: cation, X: anion) except that one out of four anions is missing due to its stoichiometry being $M_2X_3$. Anions (oxygen for normal oxides) are six-coordinated against cation, and two anion sites are empty (empty anion sites are called as quasi-ion sites.) (cf. above mentioned "Tomei Dodenmaku no Gijutu (Technique for Transparent Conductive Layer) 2nd edition"). The crystalline structure of rare-earth oxide C type where oxygen (anions) is six-coordinated against cation has an oxygen octahedral edge-sharing structure. If there is the oxygen octahedral edge-sharing structure, ns orbits in p metal of a cation are overlapped to form one another to form an electronic conducting pathway, and then effective mass becomes low so as to show high mobility. In this connection, the mobility is measured by Hall effect or TOF (Time of flight), or determined from its field effect mobility by making a field effect transistor.

The crystalline structure of rare-earth oxide C type may shift from stoichiometric ratio of $M_2X_3$ as long as showing the peak pattern of JCPDS card No. 06-0416 of X-ray diffraction. That is, the crystalline structure of rare-earth oxide C type may be $M_2X_3$-d. Oxygen defect amount d is preferably in the range of $3\times10^{-5}$ to $3\times10^{-1}$. This d can be controlled by atmosphere at sintering, temperature increasing, or temperature decreasing.

This d can also be controlled by reduction treatment after sintering. The oxygen defect amount is a value, shown by mole unit, of a number of oxygen ion contained in one mole of oxygen crystalline being deducted from a number of oxygen ion of stoichimetric amount. The number of oxygen ion contained in oxygen crystalline may be, for example, calculated from an amount of carbon dioxide produced by heating an oxide crystal in carbon powder by using an infrared absorption spectrum. The number of oxygen ion of stoichimetric amount can be calculated from mass of the oxide crystal.

"Having a crystalline structure of rare-earth oxide C type" means that the crystalline structure of rare-earth oxide C type is a major component. Being a major component means that, based on X-ray diffraction, the maximum strength of a peak belonging to the crystalline structure of rare-earth oxide C type is twice or more of the maximum strength of a peak belonging to another crystalline type. The maximum strength of a peak belonging to the crystalline structure of rare-earth oxide C type based on X-ray diffraction is preferably five fold or more, more preferably 10 fold or more, and especially preferably 20 fold or more of the maximum strength of a peak belonging to another crystalline type. If there is a $\beta$-$Ga_2O_3$ structure, there is a possibility to increase resistance of a sintered body or to decrease bending strength. Therefore, the $\beta$-$Ga_2O_3$ structure is preferably unconfirmed by X-ray diffraction.

(7-2) Contained Elements

Another embodiment of the oxide of the present invention includes oxygen and indium (In).

In order to take a crystalline structure of rare-earth oxide C type, the oxide of the present invention preferably contains, other than oxygen and In (indium), one or more elements selected from Ga, Zn, Sn, Mg, Al, B, Sc, Y, Lanthanoids (La, Ce, Pr, Nd, Sm, Eu, Gd, Tb, Dy, Ho, Er, Tm, Yb, Lu), Zr, Hf, Ge, Si, Ti, Mn, W, Mo, V, Cu, Ni, Co, Fe, Cr and Nb.

The oxide of the present invention preferably contains In (indium) in an amount of 24 to 49 atom %, preferably 30 to 45 atom %, more preferably 35 to 40 atom %, based on the atomicity of all the atoms included in the oxides of the present invention other than oxide as 100 atom %. The above-mentioned atom % (at %) can be based on the atomicity of all the atoms included in the oxides of the present invention other than oxide as 100 atom %, or may be based on the atomicity of all the atoms included in the oxides of the present invention other than oxide and the metal element having positive four or more valences as 100 atom %.

The oxide of the present invention desirably comprises Ga (gallium) in an amount of, for example 10 to 45 atom %, preferably 15 to 45 atom %, and more preferably 20 to 40 atom %, based on the atomicity of all the atoms included in the oxides of the present invention other than oxide as 100 atom %. The oxide of the present invention desirably comprises Zn (zinc) in an amount of, for example 5 to 65 atom %, 10 to 60 atom %, and preferably 15 to 50 atom %, based on the atomicity of all the atoms included in the oxides of the present invention other than oxide as 100 atom %. In this connection, the atom % is a unit showing atom ratio, which is a value based on the atomicity of all the atoms included in the oxides of the present invention other than oxide as 100 atom %. If a metal element (X) having positive four or more valences is included, the atom % is a value based on the atomicity of all the atoms included in the oxides of the present invention other than oxide and the metal element (X) having positive four or more valences as 100 atom %. Atom ratio of indium (In), gallium (Ga) and zinc (Zn) is preferable in the above-mentioned range, since other crystalline types such as homologous structure and $\beta$-$Ga_2O_3$ would not be deposited, and instead a crystalline type other than rare-earth oxide C type is appeared. In addition, In is preferably in an amount of 24 atom % or more, since bending strength when the oxide is used as a target becomes higher, and resistance becomes lower.

If In is in an amount of 49 atom % or less, usage amount of In as a rare metal can be reduced, and thus costs for raw materials can be lowered.

If Ga is in an amount of 10 atom % or more, an uniform transistor can be prepared during the preparation of a transistor as a target, even if a partial pressure for oxygen at the film-forming is low.

If Ga is in an amount of 49 atom % or less, degradation of mobility and S value caused by adding Ga can be avoided.

If Zn is in an amount of 5 atom % or more, an uniform amorphous film can be formed even if it has large area and if it is used as a target.

If Zn is in an amount of 65 atom % or less, reduction of bending strength can be avoided, and forming of a zinc oxide crystal on the formed film can also be avoided when the oxide is used as a target.

The ratio of In in the oxide of the present invention is 0.24<In/(In+Ga+Zn)<0.49, preferably 0.30<In/(In+Ga+Zn)<0.45, and more preferably 0.35<In/(In+Ga+Zn)<0.40. The ratio of Ga contained in the oxide of the present invention may be 0.1<Ga/(In+Ga+Zn)<0.45, preferably 0.15<Ga/(In+Ga+Zn)<0.45, and more preferably 0.2<Ga/(In+Ga+Zn)<0.4. The ratio of Zn contained in the sputtering target of the present invention may be 0.05<Zn/(In+Ga+Zn)<0.65, preferably 0.10<Zn/(In+Ga+Zn)<0.60, and more preferably 0.15<Ga/(In+Ga+Zn)<0.50.

In the oxide of the present invention, especially, atom ratio of each element of Indium element (In), Gallium element (Ga), and Zinc element (Zn) preferably meets the following formulae (1) to (3).

$$0.24 \leq In/(In+Ga+Zn) \leq 0.49 \quad (1)$$

$$0.10 \leq Ga/(In+Ga+Zn) \leq 0.49 \quad (2)$$

$$0.05 \leq Zn/(In+Ga+Zn) \leq 0.65 \quad (3)$$

The atom ratio specially preferably meets the following formulae (1)' to (3)'.

$$0.30 \leq In/(In+Ga+Zn) \leq 0.45 \quad (1)'$$

$$0.15 \leq Ga/(In+Ga+Zn) \leq 0.45 \quad (2)'$$

$$0.10 \leq Zn/(In+Ga+Zn) \leq 0.50 \quad (3)'$$

The oxide of the present invention further preferably comprises a metal element (X) having positive four or more valences in an amount of 10 to 10000 ppm (atom ratio) based on the atomicity of all the oxides other than oxide.

The metal element (X) having positive four or more valences is preferably one or more elements selected from the group consisting of tin, zirconium, germanium, cerium, niobium, tantalum, molybdenum, tungsten, and titanium.

Atomicity of a metal element (X) having positive four or more valences is preferably 10 ppm to 10000 ppm, more preferably 100 ppm to 5000 ppm, especially preferably 200 ppm to 1000 ppm. It is preferably 10 ppm or more, since relative density becomes high, bulk resistance becomes lowered, and bending strength is improved and then those effects can be sufficiently worked out. 10000 ppm or less is also preferable, since any crystalline structure other than a crystalline structure of rare-earth oxide C type is not deposited.

(7-3) Physical Properties of Oxides (a) Lattice Constant

Lattice constant (a) of the oxide of the present invention is preferably a<10.12 Å, more preferably a<10.11 Å, and especially preferably a<10.10 Å. The lattice constant can be calculated from the maximum peak position of X-ray diffraction. If the lattice constant is small, the maximum peak position of X-ray diffraction becomes high.

If the lattice constant (a) is less than 10.12 Å, ns orbits in p metal is increased, effective mass becomes low, and then mobility becomes high. If the lattice constant (a) is less than 10.12 Å, another crystal phase would not be deposited. In general, if any other crystal phase is appeared, there are possibilities that resistance in a target becomes higher, density becomes lower, and bending strength becomes lower.

(b) Average Particle Diameter of Crystals

The average particle diameter for a crystal structure of rare-earth oxide C type of the oxide of the present invention is preferably 20 μm or less, more specifically 10 μm or less, and especially preferably 5 μm or less.

If the average particle diameter for an oxide crystal is 50 μm or less, no abnormal discharge is occurred, bending strength would not be lowered, and uniformity in the formed film would not be lost.

The average particle diameter is an average of the maximum particle diameter determined by X-ray microanalyzer (EPMA). The maximum particle diameter is, for example, determined by embedding an obtained oxide in a resin, polishing the surface of the oxide by aluminum particles having particle size of 0.05 μm, and then measuring a maximum particle diameter of crystal particles of a crystal structure of rare-earth oxide C type at five locations observed within 40 μm×40 μm square frame of the sintered body surface which is magnified 5000 times by X-ray microanalyzer (EPMA) named JXA-8621MX (JOEL Ltd.). Average of the maximum values of the maximum particle diameters in each location (the maximum particle diameter for the biggest particle within each location) is the average particle diameter for the maximum particle diameters. In this connection, a circumscribed diameter (the longest diameter for the specific particle) is the maximum particle diameter.

The maximum particle diameter of crystal particles in a crystal structure of rare-earth oxide C type observed from any cross section of a sintered body by using a scanning electron microscope may be 0.4 μm or less, preferably 0.3 μm or less, and more specifically 0.2 μm or less. Specifically, the maximum particle diameter is an average particle diameter of the maximum particle diameter determined by X-ray microanalyzer (EPMA). The maximum particle diameter is, for example, determined by embedding an obtained sintered body in a resin, polishing the surface of the oxide by aluminum particles having particle size of 0.05 μm, and then measuring a maximum particle diameter of crystal particles at five locations observed within 40 μm×40 μm square frame of the sintered body surface by X-ray microanalyzer (EPMA) named JXA-8621MX (JOEL Ltd.). FIG. 1 shows element mapping of $In_2O_3$—ZnO—$Ga_2O_3$ sintered body comparative example by EPMA (sample: $Ga_2O$ %, 1500° C., 20 hours). Average of the maximum values of the maximum particle diameters in each location (the maximum particle diameter for the biggest particle within each location) is the average particle diameter for the maximum particle diameters. In this connection, a circumscribed diameter (the longest diameter for the specific particle, e.g. the length of the arrow in FIG. 1) is the maximum particle diameter.

(8) Method for Preparing an Oxide

The oxide of the present invention as another embodiment may be prepared by the following method.

(a) preparing a mixture comprising a powder of an indium compound, a powder of a zinc compound, and a powder of a gallium compound;

(b) forming a formed body by press forming the mixture; and (c) sintering the formed body.

Step (a): A step for preparing a mixture comprising a powder of an indium compound, a powder of a zinc compound, and a powder of a gallium compound It is preferable that each powder of each compound as a crude material (a crude powder) preferably has the specific surface area of 2 to 16 $m^2$/g, and more preferably 3 to 15 $m^2$/g. The specific surface area of each oxide powder to be used is preferably almost the same as one another. This crude material makes grinding and mixing more effectively. By limiting the above, grinding and mixing can be conducted more efficiently. Specifically, a ratio of the specific surface area is preferably in ¼ to 4 times, especially preferably in ½ to 2 times.

Average median diameter (d50) of the crude powder is, for example, 0.1 to 10 μm, preferably 0.15 to 0.5 μm, and more preferably 0.2 to 3 μm. If the average median diameter (d50) of the crude powder is 0.1 μm or more, reduction of sintered density caused by pinhole (air vessel) in a sintered body can be avoided. If it is 10 μm or more, increase of particle size of a sintered body is also preferably avoided.

The specific surface area of each powder is determined by BET method. The average median diameter is a value obtained by determining median diameter of the crude powder five times and averaged them. These values can be adjusted by grinding the powder using a dry-type grinding method or a wet-type grinding method.

Purity of each crude powder is normally 99.9% (3N) or more, preferably 99.99% (4N) or more, further preferably 99.995% or more, and especially preferably 99.999% (5N) or more. If the purity of each crude material is 99.9% (3N) or more, properties of a semi-conductor is not declined by impurities, defective appearance such as color heterogeneity or spots is not found, and thus high credibility can be kept.

A composite oxide such as In—Zn oxides, In—Ga oxides, or Ga—Zn oxides can be used as a crude material. Especially, using In—Zn oxides or Ga—Zn oxides is preferable so that sublimation of Zn is inhibited.

Mixing of the powder is conducted by, for example, a wet-type medium agitating mill. The mill for mixing and grinding comprises, for example, a beads mill, a ball mill, a roll mill, a planetary mill, or a jet mill. If a beads mill is used, grind medium (beads) is preferably zirconia, alumina, quartz, silicon nitride, stainless, mullite, glass beads, or SiC. Its particle size is preferably 0.1 to 2 mm. Especially preferably, a solid particle of zirconia beads can be used. If the beads are mixed with medium, specific surface area of the obtained mixed powder can be increased. For example, the mixing and grinding is conducted so as to obtain 1.5 to 2.5 $m^2$/g, preferably 1.8 to 2.3 $m^2$/g increase in the specific surface area after the grinding rather than that of a crude mix powder, or so as to obtain 0.6 to 1 μm in an average median diameter of the mixture obtained after the mixing and grinding. By using thus controlled crude powder, an oxide sintered body having a high density can be obtained without any calcining step. A reducing step is also unnecessary. If the increase in the specific surface area of the crude mix powder is 1.5 $m^2$/g or more, or the average median diameter after the grinding is 1 μm or less, it is preferable that sintered density is sufficiently increased. If the increase in the specific surface area of the crude mix powder is 2.5 m²/g or less, or the average median diameter after the grinding is 0.6 μm or more, it is preferable that contamination (amount of impurity) from a grinder during grinding is not increased.

The specific surface area and the average median diameter of each powder of the above crude materials can be controlled by grinding the powder using a dry-type grinding method or a wet-type grinding method.

(a)' Calcining Step

A step for calcining the mixture obtained by the step (a) may be contained between the steps (a) and (b). The calcining step is a step for calcining the mixture obtained by the step (a) so as to oxidize a lower oxide or a non-oxidized moiety sufficiently. At the calcining step, the mixture obtained of a metal oxide is preferably heated at 500 to 1200° C. for 1 to 100 hours. If the heating condition is 500° C. or more for 1 hour or more, thermal decomposition of an indium compound, a zinc compound and a tin compound is sufficiently conducted.

A heating condition at 1200° C. or less for 100 hours or less is also preferable, since particles rarely create a bulk.

Thus heating (calcining) at 800 to 1200° C. for 2 to 50 hours is especially preferable.

Step (b)

After the above step (a) or optional step (a)', the obtained mixture is formed to make a desired sputtering target configuration. The forming can be conducted by a known method, for example, press forming or cold isostatic press.

Press forming, Cold Press method and Hot Press method are more preferable for the forming, and press forming is especially preferable. The press forming is conducted, for example, by filling an obtained mixture in a metal mold and press forming it by a Cold Press device. The press forming is also conducted, for example, at ambient temperature (25° C.), under 100 to 100000 kg/cm², and preferably 500 to 10000 kg/cm².

The Cold Press method and Hot Press method are explained in detail below. By the Cold Press method, the mixture obtained by the step (a) is filled in a forming die to prepare a formed body and then the body is sintered. By the Hot Press method, the mixture is directly sintered in a forming die.

As for the Cold Press method of a dry-process, a crude material obtained after the step (a) is dried by a spray dryer and so on, and then formed. The forming may be conducted by methods known in the art, for example, press forming, cold isostatic press, metal molding, casting forming, or injection molding. In order to obtain a sintered body (a sputtering target) having high sintered density, the forming is preferably conducted by a method accompany with cold isostatic press (CIP). During the forming processing, a forming auxiliary agent such as polyvinyl alcohol, methyl cellulose, polywax, or oleic acid may be used.

A filtering forming method (see Japanese published unexamined application No. 11-286002) is preferably used as the above wet-processes. This filtering forming method uses a filtering forming die comprising a water-insoluble material which is used for obtaining a formed body by vacuum-pumping water out from ceramic crude material slurry. The body comprises a lower forming die having one or more drain holes, a filter having water flowable property in which filter is placed on the lower forming die, and a forming die flame which clips the filter from the upper side through a seal material for sealing it. Each of the lower forming die, the forming die flame, the sealing material and the filter is disassemblably structured. By using the filtering forming die which vacuum-pumps water in the slurry out only from the filter side, slurry containing a mixture obtained from the step (a), ion-exchange water and an organic additive is prepared. This slurry is injected in the filtering forming die, and then a formed body is prepared by vacuum-pumping water in the slurry out only from the filter side. After the obtained ceramic formed body is dry-delipidated, the body is sintered.

Step (c)

The obtained formed body is then sintered to prepare a sintered body. The sintering can be conducted by using a known sintering method. For example, sintering by using an electric furnace is desirable. The sintering is preferably conducted, for example, under the present of air, preferably oxygen atmosphere. Sintering is more preferably conducted under oxygen atmosphere by flowing oxygen. Sintering is further preferably conducted under a pressure. Under these conditions, zinc transpiration is inhibited, and a sintered body having no void (cavity) can be obtained. Thus obtained sintered body has high density so that fewer nodules or fewer particles are made during using it. Therefore, an oxide semiconductor film having excellent film properties is prepared.

The sintering are conducted at 1360 to 1700° C. of the surface temperature of a mixture powder to be sintered for 1 to 500 hours, more preferably 1440 to 1650° C. for 1 to 100 hours, further preferably 1450 to 1600° C. for 2 to 50 hours. If the temperature is 1360° C. or more, a crystal of rare-earth oxide C type is sufficiently obtained, and thus sufficiently high bulk density is expected.

If the temperature is 1700° C. or less, zinc does not transpired so as to vary a composition of a sintered body, and no void (cavity) caused by the transpiration is appeared in the sintered body. If the time period for sintering is longer, composition area where the crystalline form of the present invention can be obtained is wider. Sintering is preferably conducted under the presence of oxygen. Sintering is more preferably conducted under oxygen atmosphere by flowing oxygen, or under a pressure. Under these conditions, zinc transpiration is inhibited, and a sintered body having no void (cavity) can be obtained. Thus obtained sintered body has high density so that fewer nodules or fewer particles are made during using it. Therefore, an oxide semi-conductor film having excellent film properties can be prepared.

Temperature profile at the sintering is 0.1° C./min. or more in rate of temperature increase until 600° C., preferably 0.5 to 10° C./min.; 0.1° C./min. or more in rate of temperature increase until 800° C., preferably 0.5 to 10° C./min.; and 0.5° C./min. or more in rate of temperature increase until 1500° C., preferably 1 to 10° C./min. Rate of temperature decrease during cooling is desirably 0.1° C./min. or more, and preferably 0.5 to 10° C./min. If the rate of temperature increase is 1° C./min. or more, decomposition of oxides does not progress, and no pinhole is appeared. If the rate of temperature decrease for cooling is 0.5° C./min. or more, the composition ratio of In or Ga does not change.

Step (d)

A method for preparing the sputtering target for the present invention preferably includes reducing step (d) so as to homogenize bulk resistance of the sintered body obtained after the step (c) as a whole sputtering target. Applicable reducing methods include, for example, a method of using a reducing gas, a reduction of using vacuum sintering, or a reduction of using an inert gas. When a reduction treatment using a reducing gas is used, hydrogen, methane, carbon monoxide, or a mixed gas containing these gases and oxygen can be used. When a reduction treatment by sintering in an inert gas is used, nitrogen, argon, or a mixed gas containing these gases and oxygen can be used. Temperature at the reduction treatment is usually 100 to 800° C., and preferably 200 to 800° C. Time period for the reduction treatment is usually 0.01 to 10 hours, preferably 0.05 to 5 hours. By the reduction treatment, the amount of oxygen defects d can be controlled.

Step (e)

A sputtering target obtained above can optionally be processed (processing step (e)). The processing step (e) is an optional step of cutting processing a sintered body obtained as the above sintering in an appropriate form so as to attach a sputtering device, and loading an attaching device such as backing plates. Thickness of a sputtering target is usually 2 to 20 mm, preferably 3 to 12 mm, especially preferably 4 to 6 mm. Therefore, the sputtering target of the present invention is also desirably processed to this thickness.

In addition, plural of oxides are loaded to one backing plate so as to be used as substantially one sputtering target.

Step (f)

The above obtained sintered body may be ground (grinding step (f)). The above obtained sintered body is ground, for example, by a flat-surface grinding machine to make average surface roughness Ra of 5 μm or less, preferably 4 μm or less, more preferably 0.1 to 3 μm. Furthermore, mirror-like finishing is provided on a sputter side of a target, and then average surface roughness Ra of it is 100 nm or less, preferably 50 nm or less, more preferably 1 to 30 nm or less. The average surface roughness (Ra) means center line average roughness. This mirror-like finishing (grinding) may be conducted by known grinding techniques such as mechanical grinding, chemical grinding, mechanochemical grinding (combination of mechanical grinding and chemical grinding). For example, a fixed abrasive grain polisher (polish liquid: water) is used for polishing #2000 or more (inch base), or a free abrasive grain lap (abrasive: SiC paste, etc.) is used for lapping, and then the abrasive may be changed to a diamond paste so as to lap and obtain an end product. However, such a grinding method is not limited to the above.

For example, the surface thereof is preferably finished by #200 to 10,000 of diamond whetstone, and especially preferably finished by #400 to 5,000 of diamond whetstone. If #200 to 10,000 of diamond whetstone is used, it is preferable that a sputtering target does not break up.

The obtained target is bonded to a backing plate (support), and then it can be used loading on a film-forming device. Film forming method includes, for example, a sputtering method, a PLD (pulse-laser deposition) method, a vacuum deposition method and an ion-plating method. The backing plate is preferably made of oxygen free copper. The bonding preferably uses Indium solder.

A cleaning processing of a target may use air blow, flowing water cleaning, etc. Eliminating foreign substances by the air brow can be efficiently conducted by vacuuming air using a dust collector from the opposite side of a nozzle.

Not only air brow or flowing water cleaning, but also ultrasonic cleaning may also be used. The ultrasonic cleaning is effectively conducted by a method of conducting multi-oscillation within frequency from 25 to 300 KHz. For example, it is preferable that the ultrasonic cleaning is conducted by multi-oscillating 12 kinds of frequency in every 25 KHz within frequency from 25 to 300 KHz.

(9) Target

Another embodiment of the oxide of the present invention and a sintered body composed of the oxide may be formed of a sputtering target through each step such as the above-mentioned step (8) and by further processing an appropriate grinding, etc. The sputtering target is an agglutinate oxide used for sputtering film forming, and is generally used by bonding a backing plate (support) such as oxygen free copper to the sputtering target.

(a) Relative Density

Relative density of the oxide of another embodiment of the present invention is, for example, 95% or more, preferably 98% or more, and more preferably 99% or more. If relative density is 95% or more, when the oxide of the present invention is used as a sputtering target, the target is less breakable, and no abnormal electric discharge is occurred, and thus it is preferable. The relative density is density relatively calculated from theoretical density obtained by weighted average. A density calculated by weighted average of the density of each crude powder is the theoretical density, which density is set as 100%. For example, the relative density was obtained from theoretical density calculated from density of a crude powder and density of a sintered body determined by Archimedes method using the following formula.

Relative Density=(Density determined by Archimedes method)/(Theoretical Density)×100(%)

It is desirable that the range of variation (uniformity) of the relative density of the oxide is in 3%, and preferably in 1%. The variation (uniformity) is a value indicated by standard deviation against an average value. The average and standard deviation are obtained by cutting 20 or more of small pieces out of an oxide and then determining density of each piece.

(b) Bulk Resistance

Bulk resistance of the oxide of another embodiment of the present invention is, for example, determined based on JISR1637. The bulk resistance is, for example, 20 mΩcm or less, preferably 0.1 to 10 mΩcm, and more preferably 0.3 to 5 mΩcm. If the bulk resistance is 0.1 mΩcm or more, no abnormal discharge between particles of a sputtering material during sputtering is caused, and thus it is preferable. If the bulk resistance is 20 mΩcm or less, it is preferable since the target is less breakable, discharge is not unstable, and particles are not increase even when the oxide of the present invention is used as a sputtering target.

In addition, it is desirable that the range of variation (uniformity) of the bulk resistance of the oxide is in 3%, and preferably in 1%. The variation (uniformity) is a value indicated by standard deviation against an average value of the bulk resistance. The bulk resistance is determined by, for example, measuring an oxide surface at around 10 to 50 of equally spaced points, by a four-point probe method using LORESTA (Mitsubishi chemical Co.).

(c) Bending Strength

Bending strength of the spattering target of another embodiment of the present invention is, for example, preferably 8 kg/mm$^2$ or more, more preferably 10 kg/mm$^2$ or more, and especially preferably 12 kg/mm$^2$ or more. The bending strength is also known as crossbreaking strength. The bending strength is evaluated based on JIS R1601 by using a bending strength tester. If the bending strength is 8 kg/mm$^2$ or more, the sputtering target is less breakable during sputtering, and the sputtering target is less damaged even when a backing plate as a support of the sputtering target is adhered to the sputtering target, or when the sputtering target is transferred.

(d) Variation of the Number of Positive Elements

It is desirable in the oxide of another embodiment of the present invention that the range of variation of the number of positive metal elements other than zinc contained in the oxide sintered body is in 0.5%, and preferably in 0.1%. The variation means a value indicated by standard deviation against an average value. The average and standard deviation are obtained by cutting 20 or more of small pieces out of an oxide and then determining a content of each positive metal element other than zinc by an ICP, and thus the variation is determined. The variation (uniformity) can be obtained from the following formula based on the average and standard deviation.

Variation of positive elements (uniformity, %)=[Average of content of positive metal element]/[Standard deviation of content of positive metal element]×100(%)

(e) Surface Roughness

Surface roughness (Ra) of the sputtering target of another embodiment of the present invention is desirably Ra 0.5 μm, preferably Ra 0.3 μm, and more preferably Ra≤100 nm. No directional character on a polished surface is preferable so that no abnormal discharge is caused and the presence of particles can be reduced. If the surface roughness (Ra) is 0.5 μm or less, abnormal discharge during sputtering is inhibited, creation of dusts (particles) of a sputtering material is reduced, and thus it is preferable. The surface roughness means center line average roughness.

(f) Pinhole

The surface of the oxide of another embodiment of the present invention preferably has no pinhole. The pinhole is a void created between oxide particles during the preparation of the oxide of the present invention by sintering the oxide particles. Number of the pinhole can be evaluated by horizontal Feret diameter. When the pinhole is deemed as a particle, the horizontal Feret diameter means a distance between two parallel lines toward a certain direction in which the lines are clipping the particle. The horizontal Feret diameter can be determined by observing a SEM image having 100× magnification ratio. The horizontal Feret diameter of the surface of the oxide of the present invention is preferably 50 pinholes/mm² or less where the pinholes have 2 μm or greater Feret diameter present in an oxide per unit area (1 mm×1 mm). 20 pinholes/mm² or less is more preferable, and 5 pinholes/mm² or less is further preferable. If the number of pinholes having 2 μm or greater Feret diameter is 50 pinholes/mm² or less, and if the oxide of the present invention is used as a sputtering target, no abnormal electrical discharge is appeared during sputtering, and smoothness of the obtained sputtering film is increased.

(10) Utility of the Thin Film

The amorphous oxide thin film obtained above may be used as-is, or by heating treatment, may be used as a thin film transistor for a liquid crystal display device, an electroluminescence display device or an X-ray image sensor, a channel layer for a thin film transistor, or a semi-conductor film of a solar cell or a gas sensor.

(10-1) The thin film transistor prepared by the present invention is explained below. The thin film transistor includes a substrate, a semi-conductor layer, a protective layer for a semi-conductor layer, a gate insulation film or an electrode.

Substrate

As for a substrate, any substrate known in the present technical field may be used without limitation. For example, a glass substrate such as alkaline silicate type glass, alkali-free glass, or quartz glass; a silicon substrate; a resin substrate such as acryl, polycarbonate, or polyethylene naphthalate (PEN); or a polymer film base material such as polyethylene terephthalate (PET) or polyamide can be used.

Thickness of substrate or base material is usually 0.1 to 10 mm, preferably 0.3 to 5 mm. If a grass substrate is used, a chemically or thermally enhanced grass substrate is preferable. If transparency or smoothness is required, a glass substrate and a resin substrate are preferable, and a glass substrate is especially preferable. If weight saving is required, a resin substrate or a polymer base material is preferable.

Semi-Conductor Layer

A semi-conductor layer includes a composite oxide of In (indium), Zn (zinc), and Ga (gallium). Such a semi-conductor layer can be prepared, for example, by forming a thin film using a sputtering target of the present invention (composite oxide target) (a target for a semi-conductor).

In the present invention, the semi-conductor layer is preferably an amorphous film. By using such an amorphous film, its contact property to an insulation film or a protective layer has improved, and then uniform transistor property can be easily obtained even if it is large area. Whether or not the semi-conductor layer is an amorphous film can be confirmed by X-ray crystal structure analysis. If no clear peak is monitored, the semi-conductor layer is amorphous.

Electric carrier concentration of the semi-conductor layer is preferably $10^{13}$ to $10^{18}/cm^3$, and especially preferably $10^{14}$ to $10^{17}/cm^3$. If electric carrier concentration is in the above range, the semi-conductor layer becomes readily a non-degeneration semi-conductor, and then balance between mobility and ON-OFF ratio is preferably improved when it is used as a transistor. Band gap is preferably 2.0 to 6.0 eV, and more preferably 2.8 to 5.0 eV. If the band gap is 2.0 eV or more, a field effect type transistor causes less improper operation by absorbing visible light.

If the band gap is 6.0 eV or less, a field effect type transistor rarely lose its function by less supplement of carrier.

A semi-conductor layer is preferably a non-degeneration semi-conductor having thermal active property. If a non-degeneration semi-conductor is used, some disadvantages such as off-current and gate-leak current increase caused by excess of carrier, or normally-ON caused by negative threshold can be avoided. Whether or not the semi-conductor layer is a non-degeneration semi-conductor can be confirmed by measuring mobility and carrier density as a result of temperature changes using Hall effect.

In order to make a semi-conductor layer being a non-degeneration semi-conductor, partial pressure for oxygen during preparing a film may be adjusted, and carrier density may be optimized by post treatment for controlling the number of oxygen defects.

Surface roughness of the semi-conductor layer (RMS) is preferably 1 nm or less, more preferably 0.6 nm or less, and especially preferably 0.3 nm or less. If RMS is 1 nm or less, mobility would not be reduced.

The semi-conductor layer is preferably an amorphous film maintaining at least a part of an edge-sharing structure in a bixbyite structure of indium oxide. Whether the amorphous film containing indium oxide maintains at least a part of an edge-sharing structure in a bixbyite structure of indium oxide may be confirmed by radial distribution function (RDF) obtained by Grazing Incidence X-ray Scattering (GIXS) in which a peak showing In—X (X is In or Zn) is in 0.3 to 0.36 nm (specifically, see F. Utsuno, et al., Thin Solid Films, Volume 496, 2006, pp. 95-98).

Assuming that the maximum value of RDF where atomic distance is between 0.30 and 0.36 nm is A, and that the maximum value of RDF where atomic distance is between 0.36 and 0.42 is B, A/B>0.7 is preferable, A/B>0.85 is more preferable, A/B>1 is further preferable, and A/B>1.2 is especially preferable.

If A/B is 0.7 or more, mobility is rarely reduced, and threshold or S value is rarely increased too high. Small A/B seems to reflect poor short distance orderliness in an amorphous film.

Average bond distance of In—In is preferably 0.3 to 0.322 nm, and especially preferably 0.31 to 0.32 nm. Average bond distance of In—In can be measured by X-ray absorption spectroscopy. The measurement by the X-ray absorption spectroscopy shows extended X-ray absorption fine structure (EXAFS) expanded from rising to a high energy portion such as several hundred eV higher. EXAFS is caused by backscattering of electrons by atoms surrounding excited atoms. Interference effect between releasing electron wave and backscattered wave is occurred. The interference depends on wavelength of electron state, and light path length traversing between surrounding excited atoms. Radial distribution function (RDF) is obtained by conducting Fourier transform of EXAFS. Average bond distance can be evaluated from RDF peak.

Film thickness of the semi-conductor layer is normally 0.5 to 500 nm, preferably 1 to 150 nm, more preferably 3 to 80 nm, and especially preferably 10 to 60 nm. If the thickness is 0.5 nm or more, industrial, uniform film forming is possible. If the thickness is 500 nm or less, film forming time is not too long. If the thickness is between 3 and 80 nm, TFT properties such as mobility or ON-OFF ratio are especially improved.

Preferred embodiment of the present invention is that the semi-conductor layer is an amorphous film, and that energy width ($E_0$) of delocalized level is 14 meV or less. The energy width ($E_0$) of delocalized level of the semi-conductor layer is preferably 10 meV or less, more preferably 8 meV, and especially preferably 6 meV. If the energy width ($E_0$) of delocalized level is 14 meV or less, and if the semi-conductor layer is used as an active layer for a transistor, mobility is rarely reduced, and threshold or S value is rarely increased too high. High energy width ($E_0$) of delocalized level of the semi-conductor layer seems to reflect poor short distance orderliness in an amorphous film.

Protective Layer of Semi-Conductor Layer

The thin film transistor preferably has a protective layer of a semi-conductor. If there is a protective layer of a semi-conductor, oxygen in a surface layer of a semi-conductor is not left even under vacuum or low pressure, off-current is not increased, and threshold voltage does not become negative. There is no environmental effect such as humidity even under atmospheric pressure, and there is no risk of increasing variation in transistor properties such as threshold voltage.

There is no limitation for selecting material to form the protective layer of a semi-conductor. Any material commonly used may be chosen unless feature of the present invention is lost. For example, $SiO_2$, $SiNx$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiNx$, $Al_2O_3$, $Y_2O_3$, $Hf_2O_3$, and $CaHfO_3$ are preferably used; $SiO_2$, $SiNx$, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as SiOx are allowed). SiOx may contain hydrogen element.

In addition, the followings may be used as a material for the protective layer.

- an amorphous oxide film having the same composition as that of the semi-conductor layer which is formed under a higher partial pressure of oxygen than that during forming the semi-conductor layer
- an amorphous oxide film having the same composition as that of the semi-conductor layer but having different composition ratio from that of the semi-conductor layer
- an amorphous oxide film containing not only In and Zn but also element X which is different from that in the semi-conductor layer
- a multi-crystalline oxide film containing indium oxide as a major component
- a multi-crystalline oxide film containing indium oxide as a major component, which film is doped by one or more positive bivalent elements such as Zn, Cu, Co, Ni, Mn, or Mg.

If the amorphous oxide film having the same composition as that of the semi-conductor layer but having different composition ratio from that of the semi-conductor layer, or the amorphous oxide film containing not only In and Zn but also element X which is different from that in the semi-conductor layer, In composition ratio is preferably less than that of the semi-conductor layer. The composition ratio for the element X is preferably higher than that of the semi-conductor layer.

The material for the protective layer is preferably an oxide containing In and Zn. If these elements are contained, transfer of elements between the protective layer and the semi-conductor layer is not occurred, and threshold voltage shift during stress test, etc. does not become too big.

Such a protective film may have a laminated structure containing two or more different kinds of insulation film. A laminate of SiOx and SiNx is preferable, because it can be prepared industrially and inexpensively.

The protective layer may be a crystalline material, a multi-crystalline material or an amorphous material. A multi-crystalline material or an amorphous material each of which is readily, industrially produced is preferable. It is especially preferable that the protective layer is an amorphous material. If a protective layer is an amorphous material, interfacial smoothness is improved, mobility is not lowered, and neither threshold voltage nor S value becomes too high.

The protective layer of a semi-conductor layer is preferably an amorphous oxide or an amorphous nitride, and an amorphous oxide is especially preferable. If the protective layer is an oxide, oxygen in a semi-conductor does not transfer to a protective layer side, OFF current does not become high, and there is no risk to show normally-OFF caused by negative threshold voltage. The protective layer of the semi-conductor layer may use an organic insulation film such as poly-(4-vinylphenol) (PVP), or parylene. The protective layer of the semi-conductor layer may have two or more layer-laminated structure including an inorganic insulation film and an organic insulation film.

Gate Insulation Film

There is no limitation for selecting material to form the gate insulation film. Any material commonly used may be chosen unless feature of the invention related to the present embodiment is lost. For example, $SiO_2$, $SiNx$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiNx$, $Al_2O_3$, $Y_2O_3$, $Hf_2O_3$, and $CaHfO_3$ are preferably used; $SiO_2$, $SiNx$, $Y_2O_3$, $Hf_2O_3$, and $CaHfO_3$ are more preferable. Number of oxygen in these oxides does not always have to correspond to stoichiometric ratio (e.g. $SiO_2$ as well as SiOx are allowed). SiOx may contain hydrogen element.

Such a gate insulation film may have a laminated structure containing two or more different kinds of insulation film. The gate insulation film may be a crystalline material, a multi-crystalline material or an amorphous material. A multi-crystalline material or an amorphous material each of which is readily, industrially produced is preferable. The gate insulation film may use an organic insulation film such as poly-(4-vinylphenol) (PVP), or parylene. The gate insulation film may have two or more layer-laminated structure including an inorganic insulation film and an organic insulation film.

Electrode

There is no limitation for selecting material to form each electrode such as a gate electrode, a source electrode, and a drain electrode. Any material commonly used may be chosen unless feature of the present invention is lost.

For example, the material may include a transparent electrode such as indium tin oxide (ITO), indium zinc oxide, ZnO, or $SnO_2$; a metal electrode such as Al, Ag, Cr, Ni, Mo, Au, Ti, Ta, or Cu; or an alloyed metal electrode contained thereof. These materials are preferably laminated two or more layers to reduce contact resistance, and to enhance interface strength. In order to reduce contact resistance of a source electrode and a drain electrode, the interface between them and an electrode of a semi-conductor may be subject to plasma treatment and ozone treatment so as to control their resistance.

For example, a film forming method includes a chemical film forming method such as a spray method, a dip method, or a CVD method; and a physical film forming method such as a sputter method, a vacuum deposition method, an ion plating method, or a pulse laser deposition method. A physical film forming method is preferable, since carrier density is readily controlled and film quality is easily improved. A sputter method is more preferable because of its high productivity.

(10-2) Method for Making a Thin Film Transistor (a Field Effect Type Transistor)

The making method of the present invention is characterized by using the sputtering target of the above-mentioned present invention, and by comprising a step for forming an amorphous oxide thin film (a semi-conductor layer) and a step for heat-treating it at 70 to 350° C. after forming the amorphous oxide thin film.

In this connection, each contractual element (layer) of the above-mentioned thin film transistor may be formed by any method known in the present technical field.

Specifically, a film forming method includes a chemical film forming method such as a spray method, a dip method, or a CVD method; and a physical film forming method such as a sputter method, a vacuum deposition method, an electron beam vapor-deposition method, an ion plating method, or a pulse laser deposition method. A physical film forming method is preferable, since carrier density is readily controlled and film quality is easily improved. A sputter method is more preferable because of its high productivity.

Sputtering includes a method using a sintered target of a composite oxide, a method using a cosputter by multiple sintered targets, and a method using a reactive sputter by an alloy target. A sintered target of a composite oxide is preferably used. RF, DC or AC sputtering known in the art is also useful. DC or AC sputtering is preferable in view of uniformity and mass productivity (facility costs).

The formed film may be subject to patterning by several etching methods, a photo-lithography method and a lift-off method.

In the present invention, a semi-conductive film is preferably formed using the target of the present invention by DC or AC sputtering. By using DC or AC sputtering, damage at the film forming can be reduced in comparison with an RF sputtering. Therefore, in a case with a field effect type transistor and a thin film transistor, reduction of threshold voltage shift, enhancement of mobility, reduction of threshold voltage, reduction of S value and so on can be expected.

In the present invention, heat treatment is preferably conducted at 70 to 350° C. after film forming of a semi-conductor layer. Especially, the heat treatment is preferably conducted at 70 to 350° C. after forming a semi-conductor layer and a protective layer of the semi-conductor layer. If the temperature is 70° C. or more, the obtained transistor may keep its sufficient heat stability, heat resistance, and sufficient mobility, and there is no rick to become S value or threshold voltage too high. If the temperature is 350° C. or less, a substrate having no heat resistance can be used, and facility cost for heat treatment is not necessary.

Heat treating temperature is more preferably 80 to 260° C., further preferably 90 to 180° C., and especially preferably 100 to 150° C. Specifically, if the heat treating temperature is 180° C. or less, it is preferable because a resin substrate having low heat resistance such as PEN can be used as a substrate.

Heat treating time is usually preferably 1 second to 24 hours, but it is also preferable that the heat treating time is controlled based on treating temperature. For example, when the temperature is from 70 to 180° C., 10 minutes to 24 hours is more preferable, 20 minutes to 6 hours is further preferable, and 30 minutes to 3 hours is especially preferable. When the temperature is from 180 to 260° C., 6 minutes to 4 hours is more preferable, and 15 minutes to 2 hours is further preferable. When the temperature is from 260 to 300° C., 30 seconds to 4 hours is more preferable, and 1 minute to 2 hours is especially preferable. When the temperature is from 300 to 350° C., 1 second to 1 hour is more preferable, and 2 seconds to 30 minutes is especially preferable.

Heat treatment is preferably conducted in an inert gas under $10^{-3}$ Pa or less of oxygen partial pressure, or after a semi-conductor layer is covered with a protective layer. If either of conditions is selected, reproducibility is improved.

(10-3) Thin Film Transistor Properties

In the thin film transistor of the present invention, mobility is preferably 1 $cm^2$/Vs or more, more preferably 3 $cm^2$/Vs or more, and especially preferably 8 $cm^2$/Vs or more. If the mobility is 1 $cm^2$/Vs or more, switching rate does not become slow, and then the transistor is preferably used for big-screen, high-fineness display.

ON-OFF rate is preferably $10^6$ or more, more preferably $10^7$ or more, and especially preferably $10^8$ or more.

OFF current is preferably 2 pA or less, and more preferably 1 pA or less. If the OFF current is 2 pA or less, sufficient contrast is obtained and excellent uniformity of display is also obtained when the transistor is used for TFT of the display.

Gate-leak current is preferably 1 pA or less. If the gate-leak current is 1 pA or more, excellent contrast is obtained when the transistor is used for TFT of the display.

Threshold voltage is usually 0 to 10V, preferably 0 to 4V, more preferably 0 to 3V, and especially preferably 0 to 2V. If the threshold voltage is 0V or more, normally-ON is avoided, no voltage is needed during OFF, and then electric power consumption can be kept lower. If the threshold voltage is 10V or more, driving voltage can be kept lower, electric power consumption can be kept lower, and mobility can also be kept lower.

S value is preferably 0.8V/dec or less, more preferably 0.3V/dec or less, further preferably 0.25V/dec or less, and especially preferably 0.2V/dec or less. If S value is 0.8V/dec or less, driving voltage does not become higher and then electric power consumption becomes lower. Especially, when the transistor is used for an organic light emitting display, because of direct current drive, if S value is 0.3V/dec or less, electric power consumption is preferably and enormously reduced.

S value (Swing Factor) is to show stepness of drain current which rises rapidly from OFF position to ON position when gate voltage is increased from Off position. As defined by the following formula, increment of gate voltage when drain current increases single digit (10 times) is S value.

$S \text{ value} = dVg/d\log(Ids)$

Lower S value means higher steepness in rising (cf. Yasuhiro Ukai, "Hakumaku-trangista gijutu no subete (All about Thin Film Transistor Technique)", Kogyo Chosa Kai, 2007). If the S value is low, high gate voltage is not needed at the time of switching from ON to OFF, and thus electric power consumption can be reduced.

Threshold voltage shift between before and after applying 10 pA of direct current voltage at 50° C. for 100 hours is preferably 1.0V or less, and more preferably 0.5V or less. If the shift is 1.0V or less, image quality does not change if the transistor is used for a transistor of an organic light emitting display.

Smaller hysteresis during gate voltage being up and down in transfer curve is preferable.

Ratio of channel width W and channel length L: W/L is normally 0.1 to 100, preferably 0.5 to 20, and especially preferably 1 to 8. If W/L is 100 or less, leak current does not increase, ON-OFF ratio would be lowered. If W/L is 0.1 or more, field effect mobility is not lowered, and pinch off becomes clear. The channel length L is normally 0.1 to 1000 μm, preferably 1 to 100 μm, and more preferably 2 to 10 μm. If the channel length L is 0.1 μm or more, there is no possibility to become industrial manufacture difficult and to become leak current higher. If the channel length L is 1000 μm or less, an element does not become too big.

The thin film transistor (field effect type transistor) of the present invention preferably has a structure for shading a semi-conductor layer. If there is a structure for shading a semi-conductor layer (e.g. a shading layer), there is no possibility to excite a carrier electron when light comes in the semi-conductor layer and then to become OFF current higher. The shading layer preferably includes a thin film having absorption between 300 nm and 800 nm. The shading layer may be located on either upper or lower portion of the semi-conductor layer, but the shading layer is preferably located on both upper and lower portions. The shading layer may also be used as a gate insulation film and a black matrix. If the shading layer is present only on one side, it is necessary to improve its structure not to radiate light to a semi-conductor layer from another side where no shading layer is present.

The thin film transistor of the present invention may have a contact layer between a semi-conductor layer and a source electrode or a drain electrode. The contact layer preferably has lower resistance than that of a semi-conductor layer. Forming materials of the contact layer may include a composite oxide having similar composition to that of the above-mentioned semi-conductor layer.

That is, the contact layer preferably contains each element such as In, Zn or Zr. If these elements are included, transfer of elements between the contact layer and the semi-conductor layer is not occurred, and threshold voltage shift during stress test, etc. does not become too big.

There is not limitation for a preparation method of the contact layer, but a contact layer having the same composition ratio as that of the semi-conductor layer may be formed by changing film forming conditions; a layer having different composition ratio from that of the semi-conductor layer may be formed; a layer may be constructed by heightening resistance at a portion contacting with an electrode of the semi-conductor by plasma treatment or ozone treatment; or a layer having higher resistance by varying film forming conditions such as partial pressure for oxygen may be formed during forming a semi-conductor. The thin film transistor (field effect type transistor) of the present invention preferably contains an oxygen resistance layer having a resistance higher than that of the semi-conductor layer between a semi-conductor layer and a gate insulation layer, and/or between a semi-conductor layer and a protective layer. If there is an oxide resistance layer, OFF current is not detected, normally-ON caused by negative threshold can be avoided, and there is no deterioration on properties caused by changing semi-conductor's quality during post-treating step such as forming a protective film or etching.

The oxide resistance layer may include as follows.
an amorphous oxide film having the same composition ratio as that of the semi-conductor layer which film is formed under a higher partial pressure of oxygen than that during forming the semi-conductor layer
an amorphous oxide film having the same composition as that of the semi-conductor layer but having different composition ratio from that of the semi-conductor layer
an amorphous oxide film containing not only In and Zn but also element X which is different from that in the semi-conductor layer
a multi-crystalline oxide film containing indium oxide as a major component
a multi-crystalline oxide film containing indium oxide as a major component, which film is doped by one or more positive bivalent elements such as Zn, Cu, Co, Ni, Mn, or Mg.

If the amorphous oxide film having the same composition as that of the semi-conductor layer but having different composition ratio from that of the semi-conductor layer, or the amorphous oxide film containing not only In and Zn but also element X which is different from that in the semi-conductor layer, In composition ratio is preferably less than that of the semi-conductor layer. The composition ratio for the element X is preferably higher than that of the semi-conductor layer.

The oxide resistance layer is preferably an oxide containing In and Zn. If these elements are contained, transfer of elements between the oxide resistance layer and the semi-conductor layer is not occurred, and threshold voltage shift during stress test, etc. does not become too big.

Although examples of the present invention are shown as follows, the following examples do not intend to limit the scope of the present invention.

EXAMPLES

Example 1

An indium oxide powder having 99.99% purity, a gallium oxide powder having 99.99% purity, and a zinc oxide powder having 99.99% purity were weighed to meet mass ratio of $In_2O_3:Ga_2O_3:ZnO=61:25:14$ mass %, and then mixed and ground by a wet-type medium agitating mill. Zirconia beads having 1 mm φ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for an IGZO sputtering target having relative density of 86% was obtained. Based on X-ray diffraction, it was confirmed that a crystal of an indium oxide having a bixbyite structure and $In_2Ga_2ZnO_7$ was present. X-ray diffraction pattern is shown in FIG. 1. Bulk resistance of this sintered body was $4.80 \times 10^{-3}$ Ωcm.

The amount ratio of elements in the sintered body was In Ga:Zn=51:31:18 atom % based on the result of ICP.

When an oxide semi-conductor film was film-formed by sputtering using this target sintered body, abnormal discharges were occurred 4 times per 72 hours. In addition, film forming by a DC magnetron sputtering method was available.

In the Examples and Comparative Examples of the present invention, a low low-resistivity meter "LORESTA EP" (based on JIS K 7194) produced by Mitsubishi chemical Co. was used for measurement.

Example 2

An indium oxide powder having 99.99% purity, a gallium oxide powder having 99.99% purity, and a zinc oxide powder having 99.99% purity were weighed to meet mass ratio of $In_2O_3:Ga_2O_3:ZnO=70:23:7$ mass %, and then mixed and ground by a wet-type medium agitating mill. Zirconia beads having 1 mm φ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1500° C. for 2 hours. Based on the above steps, an oxide sintered body for an IGZO sputtering target having relative density of 91% was obtained. Based on X-ray diffraction, it was confirmed that a crystal of an indium oxide having a bixbyite structure and $In_2Ga_2ZnO_7$ was present. X-ray diffraction pattern is shown in FIG. 2. Bulk resistance of this sintered body was $1.77 \times 10^{-3}$ Ωcm. The amount ratio of elements in the sintered body was In Ga:Zn=62:30:8 atom % based on the result of ICP.

When an oxide semi-conductor film was film-formed by sputtering using this target sintered body, abnormal discharges were occurred 3 times per 72 hours. In addition, film forming by a DC magnetron sputtering method was available.

Example 3

An indium oxide powder having 99.99% purity, a gallium oxide powder having 99.99% purity, and a zinc oxide powder having 99.99% purity were weighed to meet mass ratio of $In_2O_3:Ga_2O_3:ZnO=78:15:7$ mass %, and then mixed and ground by a wet-type medium agitating mill. Zirconia beads having 1 mm φ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for an IGZO sputtering target having relative density of 83% was obtained. Based on X-ray diffraction, it was confirmed that a crystal of an indium oxide having a bixbyite structure and $In_2Ga_2ZnO_7$ was present as is the case with Example 2. X-ray diffraction pattern is shown in FIG. 3. Bulk resistance of this sintered body was $6.60 \times 10^{-3}$ Ωcm. The amount ratio of elements in the sintered body was In:Ga:Zn=71:20:9 atom % based on the result of ICP.

When an oxide semi-conductor film was film-formed by sputtering using this target sintered body, abnormal discharges were occurred 4 times per 72 hours.

Comparative Example 1

IGZO ($In_2Ga_2ZnO_7$) Sputtering Target
In:Ga:Zn=40:40:20 Atom % 1400° C. Sintering An indium oxide powder having 99.99% purity, a gallium oxide powder having 99.99% purity, and a zinc oxide powder having 99.99% purity were weighed to meet mass ratio of $In_2O_3:Ga_2O_3:ZnO=51:34:15$ mass %, and then sintered under ambient atmosphere at a high temperature of 1400° C. for 2 hours to obtain a $In_2Ga_2ZnO_7$ powder. This powder and an indium oxide $In_2O_3$ powder were weighed to meet mass ratio of 50:50 mass %, and mixed and ground by a wet-type medium agitating mill. Zirconia beads having 1 mm φ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours to obtain an oxide sintered body for an IGZO sputtering target. Based on X-ray diffraction, the presence of a crystal of $In_2Ga_2ZnO_7$ and a peak for an indium oxide having a bixbyite structure were found, but relative density was 75%. X-ray diffraction pattern is shown in FIG. 4. Bulk resistance of this sintered body was $1.65 \times 10^1$ Ωcm. The amount ratio of elements in the sintered body was In:Ga:Zn=40:40:20 atom % based on the result of ICP.

When an oxide semi-conductor film was tried to be film-formed by sputtering using this target sintered body, plasma was not created by a DC sputtering method and thus film forming could not be conducted. When film forming was conducted by an RF sputtering method, many abnormal discharges were occurred during the film forming.

Comparative Example 2

IGZO ($In_2Ga_2ZnO_7$) Sputtering Target
In:Ga:Zn=40:40:20 Atom % 1400° C. Sintering An indium oxide powder having 99.99% purity, a gallium oxide powder having 99.99% purity, and a zinc oxide powder having 99.99% purity were weighed to meet mass ratio of $In_2O_3:Ga_2O_3:ZnO=51:34:15$ mass %, and then mixed and ground by a wet-type medium agitating mill. Zirconia beads having 1 mm φ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for an IGZO sputtering target having relative density of 87% was obtained. Based on X-ray diffraction, a crystal of $In_2Ga_2ZnO_7$ was present in the sintered body, and no peak for an indium oxide was found. X-ray diffraction pattern is shown in FIG. 5. Bulk resistance of this sintered body was $9.24 \times 10^{-2}$ Ωcm. The amount ratio of elements in the sintered body was In:Ga:Zn=40:40:20 atom % based on the result of ICP.

When an oxide semi-conductor film was tried to be film-formed by sputtering using this target sintered body, plasma was not created by a DC sputtering method and thus film forming could not be conducted. When film forming was conducted by an RF sputtering method, many abnormal discharges were occurred during the film forming.

Comparative Example 3

Indium oxide $In_2O_3$ Sputtering Target
In:Ga:Zn=100:0:0 Atom %

An indium oxide powder having 99.99% purity was mixed and ground by a wet-type medium agitating mill. Zirconia beads having 1 mm ϕ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1300° C. for 2 hours. Based on the above steps, an oxide sintered body for an $In_2O_3$ sputtering target having relative density of 80% was obtained. Based on X-ray diffraction, only a crystal of $In_2O_3$ having a bixbyite structure was found in the sintered body. Bulk resistance of this sintered body was $2.64 \times 10^1$ Ωcm. The amount ratio of elements in the sintered body was only In based on the result of ICP.

When an oxide semi-conductor film was tried to be film-formed by sputtering using this target sintered body, plasma was not created by a DC sputtering method and thus film forming could not be conducted. When film forming was conducted by an RF sputtering method, many abnormal voltages were occurred during the film forming.

Comparative Example 4

$In_2O_3$—ZnO Sputtering Target In:Ga:Zn=80:0:20 Atom %

An indium oxide powder having 99.99% purity and a zinc oxide powder having 99.99% purity were weighed to meet mass ratio of $In_2O_3$:ZnO=87.2:12.8 mass %, and mixed and ground by a wet-type medium agitating mill.

Zirconia beads having 1 mm ϕ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1200° C. for 2 hours. Based on the above steps, an oxide sintered body for an $In_2O_3$—ZnO sputtering target having relative density of 87% was obtained. Based on X-ray diffraction, neither a crystal of $In_2Ga_2ZnO_7$ nor a peak for indium oxide was found in the sintered body. Bulk resistance of this sintered body was $4.21 \times 10^{-3}$ Ωcm. The amount ratio of elements in the sintered body was In:Ga:Zn=80:0:20 atom % based on the result of ICP.

The thin film film-formed by sputtering using this target sintered body was an electrically conductive film, and thus it did not work as a semi-conductor.

Comparative Example 5

(In, Ga)$_2$O$_3$ Sputtering Target In:Ga:Zn=60:40:0 Atom %

An indium oxide powder having 99.99% purity and a gallium oxide powder having 99.99% purity were weighed to meet mass ratio of $In_2O_3$:$Ga_2O_3$=70:30 mass %, and mixed and ground by a wet-type medium agitating mill. Zirconia beads having 1 mm ϕ were used as the medium of the wet-type medium agitating mill.

After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on X-ray diffraction, (In, Ga)O$_3$ was found in the sintered body, and no peaks for $In_2Ga_2ZnO_7$ and indium oxide were found. Relative density was 88%. Bulk resistance of this sintered body was $6.43 \times 10^6$ Ωcm. The amount ratio of elements in the sintered body was In:Ga:Zn=60:40:0 atom % based on the result of ICP.

When an oxide semi-conductor film was tried to be film-formed by sputtering using this target sintered body, plasma was not created by a DC sputtering method and thus film forming could not be conducted. When film forming was conducted by an RF sputtering method, many abnormal voltages were occurred during the film forming.

Results of the above Examples and Comparative examples are shown in the following table.

TABLE 1

|  | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|---|---|
| In/(In + Ga) | 0.62 | 0.67 | 0.78 | 0.5 | 0.5 | 1 | 1 | 0.6 |
| Ga/(Ga + Zn) | 0.63 | 0.79 | 0.69 | 0.67 | 0.67 | 0 | 0 | 1 |
| RELATIVE EDENSITY | 86% | 91% | 83% | 75% | 87% | 80% | 87% | 88% |
| BULK RESISTANCE (Ωcm) | $4.80 \times 10^{-3}$ | $1.77 \times 10^{-3}$ | $6.60 \times 10^{-3}$ | $1.65 \times 10^3$ | $9.24 \times 10^{-2}$ | $2.64 \times 10^1$ | $4.21 \times 10^{-3}$ | $6.43 \times 10^6$ |
| SINTERING TEMPERATURE | 1400° C. | 1500° C. | 1400° C. | 1400° C. | 1400° C. | 1300° C. | 1200° C. | 1400° C. |
| ABNORMAL DISCHARGES | ○ NONE 4 TIMES/ 72 HOURS | ○ NONE 3 TIMES/ 72 HOURS | ○ NONE 4 TIMES/ 72 HOURS | X PRESENT 12 TIMES/ 72 HOURS | X PRESENT 9 TIMES/ 72 HOURS | X PRESENT 15 TIMES/ 72 HOURS | — | X PRESENT 23 TIMES/ 72 HOURS |

Preparation of IGZO Sputtering Target

Example 4

Composition A 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=47.3:9.1:43.6$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 89% was obtained. Based on X-ray diffraction, it was confirmed that a crystal of an indium oxide having a bixbyite structure and $InGaO_3$(ZnO) having a homologous structure was present. X-ray diffraction pattern is shown in FIG. 8. Bulk resistance of this sintered body was $3.42 \times 10^{-2}$ Ωcm. Reduction treatment, etc. were not conducted so as to reduce bulk resistance. The amount ratio of elements in the sintered body was In:Ga:Zn=35:10:55 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Example 5

Composition B 1400° C. 2 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=49.3:11.7:39.0$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for a sputtering target having relative density of 87% was obtained. Based on X-ray diffraction, it was confirmed that a crystal of an indium oxide having a bixbyite structure and $InGaO_3$(ZnO) having a homologous structure was present. X-ray diffraction pattern is shown in FIG. 9. Bulk resistance of this sintered body was $4.02 \times 10^{-1}$ Ωcm. Reduction treatment, etc. were not conducted so as to reduce bulk resistance. The amount ratio of elements in the sintered body was In:Ga:Zn=37:13:50 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Example 6

Composition B 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=49.3:11.7:39.0$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 90% was obtained. Based on X-ray diffraction, it was confirmed that a crystal of an indium oxide having a bixbyite structure and $InGaO_3$(ZnO) having a homologous structure was present. X-ray diffraction pattern is shown in FIG. 10. Bulk resistance of this sintered body was $1.02 \times 10^{-2}$ Ωcm. Reduction treatment, etc. were not conducted so as to reduce bulk resistance. The amount ratio of elements in the sintered body was In:Ga:Zn=37:13:50 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Example 7

Composition C 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=46.7:18.1:35.2$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 85% was obtained. Based on X-ray diffraction, it was confirmed that a crystal of an indium oxide having a bixbyite structure and $InGaO_3$(ZnO) having a homologous structure was present. X-ray diffraction pattern is shown in FIG. 11. Bulk resistance of this sintered body was $1.84 \times 10^{0}$ Ωcm. Reduction treatment, etc. were not conducted so as to reduce bulk resistance. The amount ratio of elements in the sintered body was In:Ga:Zn=35:20:45 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Example 8

Composition D 1400° C. 2 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=66:16:18$ mass %, and then mixed and ground by a wet-type medium agitating mill. Zirconia beads having 1 mm $\phi$ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for a sputtering target having relative density of 84% was obtained. Based on X-ray diffraction, it was confirmed that a crystal of an indium oxide having a bixbyite structure and $InGaO_3$ (ZnO) having a homologous structure was present. X-ray diffraction pattern is shown in FIG. 12. Bulk resistance of this sintered body was $1.17\times10^0$ $\Omega$cm. Reduction treatment, etc. were not conducted so as to reduce bulk resistance. The amount ratio of elements in the sintered body was In:Ga:Zn=55:20:25 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Example 9

Composition E 1400° C. 2 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=71:8:21$ mass %, and then mixed and ground by a wet-type medium agitating mill. Zirconia beads having 1 mm $\phi$ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 2 hours. Based on the above steps, an oxide sintered body for a sputtering target having relative density of 83% was obtained. Based on X-ray diffraction, it was confirmed that a crystal of an indium oxide having a bixbyite structure and $InGaO_3$ (ZnO) having a homologous structure was present. X-ray diffraction pattern is shown in FIG. 13. Bulk resistance of this sintered body was $1.87\times10^0$ $\Omega$cm. Reduction treatment, etc. were not conducted so as to reduce bulk resistance. The amount ratio of elements in the sintered body was In:Ga:Zn=60:10:30 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times.

Preparation of Positive Quadrivalent Element Added IGZO Sputtering Target

Example 10

Composition B+Sn 300 ppm 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=49.3:11.7:39.0$ mass %, and then 300 ppm of a tin Sn elemental metal powder was added. These powders were mixed and ground by a wet-type medium agitating mill. Zirconia beads having 1 mm $\phi$ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 89% was obtained. Based on X-ray diffraction, it was confirmed that a crystal of an indium oxide having a bixbyite structure and $InGaO_3$ (ZnO) having a homologous structure was present. Bulk resistance of this sintered body was $6.07\times10^{-3}$ $\Omega$cm. Reduction treatment, etc. were not conducted so as to reduce bulk resistance. The amount ratio of elements in the sintered body was In:Ga:Zn=37:13:50 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times. In addition, film forming by a DC magnetron sputtering method was available.

Example 11

Composition B+Sn 1500 ppm 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=49.3:11.7:39.0$ mass %, and then 1500 ppm of a tin Sn elemental metal powder was added. These powders were mixed and ground by a wet-type medium agitating mill. Zirconia beads having 1 mm $\phi$ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 91% was obtained. Based on X-ray diffraction, it was confirmed that a crystal of an indium oxide having a bixbyite structure and $InGaO_3$ (ZnO) having a homologous structure was present. Bulk resistance of this sintered body was $2.15\times10^{-3}$ $\Omega$cm. Reduction treatment, etc. were not conducted so as to reduce bulk resistance. The amount ratio of elements in the sintered body was In:Ga:Zn=37:13:50 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times. In addition, film forming by a DC magnetron sputtering method was available.

Example 12

Composition B+Ge 1500 ppm 1400° C. 20 h Sintered

An indium oxide powder having 99.99% purity, a gallium oxide powder having 99.99% purity, and a zinc oxide powder having 99.99% purity were weighed to meet mass ratio of $In_2O_3:Ga_2O_3:ZnO=49.3:11.7:39.0$ mass %, and then 1500 ppm of a germanium Ge elemental metal powder was added. These powders were mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body for a sputtering target having relative density of 87% was obtained. Based on X-ray diffraction, it was confirmed that a crystal of an indium oxide having a bixbyite structure and $InGaO_3(ZnO)$ having a homologous structure was present. Bulk resistance of this sintered body was $4.89 \times 10^{-3}$ Ωcm. Reduction treatment, etc. were not conducted so as to reduce bulk resistance. The amount ratio of elements in the sintered body was In:Ga:Zn=37:13:50 atom % based on the result of ICP.

A sputtering target was prepared by using the sintered body obtained by the above steps. No notable abnormal discharges were observed when an oxide semi-conductor film was film-formed by an RF sputtering. Abnormal discharges during 72 hour continuous operation were less than 5 times. In addition, film forming by a DC magnetron sputtering method was available.

Comparative Example 6

Homologous Structure Compound $InGaO_3(ZnO)$

An indium oxide powder having 99.99% purity, a gallium oxide powder having 99.99% purity, and a zinc oxide powder having 99.99% purity were weighed to meet mass ratio of $In_2O_3:Ga_2O_3:ZnO=44.2:29.9:25.9$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body only composed of a homologous structure compound $InGaO_3(ZnO)$ having relative density of 87% was obtained. Bulk resistance of this sintered body was $2.67 \times 10^2$ Ωcm. Reduction treatment, etc. were not conducted so as to reduce bulk resistance. The amount ratio of elements in the sintered body was In:Ga:Zn=1:1:1 mole ratio based on the result of ICP.

A sputtering target was prepared by using the sintered body obtained by the above steps. Abnormal discharges were observed when an oxide semi-conductor film was film-formed by an RF sputtering. Abnormal discharges during 72 hour continuous operation were 15 times.

Comparative Example 7

Homologous Structure compound $InGaO_3(ZnO)_2$

An indium oxide powder having 99.99% purity, a gallium oxide powder having 99.99% purity, and a zinc oxide powder having 99.99% purity were weighed to meet mass ratio of $In_2O_3:Ga_2O_3:ZnO=35.1:23.7:41.2$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body only composed of a homologous structure compound $InGaO_3(ZnO)_2$ having relative density of 85% was obtained.

Bulk resistance of this sintered body was $4.83 \times 10^2$ Ωcm. Reduction treatment, etc. were not conducted so as to reduce bulk resistance. The amount ratio of elements in the sintered body was In:Ga:Zn=1:1:2 mole ratio based on the result of ICP.

A sputtering target was prepared by using the sintered body obtained by the above steps. Abnormal discharges were observed when an oxide semi-conductor film was film-formed by an RF sputtering. Abnormal discharges during 72 hour continuous operation were 18 times.

Comparative Example 8

Homologous Structure Compound $InGaO_3(ZnO)_3$

An indium oxide powder having 99.99% purity, a gallium oxide powder having 99.99% purity, and a zinc oxide powder having 99.99% purity were weighed to meet mass ratio of $In_2O_3:Ga_2O_3:ZnO=29.1:19.7:51.2$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body only composed of a homologous structure compound $InGaO_3(ZnO)_3$ having relative density of 83% was obtained.

Bulk resistance of this sintered body was $1.52 \times 10^3$ Ωcm. Reduction treatment, etc. were not conducted so as to reduce bulk resistance. The amount ratio of elements in the sintered body was In:Ga:Zn=1:1:3 mole ratio based on the result of ICP.

A sputtering target was prepared by using the sintered body obtained by the above steps. Abnormal discharges were observed when an oxide semi-conductor film was film-formed by an RF sputtering. Abnormal discharges during 72 hour continuous operation were 24 times.

Comparative Example 9

Homologous Structure Compound $InGaO_3(ZnO)_4$

An indium oxide powder having 99.99% purity, a gallium oxide powder having 99.99% purity, and a zinc oxide powder having 99.99% purity were weighed to meet mass ratio of $In_2O_3:Ga_2O_3:ZnO=24.8:16.8:58.4$ mass %, and then mixed and ground by a wet-type medium agitating mill. Zirconia beads having 1 mm φ were used as the medium of the wet-type medium agitating mill. After mixing and grinding each crude material, each crude material was dried by a spray dryer. The obtained mixed powder was filled in a metal mold, and then press formed by a cold press device to make a formed body.

The obtained formed body was sintered under ambient atmosphere at a high temperature of 1400° C. for 20 hours. Based on the above steps, an oxide sintered body only composed of a homologous structure compound $InGaO_3(ZnO)_4$ having relative density of 82% was obtained.

Bulk resistance of this sintered body was $6.53 \times 10^3$ Ωcm. Reduction treatment, etc. were not conducted so as to reduce bulk resistance. The amount ratio of elements in the sintered body was In:Ga:Zn=1:1:4 mole ratio based on the result of ICP.

A sputtering target was prepared by using the sintered body obtained by the above steps. Abnormal discharges were observed when an oxide semi-conductor film was film-formed by an RF sputtering. Abnormal discharges during 72 hour continuous operation were 23 times.

Results of the above Examples and Comparative examples are shown in the following table.

TABLE 2

|  | EXAMPLE 4 | EXAMPLE 5 | EXAMPLE 6 | EXAMPLE 7 | EXAMPLE 8 | EXAMPLE 9 |
| --- | --- | --- | --- | --- | --- | --- |
| In/(In + Ga) | 0.78 | 0.74 | 0.74 | 0.64 | 0.73 | 0.85 |
| Zn/(In + Ga + Zn) | 0.55 | 0.50 | 0.50 | 0.45 | 0.25 | 0.30 |
| SINTERING TEMPERATURE/TIME | 1400° C./20 h | 1400° C./2 h | 1400° C./20 h | 1400° C./20 h | 1400° C./2 h | 1400° C./2 h |
| RELATIVE DENSITY | 89% | 87% | 90% | 85% | 84% | 83% |
| BULK RESISTANCE (Ωcm) | $3.42 \times 10^{-2}$ | $4.02 \times 10^{-1}$ | $1.02 \times 10^{-2}$ | $1.84 \times 10^0$ | $1.17 \times 10^0$ | $1.87 \times 10^0$ |
| ABNORMAL DISCHARGES | ○ NONE <5 TIMES/ 72 HOURS | ○ NONE <5 TIMES/ 72 HOURS | ○ NONE <5 TIMES/ 72 HOURS | ○ NONE <5 TIMES/ 72 HOURS | ○ NONE <5 TIMES/ 72 HOURS | ○ NONE <5 TIMES/ 72 HOURS |

TABLE 3

|  | EXAMPLE 10 | EXAMPLE 11 | EXAMPLE 12 |
| --- | --- | --- | --- |
| In/(In + Ga) | 0.74 | 0.74 | 0.74 |
| Zn/(In + Ga + Zn) | 0.50 | 0.50 | 0.50 |
| ADDED ELEMENT | Sn | Sn | Ge |
| ADDED AMOUNT | 300 ppm | 1500 ppm | 1500 ppm |
| SINTERING TEMPERATURE/TIME | 1400° C./20 h | 1400° C./20 h | 1400° C./20 h |
| RELATIVE DENSITY | 89% | 91% | 87% |
| BULK RESISTANCE (Ωcm) | $6.07 \times 10^{-3}$ | $2.15 \times 10^{-3}$ | $4.89 \times 10^{-3}$ |
| ABNORMAL DISCHARGES | ○ NONE <5 TIMES/ 72 HOURS | ○ NONE <5 TIMES/ 72 HOURS | ○ NONE <5 TIMES/ 72 HOURS |

TABLE 4

|  | COMPARATIVE EXAMPLE 6 | COMPARATIVE EXAMPLE 7 | COMPARATIVE EXAMPLE 8 | COMPARATIVE EXAMPLE 9 |
| --- | --- | --- | --- | --- |
| In/(In + Ga) | 0.50 | 0.50 | 0.50 | 0.50 |
| Zn/(In + Ga + Zn) | 0.33 | 0.50 | 0.60 | 0.67 |
| RELATIVE DENSITY | 87% | 85% | 83% | 82% |
| BULK RESISTANCE (Ωcm) | $2.67 \times 10^2$ | $4.83 \times 10^2$ | $1.52 \times 10^3$ | $6.53 \times 10^3$ |
| SINTERING TEMPERATURE/TIME | 1400° C./20 h | 1400° C./20 h | 1400° C./20 h | 1400° C./20 h |
| ABNORMAL DISCHARGES | X PRESENT 15 TIMES/ 72 HOURS | X PRESENT 18 TIMES/ 72 HOURS | X PRESENT 24 TIMES/ 72 HOURS | X PRESENT 23 TIMES/ 72 HOURS |

<Confirmation Test for an Oxide Having a Crystalline Structure of Rare-Earth Oxide C Type>

By varying crude material and sintering conditions, several oxide sintered bodies were prepared, and then it was confirmed that an oxide having a crystalline structure of rare-earth oxide C type was obtained. Specifically, the confirmation test was conducted as follows.

(1) Example A

Powders of $In_2O_3$, $Ga_2O_3$, and ZnO each of which has the following specific surface area and average median size were added to a 500 ml polyamide container.

|  | specific surface area ($m^2$/g) | average median size (μm) |
|---|---|---|
| $In_2O_3$ powder | 15 | 5 |
| $Ga_2O_3$ powder | 14 | 5 |
| ZnO powder | 4 | 2 |

The specific surface area is a value determined by a BET method.

The average median size is obtained from particle size distribution determined by using laser diffraction, scattering method (micro-track method).

In addition, 200 g of zirconia beads having an average diameter of 2 mm were added in the polyamide container to obtain a mixture.

This mixture was wet-mixed by using a planetary ball mill device provided by Fritz Japan for one hour. Ethanol was used as a disperse media. Each mixed powder was calcined in an alumina crucible under ambient pressure at 1000° C. for 5 hours, then unraveled using the planetary ball mill device again for 1 hour. Thus prepared calcined powder was formed in a disc configuration having 20 mm in diameter by a uniaxial pressing (100 kg/$cm^2$), and sintered under ambient pressure at 1500° C. for 20 hours, and then obtained a sintered body.

The sintered body was ground and analyzed by ICP, and then atom ratio of metals contained in Example A was In:Ga:Zn=33:33:34. Based on the analytical result from X-ray diffraction (XRD), crystalline type was rare-earth oxide C type (JCPDS Card No. 14-0564). The X-ray diffraction (XRD) was shifted to high angle side, and thus it was confirmed that lattice constant became smaller than $In_2O_3$ single crystal.

Therefore, it seems that either or both of Ga and Zn were subjected to solid solution substitution in a crystalline structure of rare-earth oxide C type of indium oxide so as to make unit cell of a crystal small.

(2) Comparative Example

Powders of $In_2O_3$, $Ga_2O_3$, and ZnO each of which has the following specific surface area and average particle diameter were added to a 500 ml polyamide container.

|  | specific surface area ($m^2$/g) | average median size (μm) |
|---|---|---|
| $In_2O_3$ powder | 11 | 4 |
| $Ga_2O_3$ powder | 11 | 4 |
| ZnO powder | 9 | 3 |

Further, 200 g of zirconia beads having an average diameter of 2 mm were added in the polyamide container to obtain a mixture.

The same steps as those of Example A were conducted to obtain an oxide sintered body, except that this mixture was sintered under ambient pressure at 1400° C. for 2 hours.

The sintered body was ground and analyzed by ICP, and then atom ratio of metals contained in Comparative example A was In:Ga:Zn=33:33:34. Based on the analytical result from X-ray diffraction (XRD), crystalline type was not rare-earth oxide C type, but the crystalline type was $InGaZnO_4$ (JCPDS Card No. 38-1104) which type is the same as that of the patent documents 4, 5 and 7.

It should be surprised that a crystalline type of an oxide composed of complex elements which contains indium oxide in an amount of only ⅓ of the total indicates rare-earth oxide C type derived from indium oxide.

Comparing a type of the crystalline structure of rare-earth oxide C type with that a conventional type based on the same composition, the type of the crystalline structure of rare-earth oxide C type has higher density and lower bulk resistance than those of the conventional type.

By varying composition and sintering conditions, and sintering by the same conditions, physical properties of sintered bodies of Examples A to D and Comparative examples A and B are shown in Table 5. FIGS. 15 to 20 show X-ray diffraction (XRD) data of Examples A to D and Comparative examples A and B.

TABLE 5

|  |  |  |  | EXAMPLE | | | | COMPARATIVE EXAMPLE | |
|---|---|---|---|---|---|---|---|---|---|
|  |  |  |  | A | B | C | D | A | B |
| CRUDE MATERIALS | SPECIFIC SURFACE AREA | $In_2O_3$ | ($m^2$/g) | 15 | 15 | 15 | 15 | 11 | 11 |
|  |  | $Ga_2O_3$ | ($m^2$/g) | 14 | 14 | 14 | 14 | 11 | 11 |
|  |  | ZnO | ($m^2$/g) | 4 | 4 | 4 | 4 | 9 | 9 |
| SINTERED BODY | COMPOSITION | ELEMENT COMPOSITION RATIO (ATOM %) | In/(In + Ga + Zn) | 0.33 | 0.4 | 0.35 | 0.35 | 0.33 | 0.4 |
|  |  |  | Ga/(In + Ga + Zn) | 0.33 | 0.4 | 0.2 | 0.2 | 0.33 | 0.4 |
|  |  |  | Zn/(In + Ga + Zn) | 0.34 | 0.2 | 0.45 | 0.45 | 0.34 | 0.2 |

TABLE 5-continued

| | | | EXAMPLE | | | | COMPARATIVE EXAMPLE | |
|---|---|---|---|---|---|---|---|---|
| | | | A | B | C | D | A | B |
| SINTERING CONDITION | SINTERING TEMPERATURE (° C.) | | 1500 | 1500 | 1500 | 1500 | 1400 | 1400 |
| | SINTERING TIME (Hr) | | 20 | 20 | 2 | 20 | 2 | 2 |
| CRYSTALLINE TYPE (XRD) | RARE-EARTH OXIDE C TYPE | JCPDS CARD No. 14-0564 PEAK SHIFT | ⊚ HIGH ANGLE | ⊚ HIGH ANGLE | ⊚ HIGH ANGLE | ⊚ HIGH ANGLE | | |
| | | LATTICE CONSTANT a(Å) | | | | | | |
| | $InGaZnO_4$ | JCPDS CARD No. 38-1104 | | | | | ⊚ | |
| | $In_2Ga_2ZnO_7$ | JCPDS CARD No. 38-1097 | | | | | | ⊚ |
| PROPERTIES IN SINTERED BODY | DENSITY | (%) | 6.0 | 6.5 | 5.8 | 5.9 | 5.7 | 6.3 |
| | BULK RESISTANCE | (mΩcm) | 4.4 | 2.6 | 2.4 | 2.4 | 2 × 10³ | 50 |
| | CRACK FORMING | | NONE | NONE | NONE | NONE | PRESENT | PRESENT |
| | COLOR HETEROGENEITY | | NONE | NONE | NONE | NONE | PRESENT | PRESENT |

Preparation of Sputtering Target

Example 13

An $In_2O_3$ powder having 15 m²/g of specific surface area, 5 μm of average median size, and 99.99% purity, a $Ga_2O_3$ powder having 14 m²/g of specific surface area, 5 μm of average median size, and 99.99% purity, and a ZnO powder having 4 m²/g of specific surface area, 2 μm of average median size, and 99.99% purity were compounded, and then mixed and ground until each crude powder has 1 μm or less of average median size. The specific surface area is a value determined by a BET method. The average median size is obtained from particle size distribution determined by using laser diffraction, scattering method (micro-track method).

Thus obtained mixture was subject to quick dry granulation by a spray dryer under 140 ml/min. of supply ratio of the mixture, 140° C. of heated air temperature and 8 Nm³/min. of the amount of the heated air. Then the granulated substance was formed by a cold isostatic press under 25° C. and a pressure of 3000 kg/cm² to form a formed body.

Then, under ambient pressure, the formed body was subjected to raising temperature at rate of 0.5° C./min. until 600° C. at the surface temperature of the formed body, while oxygen gas was introduced at a flow rate of 10 L/min., raising temperature at rate of 1° C./min. between 600 to 800° C., and further raising temperature at rate of 3° C./min. between 800 to 1500° C. Then, temperature was kept at 1500° C. for 2 hours to obtain a sintered body.

The sintered body was analyzed by ICP, and then composition ratio was In:Ga:Zn=35:20:45 by the atom ratio other than oxygen. Density of the obtained sintered body was calculated by mass and geometric size of the sintered body. Based on the result from X-ray diffraction, the sintered body was composed of a multicrystal of rare-earth oxide C type (JCPDS Card No. 14-0564). Lattice constant a is 10.05 Å.

Oxygen defect d is 1×10³. The range of variation of the number of positive metal elements other than zinc is 3% or less. The range of variation of density in the sintered body is 3% or less. The number of pinholes having 2 μm or greater Feret diameter was 5 pinholes/mm² or less. The average crystalline particle diameter determined by EPMA was 17 μm.

Examples 14 to 35 and Comparative Examples 10 to 23

Oxide sintered bodies were obtained by the same way as that of Example 1 except that sintering time, sintering temperature, composition, a crude material, and a granulating method were different. In addition, EPMA figure of Example 15 is also shown (FIG. 14).

[Evaluation]

Bulk resistance, bending strength and presence or absence of crack at sintering were evaluated. The obtained results are shown in Table 6. Each evaluation was conducted by the following method.

Relative Density

The relative density was obtained from theoretical density calculated from density of a crude powder and density of a sintered body determined by Archimedes method using the following formula.

Relative Density=(Density determined by Archimedes method)/(Theoretical Density)×100(%)

Average Crystalline Particle Diameter

The maximum particle diameters was determined by embedding a sintered body in a resin, polishing its surface by aluminum particles having particle size of 0.05 μm, and then, measuring a maximum particle diameter of crystal particles at five locations observed within 40 μm×40 μm square frame of the sintered body surface by X-ray microanalyzer (EPMA) named JXA-8621MX (JOEL Ltd.), and then the average of them was considered as an average crystalline particle diameters.

Bulk Resistance

Bulk resistance was determined by a resistance meter (Mitsubishi chemical Co., LORESTA) using four-point probe method (JIS R 1637), and calculated from an average value taken from 10 locations.

Uniformity of Bulk Resistance

Uniformity of bulk resistance was determined by measuring bulk resistance at 10 locations on the identical target surface, and then obtained a ratio between maximum value and minimum value (maximum value/minimum value). Evaluation was conducted based on 4 levels, from those having excellent uniformity, up to 5: ⊚, up to 10: ○, up to 20: Δ, and more than 20: X.

Bending Strength (Crossbreaking Strength)

Bending strength was evaluated based on JIS R1601 by using a bending strength tester.

Crack at Sintering

The presence or absence of the crack forming was confirmed by the naked eye immediately after sintering.

X-Ray Diffraction (XRD)

Device: RIGAKU Co., Ultima-III

X-ray: Cu-K α-ray (Wave length 1.5406 Å, monochromated by a graphite monochromator)

2θ-θ reflection method, continuous scanning (1.0°/min.)

Sampling interval: 0.02°

Slit DS, SS: 2/3°, RS: 0.6 mm

TABLE 6

| | | | EXAMPLE | | | | | | | | | | | |
|---|---|---|---|---|---|---|---|---|---|---|---|---|---|---|
| | | | 13 | 14 | 15 | 16 | 17 | 18 | 19 | 20 | 21 | 22 | 23 | 24 |
| CRUDE MATERIALS | SPECIFIC SURFACE AREA | In$_2$O$_3$ (m$^2$/g) | 15 | 15 | 15 | 15 | 15 | 15 | 15 | 15 | 15 | 15 | 15 | 15 |
| | | Ga$_2$O$_3$ (m$^2$/g) | 14 | 14 | 14 | 14 | 14 | 14 | 14 | 14 | 14 | 14 | 14 | 14 |
| | | ZnO (m$^2$/g) | 4 | 4 | 4 | 4 | 4 | 4 | 4 | 4 | 4 | 4 | 4 | 4 |
| TARGET | COMPOSITION | ELEMENT COMPOSITION RATIO (ATOM %) In/(In + Ga + Zn + X) | 0.35 | 0.35 | 0.35 | 0.33 | 0.4 | 0.35 | 0.35 | 0.35 | 0.35 | 0.35 | 0.35 | 0.35 |
| | | Ga/(In + Ga + Zn + X) | 0.2 | 0.2 | 0.2 | 0.33 | 0.4 | 0.2 | 0.2 | 0.2 | 0.2 | 0.2 | 0.2 | 0.2 |
| | | Zn/(In + Ga + Zn + X) | 0.45 | 0.45 | 0.45 | 0.34 | 0.2 | 0.45 | 0.45 | 0.45 | 0.45 | 0.45 | 0.45 | 0.45 |
| | | ELEMENT HAVING FOUR OR MORE VALENCES X | — | — | — | — | — | Sn | Sn | Sn | Sn | Ge | Zr | Ce |
| | | CONTENT (ppm) | — | — | — | — | — | 200 | 500 | 2000 | 4000 | 500 | 500 | 500 |
| | PRODUCTION CONDITION | GRANULATION METHOD | SPRAY DRY | SPRAY DRY | SPRAY DRY | SPRAY DRY | SPRAY DRY | SPRAY DRY | SPRAY DRY | SPRAY DRY | SPRAY DRY | SPRAY DRY | SPRAY DRY | SPRAY DRY |
| | | OXYGEN FLOW RATE (L/min) | 10 | 10 | 10 | 10 | 10 | 10 | 10 | 10 | 10 | 10 | 10 | 10 |
| | | RAISING TEMPERATURE RATE (° C./min) | 3 | 3 | 3 | 3 | 3 | 3 | 3 | 3 | 3 | 3 | 3 | 3 |
| | | SINTERING TEMPERATURE (° C.) | 1500 | 1500 | 1500 | 1500 | 1500 | 1500 | 1500 | 1500 | 1500 | 1500 | 1500 | 1500 |
| | | SINTERING TIME (Hr) | 2 | 10 | 20 | 20 | 20 | 20 | 20 | 20 | 20 | 20 | 20 | 20 |
| | CRYSTALLINE TYPE (XRD) | RARE-EARTH OXIDE C | ◎ | ◎ | ◎ | ◎ | ◎ | ◎ | ◎ | ◎ | ◎ | ◎ | ◎ | ◎ |
| | | TYPE LATTICE CONSTANT a (Å) | | | | | | | | | | | | |
| | | InGaZnO$_4$ JCPDS CARD No. 38-1104 | | | | | | | | | | | | |
| | | In$_2$Ga$_2$ZnO$_7$ JCPDS CARD No. 38-1097 | | | | | | | | | | | | |
| | | ZnO JCPDS CARD No. 38-1240 | | | | | | | | | | | | |
| | | β-GaInO$_3$ JCPDS CARD No. 21-0334 | | | | | | | | | | | | |
| | | β-Ga$_2$O$_3$ JCPDS CARD No. 43-1012 | | | | | | | | | | | | |
| | | ZnGa$_2$O$_4$ JCPDS CARD No. 38-1240 | | | | | | | | | | | | |
| | | (Ga,In)$_2$O$_3$ JCPDS CARD No. 14-0564 | | | | | | | | | | | | |
| | | In$_2$O$_3$(ZnO)m | | | | | | | | | | | | |
| EVALUATIONS FOR A TARGET | | RELATIVE DENSITY (%) | 98 | 98 | 98 | 98 | 98 | >99 | >99 | >99 | >99 | >99 | >99 | >99 |
| | | BULK RESISTANCE (mΩcm) | 3 | 3 | 3 | 4 | 4 | 1 | 0.8 | 0.7 | 0.7 | 0.6 | 0.7 | 0.7 |
| | | UNIFORMITY OF BULK RESISTANCE (%) | <5 | <5 | <5 | <5 | <5 | <5 | <5 | <5 | <5 | <5 | <5 | <5 |
| | | AVERAGE CRYSTALLINE PARTICLE DIAMETER (μm) | 3 | 6 | 17 | 19 | 19 | 14 | 14 | 14 | 14 | 12 | 14 | 14 |
| | | BENDING STRENGTH (kg/mm$^2$) | 12.2 | 12.2 | 12.2 | 11.8 | 11.6 | 13.1 | 13.5 | 14.2 | 14.3 | 14.8 | 14.3 | 14.3 |
| | | CRACK FORMING AT SINTERING | ○ | ○ | ○ | ○ | ○ | ○ | ◎ | ◎ | ○ | ◎ | ◎ | ◎ |
| | | RF SPUTTERING ABNORMAL ELECTRIC DISCHARGE | ◎ | ◎ | ◎ | ◎ | ◎ | ◎ | ◎ | ◎ | ◎ | ◎ | ◎ | ◎ |
| | | IN-PLANE UNIFORMITY | ◎ | ◎ | ◎ | ○ | ○ | ◎ | ◎ | ◎ | ◎ | ◎ | ◎ | ◎ |
| | | DC SPUTTERING ABNORMAL ELECTRIC DISCHARGE (TIMES/96 HOURS) | <10 | <10 | <10 | <10 | <10 | <10 | <10 | <10 | <10 | <10 | <10 | <10 |

TABLE 6-continued

| | | | | 25 | 26 | 27 | 28 | 29 | 30 | 31 | 32 | 33 | 34 | 35 |
|---|---|---|---|---|---|---|---|---|---|---|---|---|---|---|
| | | | | | | | | | EXAMPLE | | | | | |
| EVALUATIONS ON TFT PREPARATION | | NODULE FORMING | | ⊚ | ⊚ | ⊚ | ⊚ | ⊚ | ⊚ | ⊚ | ⊚ | ⊚ | ⊚ | ⊚ |
| | | CONTINUOUS STABILITY | | ⊚ | ⊚ | ⊚ | ⊚ | ⊚ | ⊚ | ⊚ | ⊚ | ⊚ | ⊚ | ⊚ |
| | | IN-PLANE UNIFORMITY | | ⊚ | ⊚ | ⊚ | ⊚ | ⊚ | ⊚ | ⊚ | ⊚ | ⊚ | ⊚ | ⊚ |
| | | CRACK FORMING ON TARGET | | ⊚ | ⊚ | ⊚ | ⊚ | ⊚ | ⊚ | ⊚ | ⊚ | ⊚ | ⊚ | ⊚ |
| | | MOBILITY | cm²/Vs | 21 | 22 | 8 | 7 | 20 | 20 | 20 | 19 | 20 | 20 | 20 |
| | | ON-OFF RATIO | | $10^{10}$ | $10^{11}$ | $10^{9}$ | $10^{9}$ | $10^{9}$ | $10^{9}$ | $10^{9}$ | $10^{9}$ | $10^{9}$ | $10^{9}$ | $10^{9}$ |
| | | UNIFORMITY OF TFT PROPERTIES | | ⊚ | ⊚ | ⊚ | ⊚ | ⊚ | ⊚ | ⊚ | ⊚ | ⊚ | ⊚ | ⊚ |
| | | REPRODUCIBILITY OF TFT PROPERTIES | | ⊚ | ⊚ | ⊚ | ⊚ | ⊚ | ⊚ | ⊚ | ⊚ | ⊚ | ⊚ | ⊚ |
| CRUDE MATERIALS | SPECIFIC SURFACE AREA | $In_2O_3$ | (m²/g) | 15 | 15 | 15 | 15 | 15 | 6 | 11 | 4 | 15 | 15 | 15 |
| | | $Ga_2O_3$ | (m²/g) | 14 | 14 | 14 | 14 | 14 | 6 | 11 | 4 | 15 | 14 | 14 |
| | | ZnO | (m²/g) | 4 | 4 | 4 | 4 | 4 | 3 | 9 | 3 | 15 | 4 | 4 |
| TARGET | COMPOSITION | ELEMENT COMPOSITION RATIO (ATOM %) | In/(In+Ga+Zn+X) | 0.35 | 0.35 | 0.35 | 0.35 | 0.35 | 0.35 | 0.35 | 0.35 | 0.35 | 0.4 | 0.44 |
| | | | Ga/(In+Ga+Zn+X) | 0.2 | 0.2 | 0.2 | 0.2 | 0.2 | 0.2 | 0.2 | 0.2 | 0.2 | 0.25 | 0.16 |
| | | | Zn/(In+Ga+Zn+X) | 0.45 | 0.45 | 0.45 | 0.45 | 0.45 | 0.45 | 0.45 | 0.45 | 0.45 | 0.35 | 0.4 |
| | | ELEMENT HAVING FOUR OR MORE VALENCES | X | Nb | Ta | Mo | W | Ti | — | — | — | — | — | — |
| | | | CONTENT(ppm) | 500 | 500 | 500 | 500 | 500 | — | — | — | — | — | — |
| | PRODUCTION CONDITION | GRANULATION METHOD | | SPRAY DRY | SPRAY DRY | SPRAY DRY | SPRAY DRY | SPRAY DRY | SPRAY DRY | SPRAY DRY | SPRAY DRY | SPRAY DRY | SPRAY DRY | SPRAY DRY |
| | | OXYGEN FLOW RATE | (L/min) | 10 | 10 | 10 | 10 | 10 | 10 | 10 | 10 | 10 | 10 | 10 |
| | | RAISING TEMPERATURE RATE | (°C/min) | 3 | 3 | 3 | 3 | 3 | 3 | 3 | 3 | 3 | 3 | 3 |
| | | SINTERING TEMPERATURE | (°C) | 1500 | 1500 | 1500 | 1500 | 1500 | 1500 | 1500 | 1500 | 1500 | 1500 | 1500 |
| | | SINTERING TIME | (Hr) | 20 | 20 | 20 | 20 | 20 | 20 | 20 | 20 | 20 | 20 | |
| | CRYSTALLINE TYPE (XRD) | RARE-EARTH OXIDE C TYPE | | ⊚ | ⊚ | ⊚ | ⊚ | ⊚ | ⊚ | ⊚ | ⊚ | ⊚ | ⊚ | ⊚ |
| | | LATTICE CONSTANT a | (Å) | | | | | | | | | | | |
| | | $InGaZnO_4$ JCPDS CARD No. 38-1104 | | | | | | | | | | | | |
| | | $In_2Ga_2ZnO_7$ JCPDS CARD No. 38-1097 | | | | | | | | | | | | |
| | | ZnO JCPDS CARD No. 38-1240 | | | | | | | | | | | | |
| | | β-$GaInO_3$ JCPDS CARD No. 21-0334 | | | | | | | | | | | | |
| | | β-$Ga_2O_3$ JCPDS CARD No. 43-1012 | | | | | | | | | | | | |
| | | JCPDS CARD No. 14-0564 | | | | | | | | | | | | |

TABLE 6-continued

| | | Col1 | Col2 | Col3 | Col4 | Col5 | Col6 | Col7 | Col8 | Col9 | Col10 | Col11 | Col12 |
|---|---|---|---|---|---|---|---|---|---|---|---|---|---|
| EVALUATIONS FOR A TARGET | ZnGa$_2$O$_4$ JCPDS CARD No. 38-1240 | | | | | | | | | | | | |
| | (Ga,In)$_2$O$_3$ JCPDS CARD No. 14-0564 | | | | | | | | | | | | |
| | In$_2$O$_3$(ZnO)m | | | | | | | | | | | | |
| | RELATIVE DENSITY (%) | >99 | >99 | >99 | >99 | >99 | 98 | >98 | 98 | 98 | 98 | 98 | 98 |
| | BULK RESISTANCE (mΩcm) | 0.7 | 0.7 | 0.7 | 0.7 | 0.7 | 3 | 3 | 3 | 3 | 3 | 4 | 5 |
| | UNIFORMITY OF BULK RESISTANCE (%) | <5 | <5 | <5 | <5 | <5 | <5 | <5 | <5 | <5 | <5 | <5 | <5 |
| | AVERAGE CRYSTALLINE PARTICLE DIAMETER (μm) | 14 | 14 | 14 | 14 | 14 | 17 | 18 | 16 | 19 | 18 | 18 | 15 |
| | BENDING STRENGTH (kg/mm$^2$) | 14.3 | 14.3 | 14.3 | 14.3 | 14.3 | 12.6 | 12.4 | 12.8 | 11.9 | 12.2 | 12.2 | 12.2 |
| | CRACK FORMING AT SINTERING | ◎ | ◎ | ◎ | ◎ | ◎ | ○ | ○ | ○ | ○ | ○ | ○ | ○ |
| | RF SPUTTERING CONDITION ABNORMAL ELECTRIC DISCHARGE | ◎ | ◎ | ◎ | ◎ | ◎ | ◎ | ◎ | ◎ | ○ | ◎ | ◎ | ◎ |
| | IN-PLANE UNIFORMITY | <10 | <10 | <10 | <10 | <10 | <10 | <10 | <10 | <10 | <10 | <10 | <10 |
| | DC SPUTTERING CONDITION ABNORMAL ELECTRIC DISCHARGE (TIMES/96 HOURS) | ◎ | ◎ | ◎ | ◎ | ◎ | ◎ | ◎ | ◎ | ◎ | ◎ | ◎ | ◎ |
| | NODULE FORMING | ◎ | ◎ | ◎ | ◎ | ◎ | ◎ | ◎ | ◎ | ◎ | ◎ | ◎ | ◎ |
| | CONTINUOUS STABILITY | ◎ | ◎ | ◎ | ◎ | ◎ | ◎ | ◎ | ◎ | ◎ | ◎ | ◎ | ◎ |
| | IN-PLANE UNIFORMITY | ◎ | ◎ | ◎ | ◎ | ◎ | ◎ | ◎ | ◎ | ◎ | ◎ | ◎ | ◎ |
| | CRACK FORMING ON TARGET | ◎ | ◎ | ◎ | ◎ | ◎ | ◎ | ◎ | ◎ | ◎ | ◎ | ◎ | ◎ |
| EVALUATIONS ON TFT PREPARATION | MOBILITY cm$^2$/Vs | 20 | 20 | 20 | 20 | 20 | 20 | 20 | 20 | 20 | 20 | 22 | 23 |
| | ON-OFF RATIO | 10$^9$ | 10$^9$ | 10$^9$ | 10$^9$ | 10$^9$ | 10$^9$ | 10$^9$ | 10$^9$ | 10$^9$ | 10$^9$ | 10$^8$ | 10$^7$ |
| | UNIFORMITY OF TFT PROPERTIES | ◎ | ◎ | ◎ | ◎ | ◎ | ◎ | ◎ | ◎ | ◎ | ◎ | ◎ | ◎ |
| | REPRODUCIBILITY OF TFT PROPERTIES | ◎ | ◎ | ◎ | ◎ | ◎ | ◎ | ◎ | ◎ | ◎ | ◎ | ◎ | ◎ |

TABLE 7

| | | | COMPARATIVE EXAMPLE | | | | | | | | |
|---|---|---|---|---|---|---|---|---|---|---|---|
| | | | 10 | 11 | 12 | 13 | 14 | 15 | 16 | 17 | 18 |
| CRUDE MATERIALS | SPECIFIC SURFACE AREA | In₂O₃ (m²/g) | 15 | 15 | 15 | 15 | 15 | 15 | 15 | 15 | 15 |
| | | Ga₂O₃ (m²/g) | 14 | 14 | 1 | 14 | 14 | 14 | 14 | 14 | 14 |
| | | ZnO (m²/g) | 4 | 4 | 9 | 4 | 4 | 4 | | | |
| TARGET | COMPOSITION | ELEMENT COMPOSITION RATIO (ATOM %) In/(In + Ga + Zn + X) | 0.35 | 0.33 | 0.33 | 0.33 | 0.4 | 0.03 | 0.5 | 0.34 | 0.34 |
| | | Ga/(In + Ga + Zn + X) | 0.2 | 0.33 | 0.33 | 0.33 | 0.4 | 0.01 | 0.5 | 0.66 | 0.66 |
| | | Zn/(In + Ga + Zn + X) | 0.45 | 0.34 | 0.34 | 0.34 | 0.2 | 0.96 | | | |
| | | X | — | — | — | — | — | — | — | — | — |
| | | ELEMENT HAVING FOUR OR MORE VALENCES CONTENT (ppm) | | | | | | | | | |
| | PRODUCTION CONDITION | GRANULATION METHOD | SPRAY DRY | SPRAY DRY | SPRAY DRY | DRY NATURALLY | SPRAY DRY | SPRAY DRY | SPRAY DRY | SPRAY DRY | SPRAY DRY |
| | | OXYGEN FLOW RATE (L/min) | 10 | 10 | 10 | 10 | 10 | 10 | 10 | 10 | 10 |
| | | RAISING TEMPERATURE RATE (° C./min) | 3 | 3 | 3 | 3 | 3 | 3 | 3 | 3 | 3 |
| | | SINTERING TEMPERATURE (° C.) | 1400 | 1400 | 1400 | 1400 | 1400 | 1300 | 1400 | 1400 | 1500 |
| | | SINTERING TIME (Hr) | 5 | 5 | 5 | 5 | 5 | 5 | 10 | 10 | 5 |
| | CRYSTALLINE TYPE (XRD) | RARE-EARTH OXIDE C JCPDS CARD No. 14-0564 LATTICE CONSTANT a(Å) | | | | | | | | | |
| | | InGaZnO₄ JCPDS CARD No. 38-1104 | ◎ | ◎ | ◎ | ◎ | | | | | |
| | | In₂Ga₂ZnO₇ JCPDS CARD No. 38-1097 | | | | | ◎ | | | | |
| | | ZnO JCPDS CARD No. 38-1240 | | | | | | ◎ | | | |
| | | β-GaInO₃ JCPDS CARD No. 21-0334 | | ◎ | ◎ | ◎ | | | ◎ | ◎ | |
| | | β-Ga₂O₃ JCPDS CARD No. 43-1012 | | | | | | | | | |
| | | ZnGa₂O₄ JCPDS CARD No. 38-1240 | | | | | | | | | |
| | | (Ga,In)₂O₃ | | ○ | ○ | ○ | ○ | | | | |
| | | In₂O₃(ZnO)m JCPDS CARD No. 14-0564 | | | | | | | | | ◎ |
| EVALUATIONS FOR A TARGET | | RELATIVE DENSITY (%) | 97 | 97 | 94 | 97 | 97 | 92 | 93 | 93 | 93 |
| | | BULK RESISTANCE (mΩcm) | 11 | 13 | 70 | 180 | 12 | >5000 | >5000 | >5000 | >5000 |
| | | UNIFORMITY OF BULK RESISTANCE (%) | 7 | 7 | 11 | 12 | 8 | 16 | 14 | 15 | 17 |
| | | AVERAGE CRYSTALLINE PARTICLE DIAMETER (μm) | 8 | 8 | 8 | 8 | 8 | 7 | 11 | 12 | 7 |
| | | BENDING STRENGTH (kg/mm²) | 7.2 | 8.2 | 7.3 | 7.3 | 7.9 | 3.6 | 4.8 | 4.2 | 6.9 |
| | | CRACK FORMING AT SINTERING | Δ | Δ | X | X | Δ | X | X | X | X |
| | | RF SPUTTERING CONDITION ABNORMAL ELECTRIC DISCHARGE | ○ | ○ | Δ | Δ | ○ | X | Δ | Δ | Δ |
| | | IN-PLANE UNIFORMITY | ○ | ○ | Δ | Δ | ○ | X | X | Δ | Δ |
| | | DC SPUTTERING CONDITION ABNORMAL ELECTRIC DISCHARGE (TIMES/96 HOURS) | 35 | 80 | 95 | 105 | 120 | 1200 | 100 | 50 | 50 |

TABLE 7-continued

| | | | | | | | | | COMPARATIVE EXAMPLE | | | | |
|---|---|---|---|---|---|---|---|---|---|---|---|---|---|
| | | | | | | | | | 19 | 20 | 21 | 22 | 23 |
| EVALUATIONS ON TFT PREPARATION | NODULE FORMING | | ○ | ○ | ○ | ○ | ○ | | ⊚ | ○ | ○ | ○ | ○ |
| | CONTINUOUS STABILITY | | ○ | ○ | ○ | △ | △ | | X | X | X | △ | △ |
| | IN-PLANE UNIFORMITY | | ○ | ○ | ○ | △ | △ | | X | X | X | X | X |
| | CRACK FORMING ON TARGET | | ○ | ○ | ○ | ○ | ○ | | X | X | X | X | X |
| | MOBILITY cm²/Vs | | 20 | 8 | 7 | 7 | 7 | | 0.2 | 0.1 | — | — | — |
| | ON-OFF RATIO | | $10^9$ | $10^9$ | $10^8$ | $10^8$ | $10^9$ | | $10^4$ | $10^4$ | — | — | — |
| | UNIFORMITY OF TFT PROPERTIES | | ○ | ○ | △ | △ | ○ | | X | X | — | — | — |
| | REPRODUCIBILITY OF TFT PROPERTIES | | ○ | ○ | △ | △ | ○ | | X | X | — | — | — |
| CRUDE MATERIALS | SPECIFIC SURFACE AREA | $In_2O_3$ (m²/g) | | | | | | | 15 | 15 | 15 | 15 | 15 |
| | | $Ga_2O_3$ (m²/g) | | | | | | | 14 | 14 | 14 | 4 | 1 |
| | | ZnO (m²/g) | | | | | | | 4 | 4 | 4 | 4 | — |
| TARGET | COMPOSITION | ELEMENT COMPOSITION RATIO (ATOM %) | In/(In+Ga+Zn+X) | | | | | | 0.01 | 0.05 | 0.82 | — | — |
| | | | Ga/(In+Ga+Zn+X) | | | | | | 0.98 | 0.65 | 0.03 | 0.4 | 0.4 |
| | | | Zn/(In+Ga+Zn+X) | | | | | | 0.01 | 0.3 | 0.15 | 0.6 | 0.6 |
| | | ELEMENT HAVING FOUR OR MORE VALENCES | X | | | | | | | — | — | — | — | — |
| | | | CONTENT (ppm) | | | | | | | — | — | — | — | — |
| | PRODUCTION CONDITION | GRANULATION METHOD | | | | | | | | SPRAY DRY | SPRAY DRY | SPRAY DRY | SPRAY DRY | SPRAY DRY |
| | | OXYGEN FLOW RATE (L/min) | | | | | | | | 10 | 10 | 10 | 10 | 10 |
| | | RAISING TEMPERATURE RATE (°C/min) | | | | | | | | 3 | 3 | 3 | 3 | 3 |
| | | SINTERING TEMPERATURE (°C) | | | | | | | | 1500 | 1500 | 1500 | 1300 | 1500 |
| | | SINTERING TIME (Hr) | | | | | | | | 5 | 5 | 5 | 5 | 5 |
| | CRYSTALLINE TYPE (XRD) | RARE-EARTH OXIDE C | JCPDS CARD No. 14-0564 | | | | | | | | | | | |
| | | TYPE | LATTICE CONSTANT a(Å) | | | | | | | | | | | 10.12 |
| | | $InGaZnO_4$ | JCPDS CARD No. 38-1104 | | | | | | | | | | | |
| | | $In_2Ga_2ZnO_7$ | JCPDS CARD No. 38-1097 | | | | | | | | | | | |
| | | ZnO | JCPDS CARD No. 38-1240 | | | | | | | | | | | |
| | | $\beta$-$GaInO_3$ | JCPDS CARD No. 21-0334 | | | | | | | ⊚ | | | | |
| | | $\beta$-$Ga_2O_3$ | JCPDS CARD No. 43-1012 | | | | | | | | ⊚ | | | |
| | | $ZnGa_2O_4$ | JCPDS CARD No. 38-1240 | | | | | | | | | ⊚ | ⊚ | ⊚ |
| | | $(Ga,In)_2O_3$ | JCPDS CARD No. 14-0564 | | | | | | | | | | | |
| | | $In_2O_3(ZnO)_m$ | — | | | | | | | | | | | |
| EVALUATIONS FOR A TARGET | RELATIVE DENSITY (%) | | | | | | | | | 91 | 93 | 97 | 98 | 97 |
| | BULK RESISTANCE (mΩcm) | | | | | | | | | >5000 | >5000 | 7 | 4 | 70 |
| | UNIFORMITY OF BULK RESISTANCE (%) | | | | | | | | | 9 | 15 | <5 | <5 | <5 |

TABLE 7-continued

|  |  | 6 | 7 | 6 | 5 | 6 |
|---|---|---|---|---|---|---|
| AVERAGE CRYSTALLINE PARTICLE DIAMETER (μm) |  | 3.8 | 4.2 | 8.8 | 8.4 | 3.3 |
| BENDING STRENGTH (kg/mm²) |  | X | X | ○ | ○ | △ |
| CRACK FORMING AT SINTERING |  | △ | △ | ○ | ○ | X |
| RF SPUTTERING CONDITION | ABNORMAL ELECTRIC DISCHARGE | △ | △ | ○ | ○ | X |
|  | IN-PLANE UNIFORMITY | — | 40 | <10 | <10 | 1400 |
| DC SPUTTERING CONDITION | ABNORMAL ELECTRIC DISCHARGE (TIMES/96 HOURS) | — | ○ | ⊚ | ⊚ | X |
|  | NODULE FORMING | — | △ | X | ○ | X |
|  | CONTINUOUS STABILITY | — | △ | ⊚ | ○ | X |
|  | IN-PLANE UNIFORMITY | — | X | 23 | 23 | — |
|  | CRACK FORMING ON TARGET | — | — | 10⁴ | 10⁹ | — |
| EVALUATIONS ON TFT | MOBILITY cm²/Vs | — | — | X | ○ | — |
|  | ON-OFF RATIO | — | — | — | — | — |
|  | UNIFORMITY OF TFT PROPERTIES | — | — | X | ○ | — |
| PREPARATION | REPRODUCIBILITY OF TFT PROPERTIES | — | — | — | — | — |

<Preparation of Sputtering Target>

A sputtering target was caved out from the sintered bodies of Examples 13 to 35 and Comparative examples 10 to 23. A side of these sintered bodies of Examples 13 to 35 and Comparative examples 10 to 23 was cut by a diamond cutter, and then the surface thereof was ground by a flat-surface grinding machine to make a target material having surface roughness Ra of 5 µm or less. Then, the surface was air-blew and cleaned using ultrasonic cleaning for 3 minutes by multi-oscillating 12 kinds of frequency in every 25 KHz within frequency from 25 to 300 KHz. This target material was then bonded on a backing plate made by oxygen free copper by using an indium solder so as to prepare a target. Surface roughness of the target is Ra 0.5 µm, and the target has a ground surface with no directional character.

<Sputtering Test>

Thus prepared sputtering targets of Examples 13 to 35 and Comparative examples 10 to 23 were used to conduct an RF magnetron sputtering and DC magnetron sputtering so as to evaluate sputtering conditions. Specifically, RF magnetron sputtering was conducted by loading RF magnetron sputtering film-forming device (Shinko seiki co., ltd.), and then an oxide semi-conductor film was formed on a glass substrate (Corning 1737).

Sputtering conditions were set to substrate temperature; 25° C., ultimate pressure; $5\times10^{-4}$ Pa, atmospheric gas; Ar 98% and Oxygen 2%, sputter pressure (total pressure); $1\times10^{-1}$ Pa, supplied electric power 100 W, S-T distance 100 mm.

DC magnetron sputtering was conducted by loading DC magnetron sputtering film-forming device (Shinko seiki co., ltd.), and then an oxide semi-conductor film was formed on a glass substrate (Corning 1737).

Sputtering conditions were set to substrate temperature; 25° C., ultimate pressure; $5\times10^{-1}$ Pa, atmospheric gas; Ar 98% and Oxygen 2%, sputter pressure (total pressure); $1\times10^{-1}$ Pa, supplied electric power 100 W, S-T distance 100 mm.

The obtained results were shown in Table 6.

[Evaluation]

Evaluations were conducted by the following methods.

RF Sputtering

Abnormal discharge: Frequency of occurring abnormal discharge per 3 hours was measured. Evaluation was conduct based on up to 5 times: ⊚, up to 10 times: ○, up to 20 times: Δ, and up to 30 times: X.

In-plane uniformity: ratio between maximum value and minimum value of specific resistance in the same plane (maximum value/minimum value) was determined. Evaluation was conduct based on 4 levels, from those having excellent uniformity in the specific resistance, up to 1.05: ⊚, up to 1.10: ○, up to 1.20: Δ, and more than 1.20: X.

DC Sputtering

Abnormal discharge: Frequency of occurring abnormal discharge per 3 hours was measured. Evaluation was conduct based on up to 5 times: ⊚, up to 10 times: ○, up to 20 times: Δ, and up to 30 times: X.

Nodule forming was evaluated based on ⊚: very few, ○: slightly presence, Δ: presence, X: many, and —: incapable of film forming.

Stability in Continuous Film Forming

Among 20 batches, ratio of average field effect mobility between 1st batch and 20th batch (1st batch/20th batch) was determined. Evaluation was conduct based on 4 levels, from those having excellent reproducibility in TFT properties, up to 1.10: ⊚, up to 1.20: ○, up to 1.50: Δ, and more than 1.50: X.

In-Plane Uniformity

Ratio between maximum value and minimum value of specific resistance in the same plane (maximum value/minimum value) was determined. Evaluation was conduct based on 4 levels, from those having excellent uniformity in the specific resistance, up to 1.05: ⊚, up to 1.10: ○, up to 1.20: Δ, and more than 1.20: X.

Crack Forming

Cracking Formed on a Sputtering Target (Crack Forming in a Target):

The presence or absence of the crack forming was confirmed by the naked eye immediately after film forming.

<Preparation of Thin Film Transistor>

By using thus obtained sputtering targets of Examples 13 to 35 and

Comparative examples 10 to 23 for film-forming an active layer in an invert staggered type thin film transistor (hereinafter might be abbreviated as "thin film transistor"), an invert staggered TFT shown in FIGS. 21 and 22 was obtained. Specifically, a glass substrate made of alkali-free glass (Corning Inc., Corning1737) was prepared as a substrate. On this substrate, Ti having thickness of 5 nm, Au having thickness of 50 nm, and Ti having thickness of 5 nm were laminated in this order by an electron beam vapor deposition method. A gate electrode was formed from the laminated film by a photo-lithography method and a lift-off method. A $SiO_2$ film having thickness of 200 nm was formed on the upper surface of the obtained gate electrode by a TEOS-CVD method so as to form a gate insulation film.

In addition, by an RF sputtering method using the above-mentioned sintered bodies as a target, an amorphous oxide thin film (an In—Ga—Zn—O oxide semi-conductor) having thickness of 30 nm was deposited as a semi-conductor. In this connection, power supplied from RF power source was 200 W. During film forming, total pressure was set at 0.4 Pa, gas flow ratio of $Ar:O_2=95:5$. Substrate temperature was 25° C.

By using the deposited amorphous oxide thin film, and using a photo-lithography method and an etching method, Ti having thickness of 5 nm, Au having thickness of 50 nm, and Ti having thickness of 5 nm were laminated in this order on each element. A source electrode and a drain electrode were formed by a photo-lithography method and a lift-off method so as to prepare elements having W=100 µm and L=20 µm. Thus obtained elements were heat-treated under ambient pressure at 300° C. for 60 minutes to obtain a thin film transistor. A $SiO_2$ film having thickness of 200 nm was further deposited on the elements by a sputter method as a protecting film.

[Evaluation]

Evaluations were conducted by the following methods.

Mobility, ON-OFF Ratio

Mobility and ON-OFF ratio were determined by using a semi-conductor parameters analyzer (Keithley 4200) under dry nitrogen, ambient temperature (25° C.), and shading.

Uniformity in TFT Properties

Ratio between maximum value and minimum value (maximum value/minimum value) of On-current at Vg of the obtained thin film transistor (gate voltage)=6V was determined. Evaluation was conduct based on 4 levels, from those having excellent uniformity in TFT properties, up to 1.05: ⊚, up to 1.10: ○, up to 1.20: Δ, and more than 1.20: X.

Reproducibility in TFT Properties

Among 20 batches, ratio of average field effect mobility between 1st batch and 20th batch (1st batch/20th batch) was determined. Evaluation was conduct based on 4 levels, from those having excellent reproducibility in TFT properties, up to 1.10: ⊚, up to 1.20: ○, up to 1.50: Δ, and more than 1.50 X.

Other Embodiments of the Present Invention

The present invention may be the following (a) to (c) embodiments.

(a) Another embodiment of the present invention is follows.

[1] A sputtering target composed of an oxide sintered body comprising indium oxide having Bixbyite structure, and a $Yb_2Fe_3O_7$ structure compound represented by the formula $In_2Ga_2ZnO_7$.

[2] The sputtering target of [2], in which a composition amount of indium (In), gallium (Ga) and zinc (Zn) by ratio is in a composition range of the following formula.

$$0.5<In/(In+Ga)<0.98, 0.6<Ga/(Ga+Zn)<0.99$$

[3] The sputtering target of [1] or [2], in which relative density is 80% or more.

[4] The sputtering target of any one of [1] to [3], in which bulk resistance is $1\times10^{-2}$ mΩcm or less.

[5] The sputtering target of any one of [1] to [4], in which a part of In in said indium oxide and $In_2Ga_2ZnO_7$ is subjected to solid solution substitution by a metal element (X) having positive four or more valences.

[6] The sputtering target of [5], in which said metal element (X) having positive four or more valences is subjected to solid solution substitution at a ratio of (the metal element (X) having positive four or more valences)/(all the metal elements in the oxide sintered body)=100 ppm to 10000 ppm.

[7] The sputtering target of [5] or [6], in which said metal element (X) having positive four or more valences is one or more elements selected from the group consisting of tin, zirconium, germanium, cerium, niobium, tantalum, molybdenum, tungsten, and titanium.

[8] A method for preparing the sputtering target of any one of [1] to [7] comprising the following steps;
(a) mixing a crude oxide powder;
(b) forming the obtained mixture; and
(c) sintering the obtained formed body at 1200° C. or more and less than 1600° C.

[9] A method for forming an amorphous oxide thin film having electric carrier concentration of less than $1\times10^{18}/cm^3$, in which said method comprises a step of conducting sputtering using the sputtering target of any one of [1] to [7] at a film forming temperature from 25 to 450° C.

[10] The method of [9] wherein the amorphous oxide thin film is a thin film used for a channel layer of a thin film transistor.

[11] A method for producing a thin film transistor containing an amorphous oxide thin film and an oxide insulation layer, comprising the steps of
(i) heat-treating the amorphous oxide thin film formed by the method of [9] within oxidation atmosphere; and
(ii) forming the oxide insulation layer on the heat treated amorphous oxide thin film.

[12] A semi-conductor device having the thin film transistor prepared by the method for producing a thin film transistor of [11].

(b) Another embodiment of the present invention is follows.

[1] A sputtering target composed of an oxide sintered body comprising indium oxide having a bixbyite structure, and one or more homologous structure compounds represented by $InGaO_3(ZnO)_m$ (m is a natural number of 1 to 4).

[2] The sputtering target of [1], wherein a composition amount of indium (In), gallium (Ga) and zinc (Zn) by atom ratio is in a composition range of the following formula.

$$0.5<In/(In+Ga)<0.99, 0.2<Zn/(In+Ga+Zn)<0.7$$

[3] The sputtering target of [1] or [2], in which a part of In in said indium oxide and one or more homologous structure compounds is subjected to solid solution substitution by a metal element having positive four or more valences.

[4] The sputtering target of [3], in which said metal element having positive four or more valences is subjected to solid solution substitution at a ratio of (the metal element having positive four or more valences)/(all the metal elements in the oxide sintered body)=100 ppm to 10000 ppm.

[5] The sputtering target of [3] or [4], in which said metal element having positive four or more valences is one or more elements selected from the group consisting of tin, zirconium, germanium, cerium, niobium, tantalum, molybdenum, tungsten, and titanium.

[6] The sputtering target of any one of [1] to [5], in which bulk specific resistance of said oxide sintered body is $1\times10^{-2}$ mΩcm or less.

[7] The sputtering target of any one of [1] to [6], in which relative density of said oxide sintered body is 80% or more.

[8] A method for preparing the sputtering target of any one of [1] to [7] comprising the following steps;
(a) mixing a crude oxide powder;
(b) forming the obtained mixture; and
(c) sintering the obtained formed body at 1200° C. or more and less than 1400° C.

[9] A method for forming an amorphous oxide thin film having electric carrier concentration of less than $1\times10^{18}/cm^3$, in which said method comprises a step of conducting sputtering using the sputtering target of any one of [1] to [7] at a film forming temperature from 25 to 450° C.

[10] The method of [9] wherein the amorphous oxide thin film is a thin film used for a channel layer of a thin film transistor.

[11] A method for producing a thin film transistor containing an amorphous oxide thin film and an oxide insulation layer, comprising the steps of
(i) heat-treating the amorphous oxide thin film formed by the method of [9] within oxidation atmosphere; and
(ii) forming the oxide insulation layer on the heat treated amorphous oxide thin film.

[12] A semi-conductor device having the thin film transistor prepared by the method for producing a thin film transistor of [11].

(c) Another embodiment of the present invention is follows.

[1] An oxide comprising In (indium) in an amount of 24 to 49 atom % based on the atomicity of all the atoms other than oxide as 100 atom %, and having a crystalline structure of rare-earth oxide C type.

[2] The oxide of [1] comprising In (indium) in an amount of 24 to 49 atom %, Ga (gallium) in an amount of 10 to 49 atom %, and Zn (zinc) in an amount of 5 to 65 atom % based on the atomicity of all the atoms included in oxides at issue other than oxide as 100 atom %, and having a crystalline structure of rare-earth oxide C type.

[3] The oxide of [1] or [2] in which lattice constant a is a<10.12 Å.

[4] A oxide sintered body composed of the oxide of any one of [1] to [3].

[5] A oxide sintered body having a crystalline structure of rare-earth oxide C type wherein an average crystalline particle diameter is 20 μm or less.

[6] A target composed of the oxide sintered body of [4] or [5].

[7] The target of [6], comprising a metal element having positive four or more valences in an amount of 10 to 10000 ppm based on the atomicity of all the atoms other than oxide as 100 atom %.

[8] The sputtering target of [6] or [7], in which relative density is 90% or more, and bulk resistance is in a range of 0.1 to 100 mΩ·cm.

[9] A method for preparing the sputtering target of any one of [6] to [8] comprising the following steps;
(a) preparing a mixture comprising a powder of an indium compound, a powder of a zinc compound, and a powder of a gallium compound;
(b) forming a formed body by press forming the mixture; and
(c) sintering the formed body.
[10] An oxide thin film formed by a sputtering method using the sputtering target of any one of [6] to [8].
[11] A thin film transistor using the oxide thin film of [10].

Figure 1:
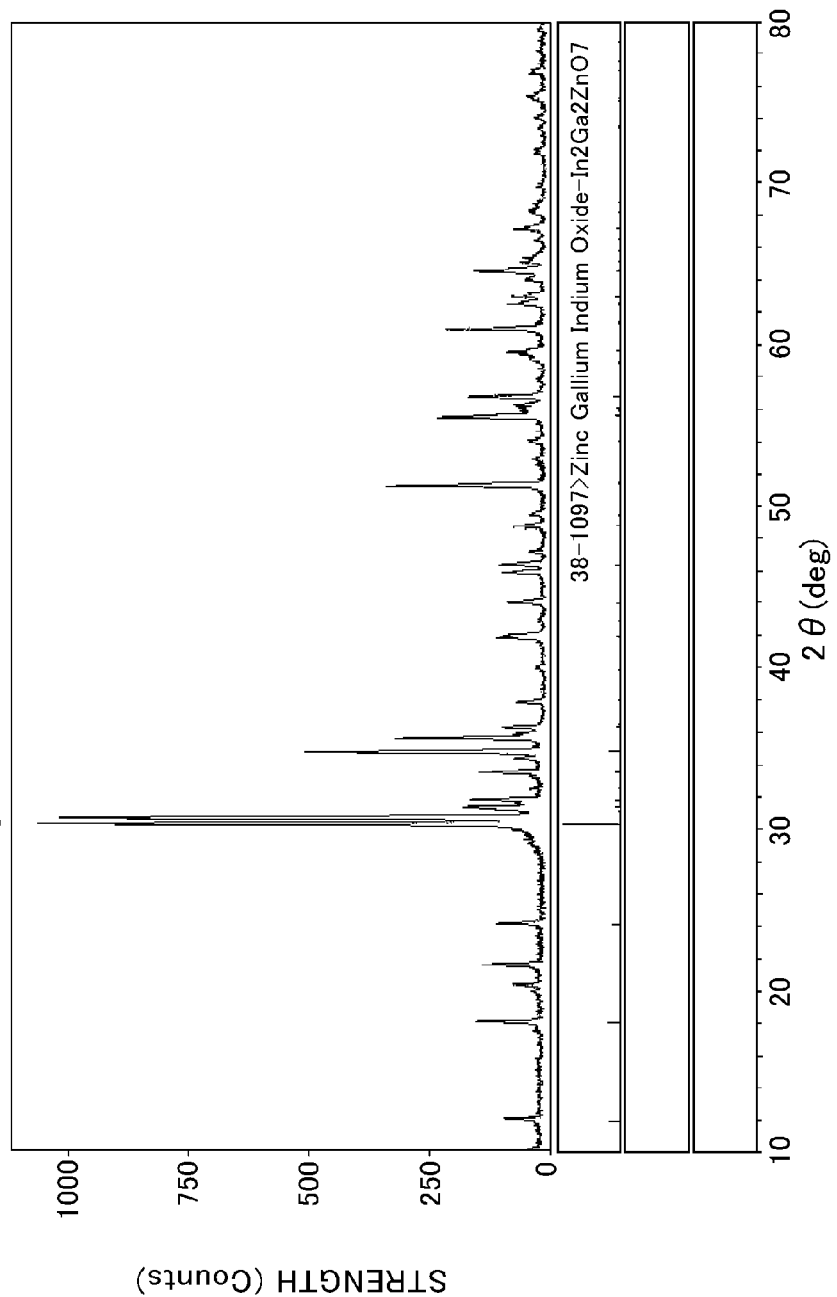
FIG. 1 A chart of X-ray diffraction with respect to the oxide of Example 1 (IZO+Ga, Sample (1) 1400° C. (Example 1))
FIG. 2 A chart of X-ray diffraction with respect to the oxide of Example 2 (IZO+Ga, Sample (4) 1500° C. (Example 2))
FIG. 3 A chart of X-ray diffraction with respect to the oxide of Example 3 (IZO+Ga, Sample (5) 1500° C. (Example 3))
FIG. 4 A chart of X-ray diffraction with respect to the oxide of Comparative example 1 (IZO+Ga(6), 40 at % 1400° C. (Comparative example 1))
FIG. 5 A chart of X-ray diffraction with respect to the oxide of Comparative example 2 (IZO+Ga(6), 40 at % 1200° C. (Comparative Example 2))
FIG. 6 A schematic view of a thin film transistor
FIG. 7 FIG. 7(1) shows a schematic view of a thin film transistor (a source electrode).
Figure 2:
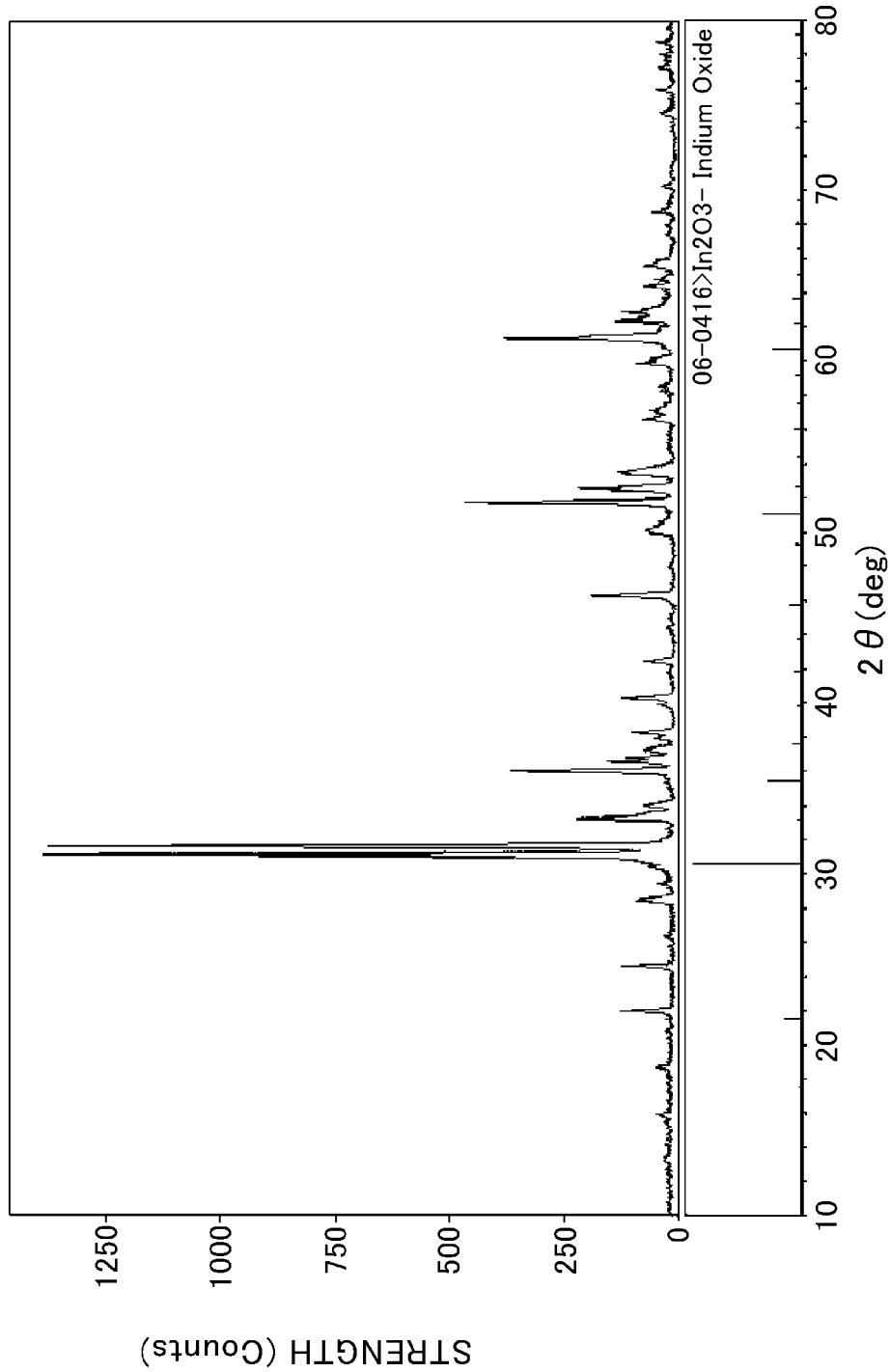
Figure 3:
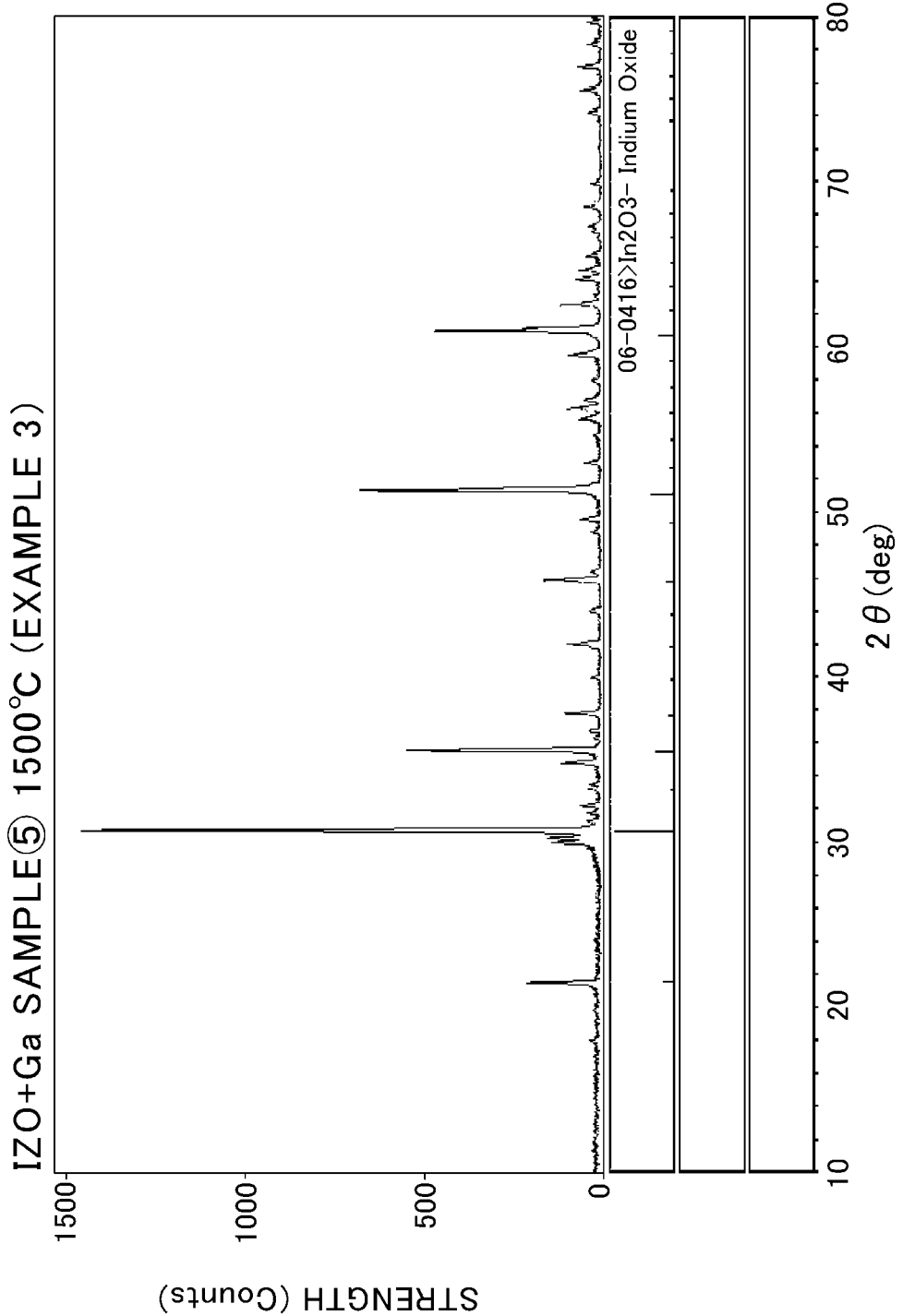
Figure 4:
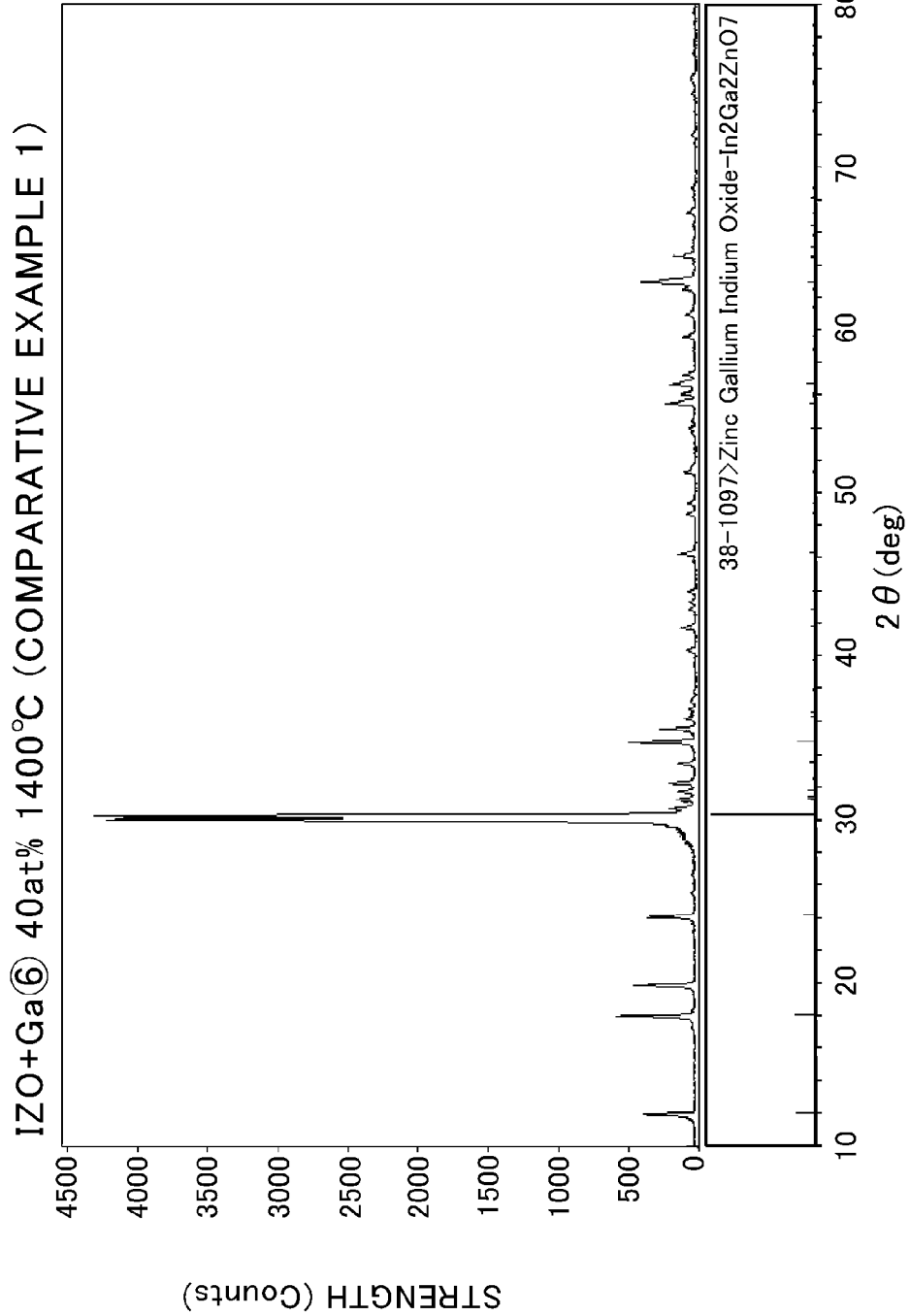
Figure 5:
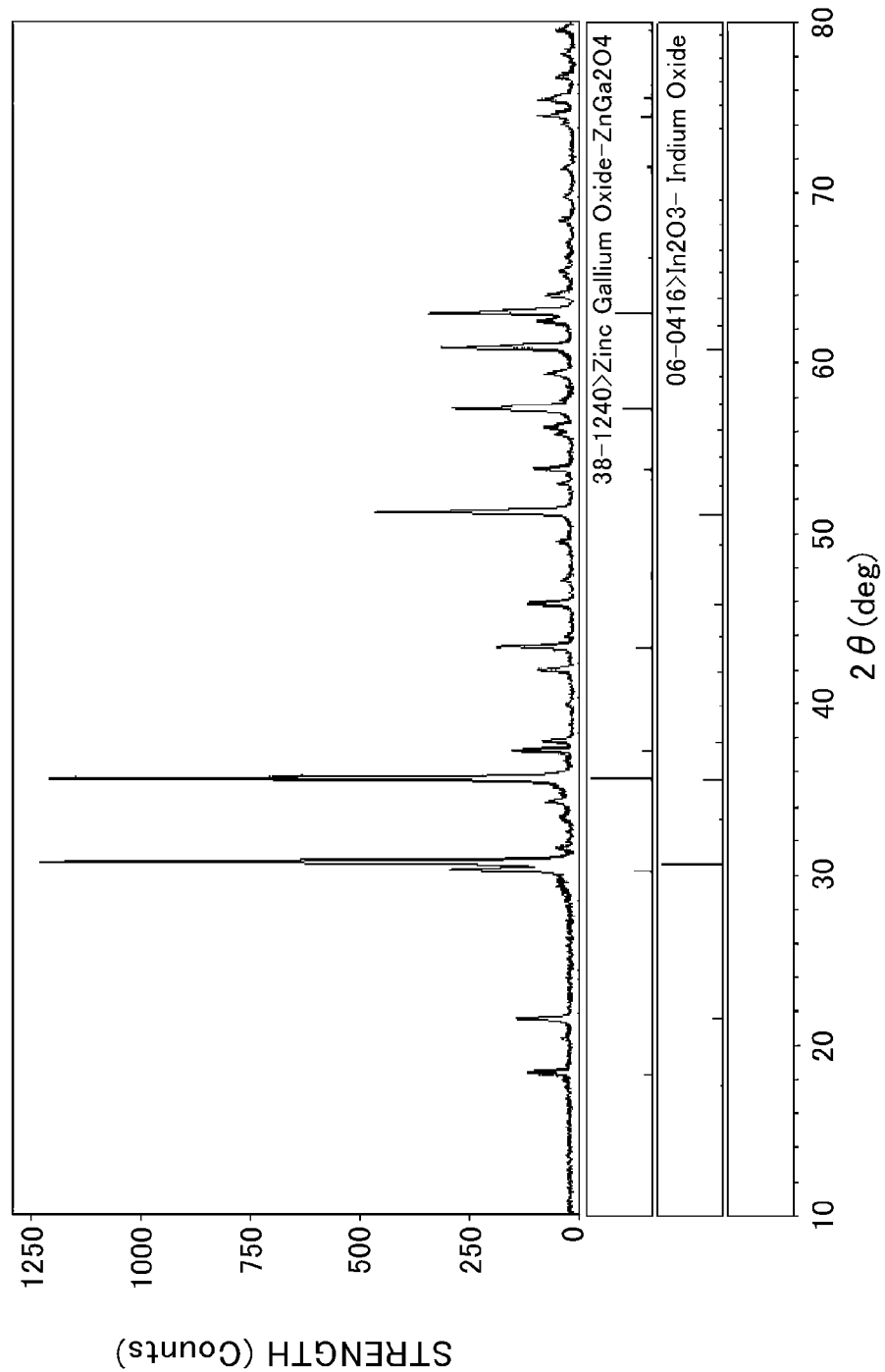
Figure 6:
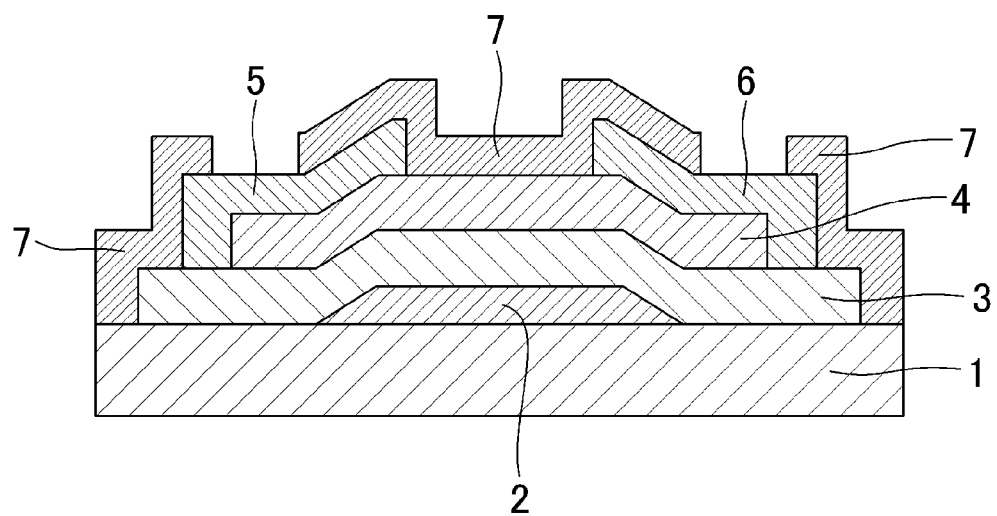
Figure 7:
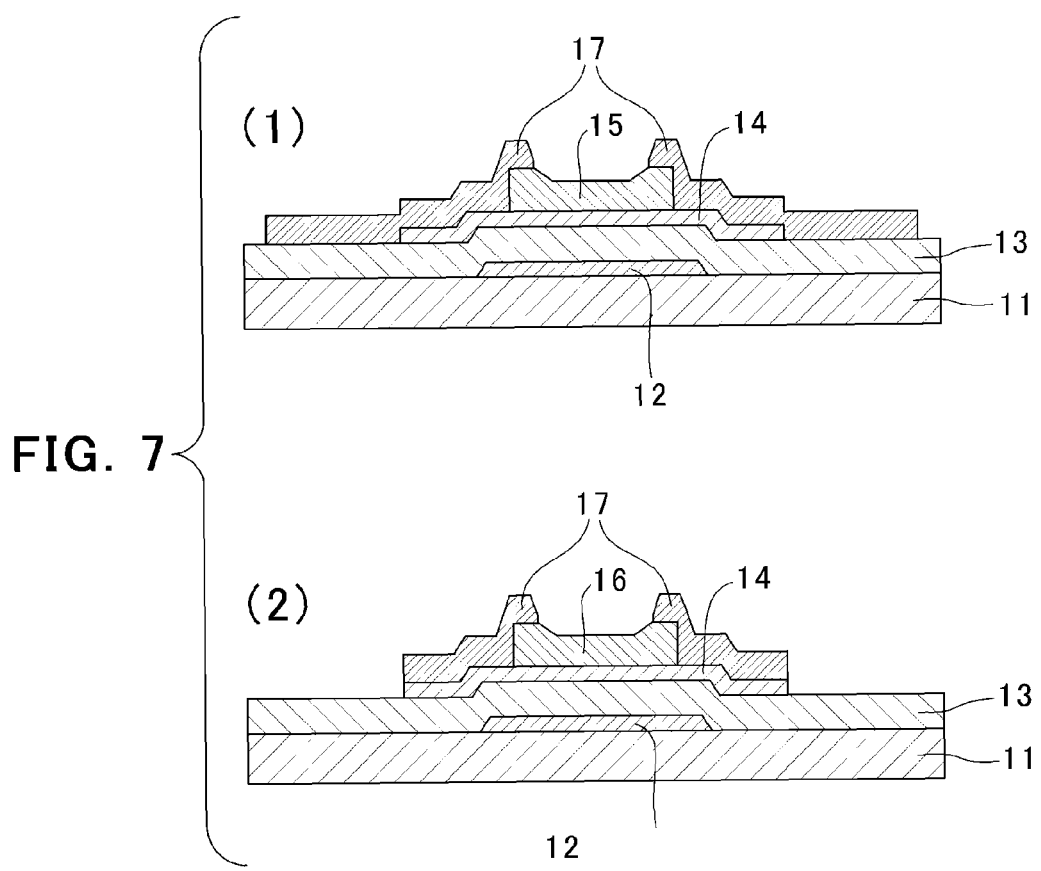
FIG. 7(2) shows a schematic view of a thin film transistor (a drain electrode)
FIG. 8 A chart of X-ray diffraction with respect to the oxide of Example 4 (Ga, 10 at % 1400° C. 20 h Example 4)
FIG. 9 A chart of X-ray diffraction with respect to the oxide of Example 5 (Ga, 13 at % 1400° C. Example 5)
FIG. 10 A chart of X-ray diffraction with respect to the oxide of Example 6 (Ga, 13 at % 1400° C. 20 h Example 6)
FIG. 11 A chart of X-ray diffraction with respect to the oxide of Example 7 (Ga, 20 at % 1400° C. 20 h Example 7)
FIG. 12 A chart of X-ray diffraction with respect to the oxide of Example 8
FIG. 13 A chart of X-ray diffraction with respect to the oxide of Example 9
FIG. 14 A electron microscope photograph indicating a crystalline structure of $In_2O_3$—ZnO—$Ga_2O_3$ sintered body by X-ray microanalyzer
FIG. 15 A chart of X-ray diffraction with respect to the oxide of Example A
FIG. 16 A chart of X-ray diffraction with respect to the oxide of Example B
FIG. 17 A chart of X-ray diffraction with respect to the oxide of Example C
FIG. 18 A chart of X-ray diffraction with respect to the oxide of Example D
FIG. 19 A chart of X-ray diffraction with respect to the oxide of Comparative Example A
FIG. 20 A chart of X-ray diffraction with respect to the oxide of Comparative Example B
FIG. 21 A schematic view of a thin film transistor
FIG. 22 A schematic view of a thin film transistor
Figure 8:
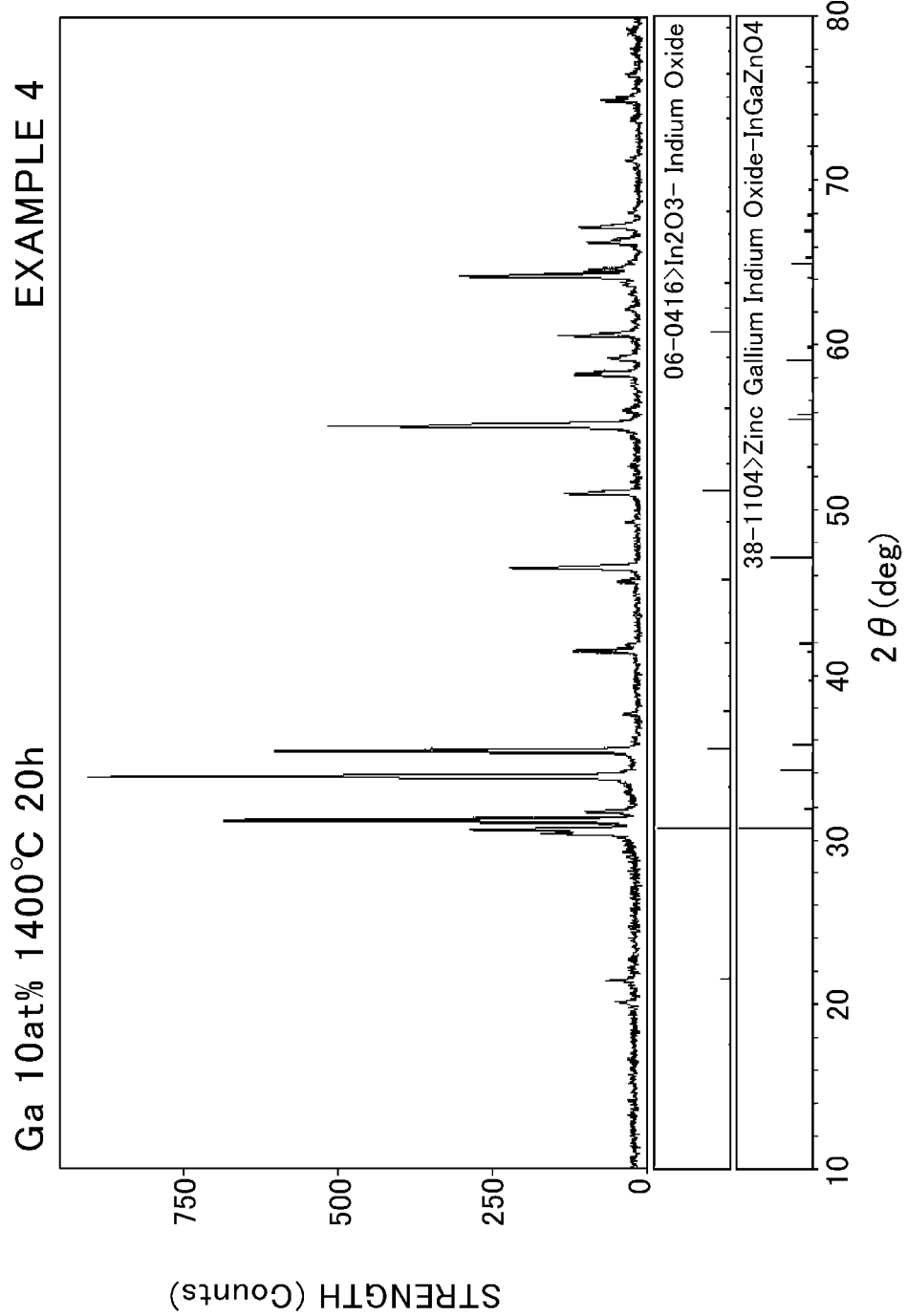
Figure 9:
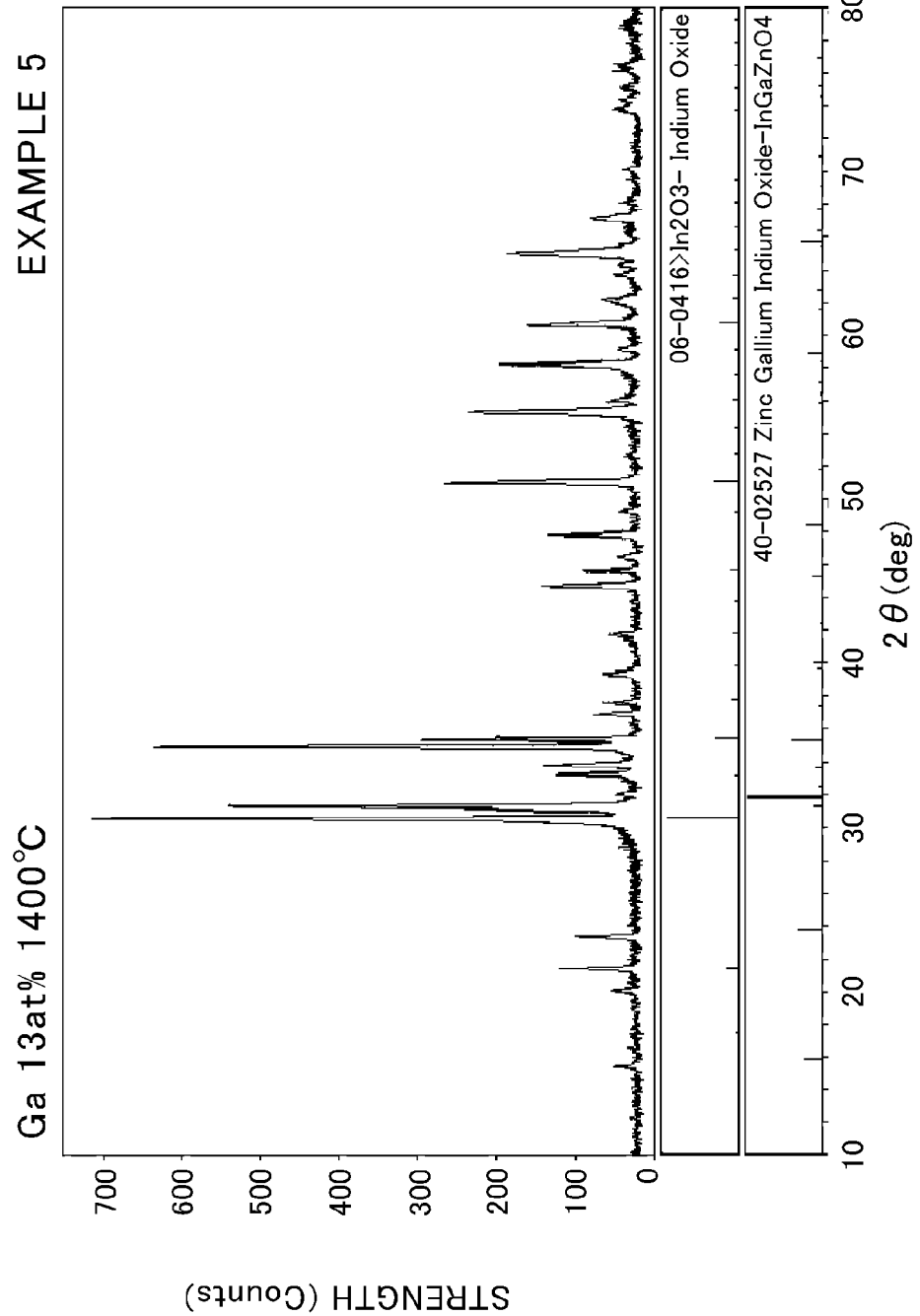
Figure 10:
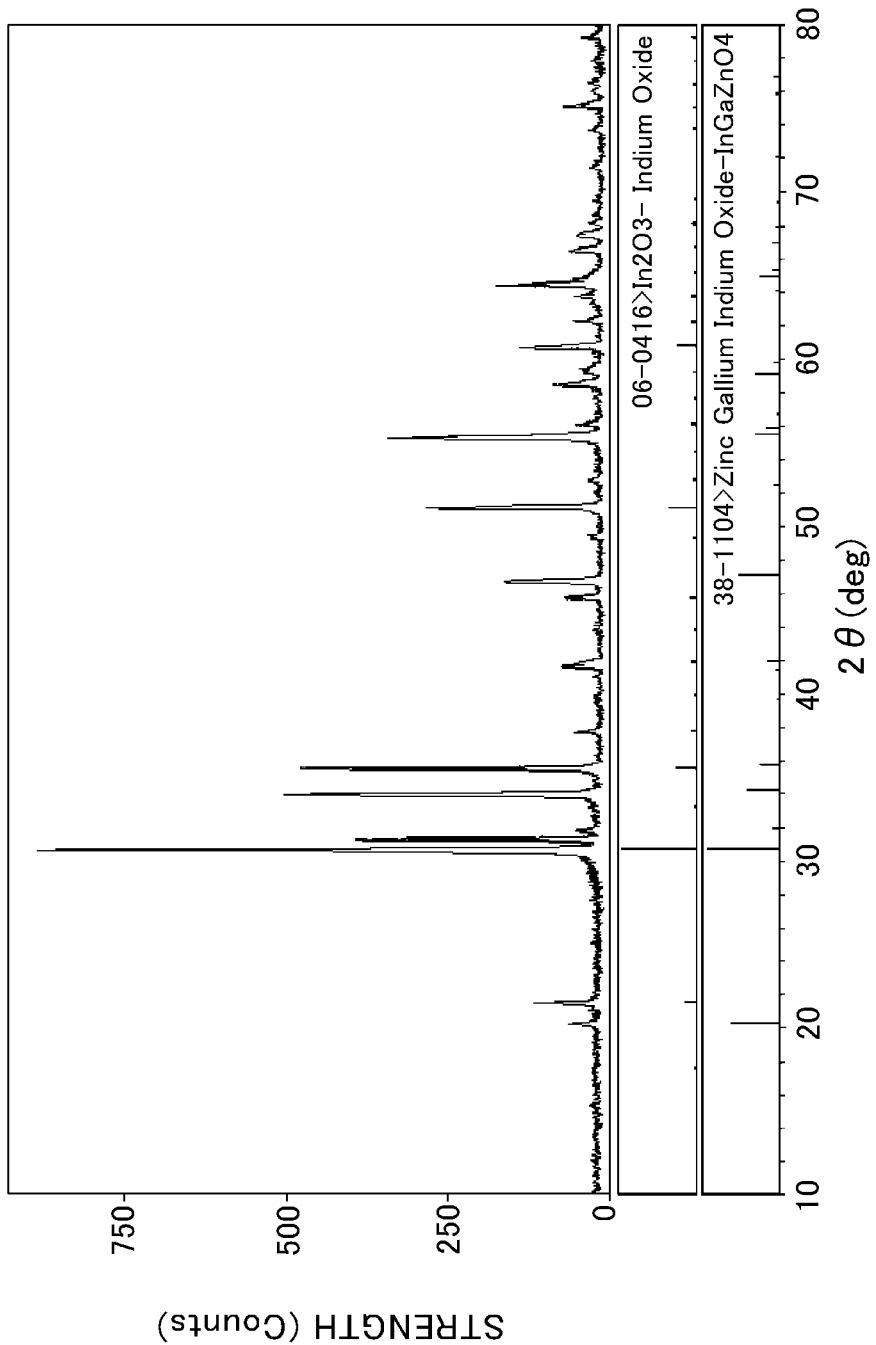
Figure 11:
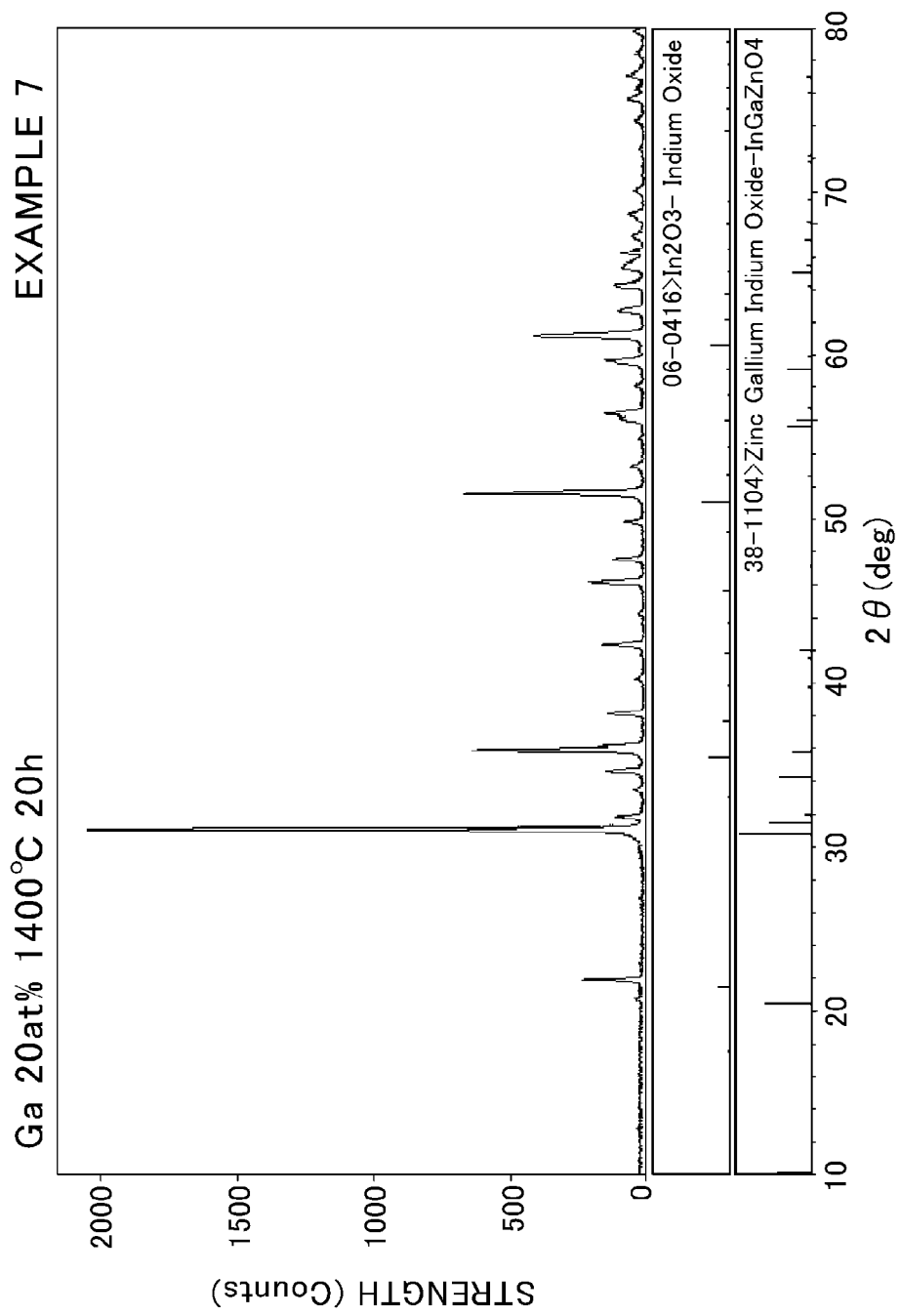
Figure 12:
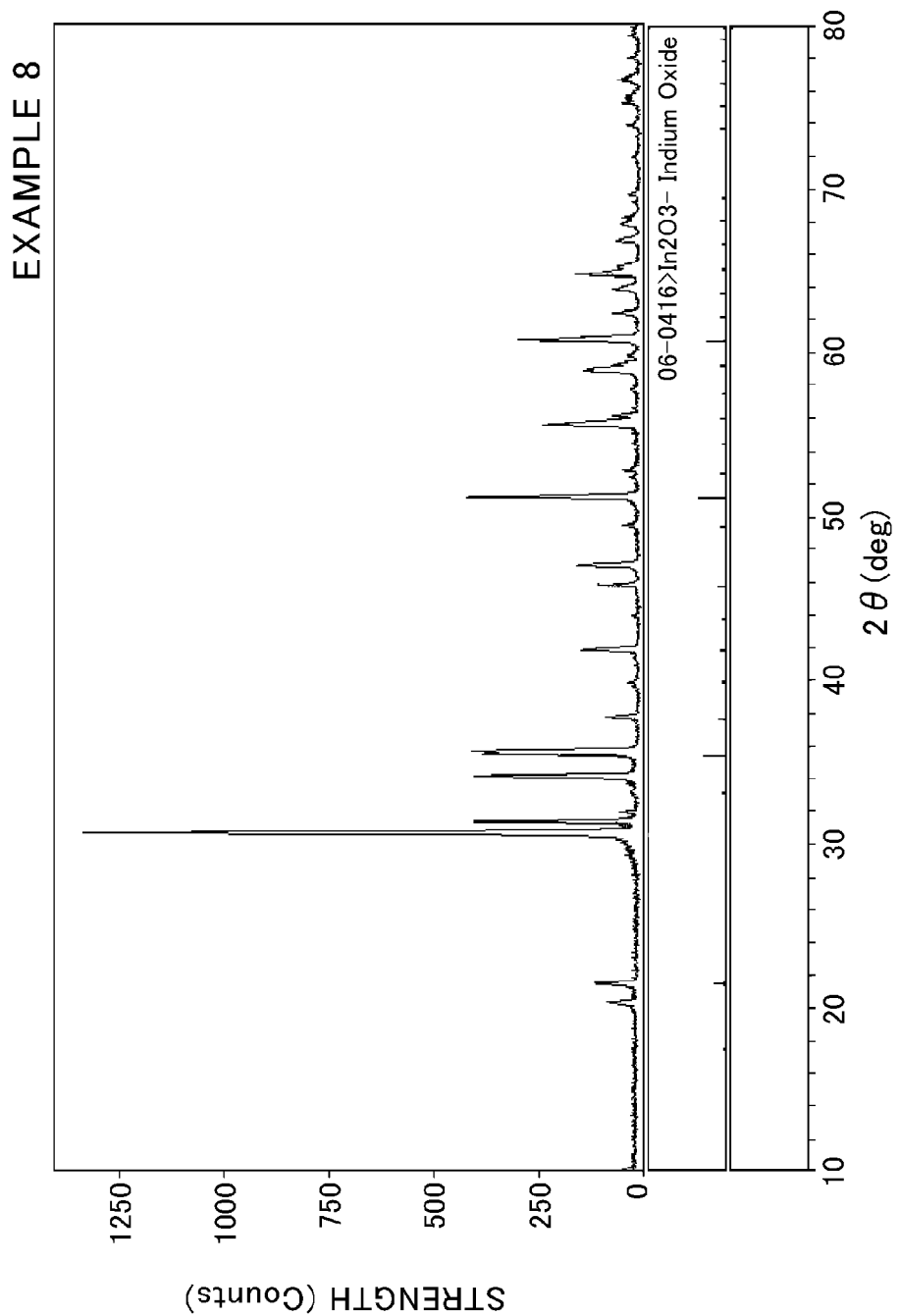
Figure 13:
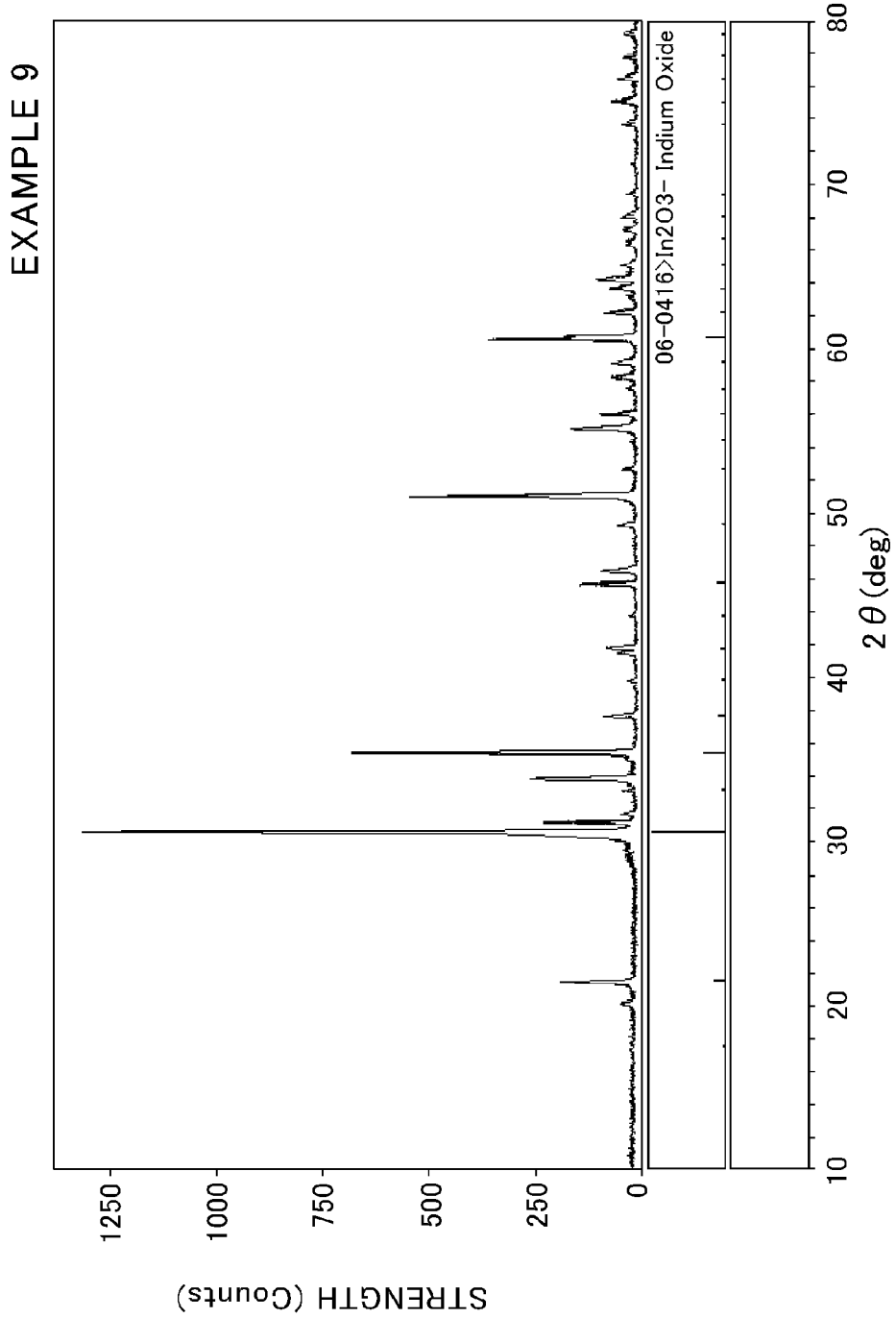
Figure 14:
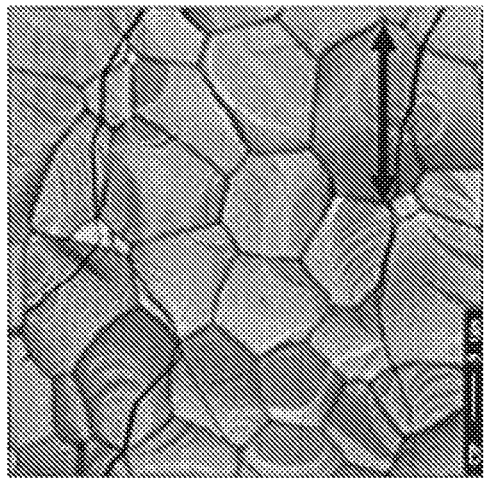
Figure 15:
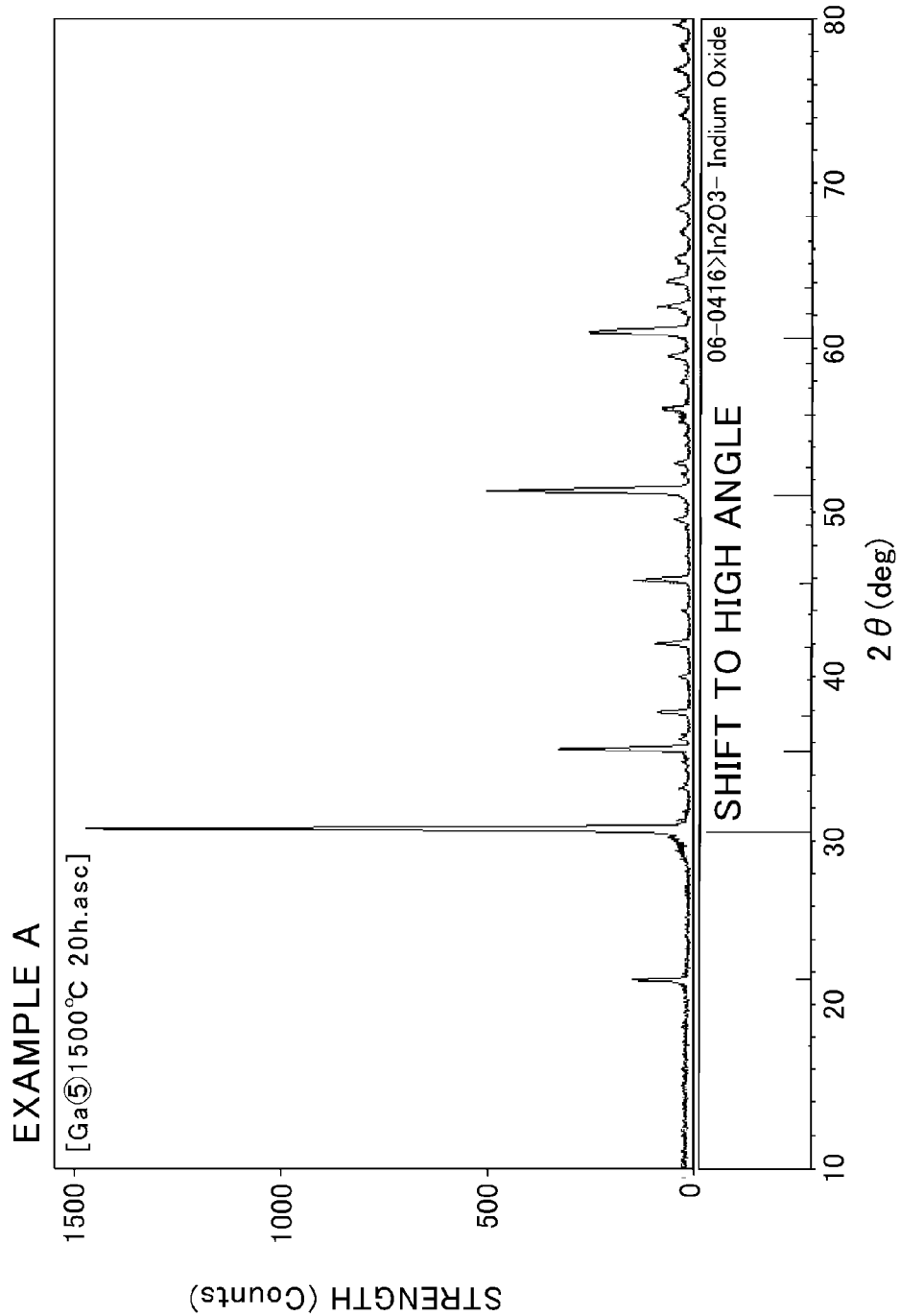
Figure 16:
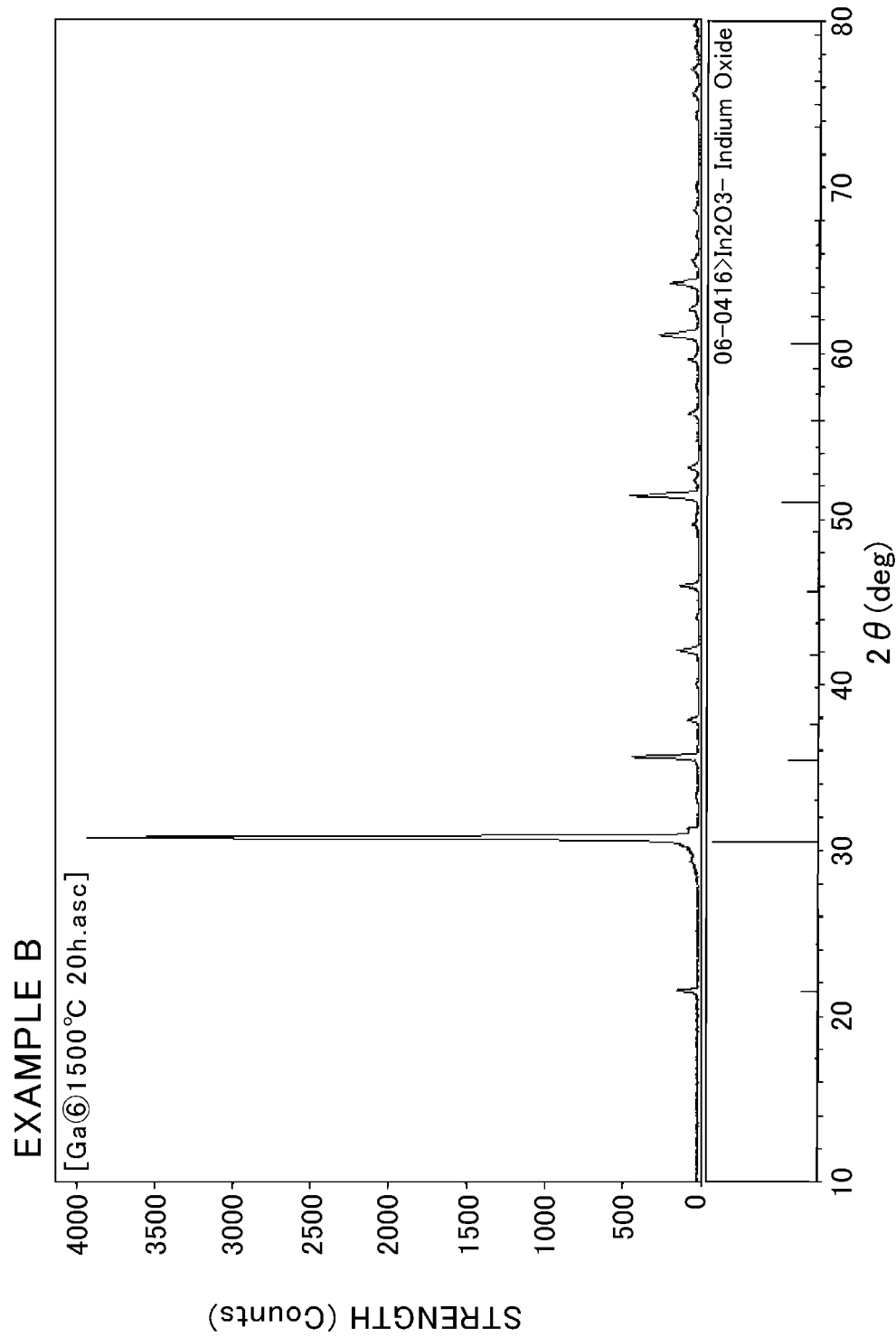
Figure 17:
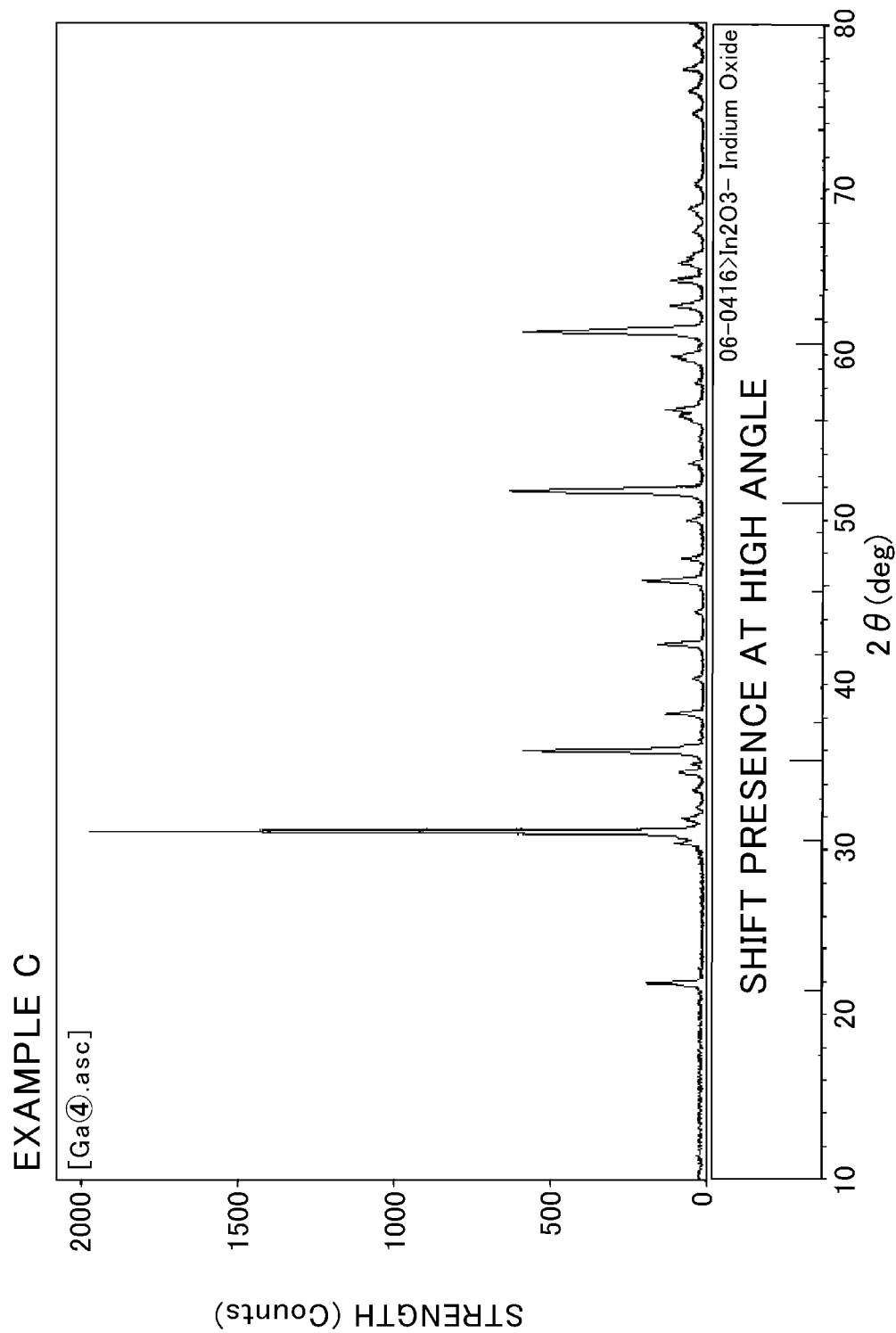
Figure 18:
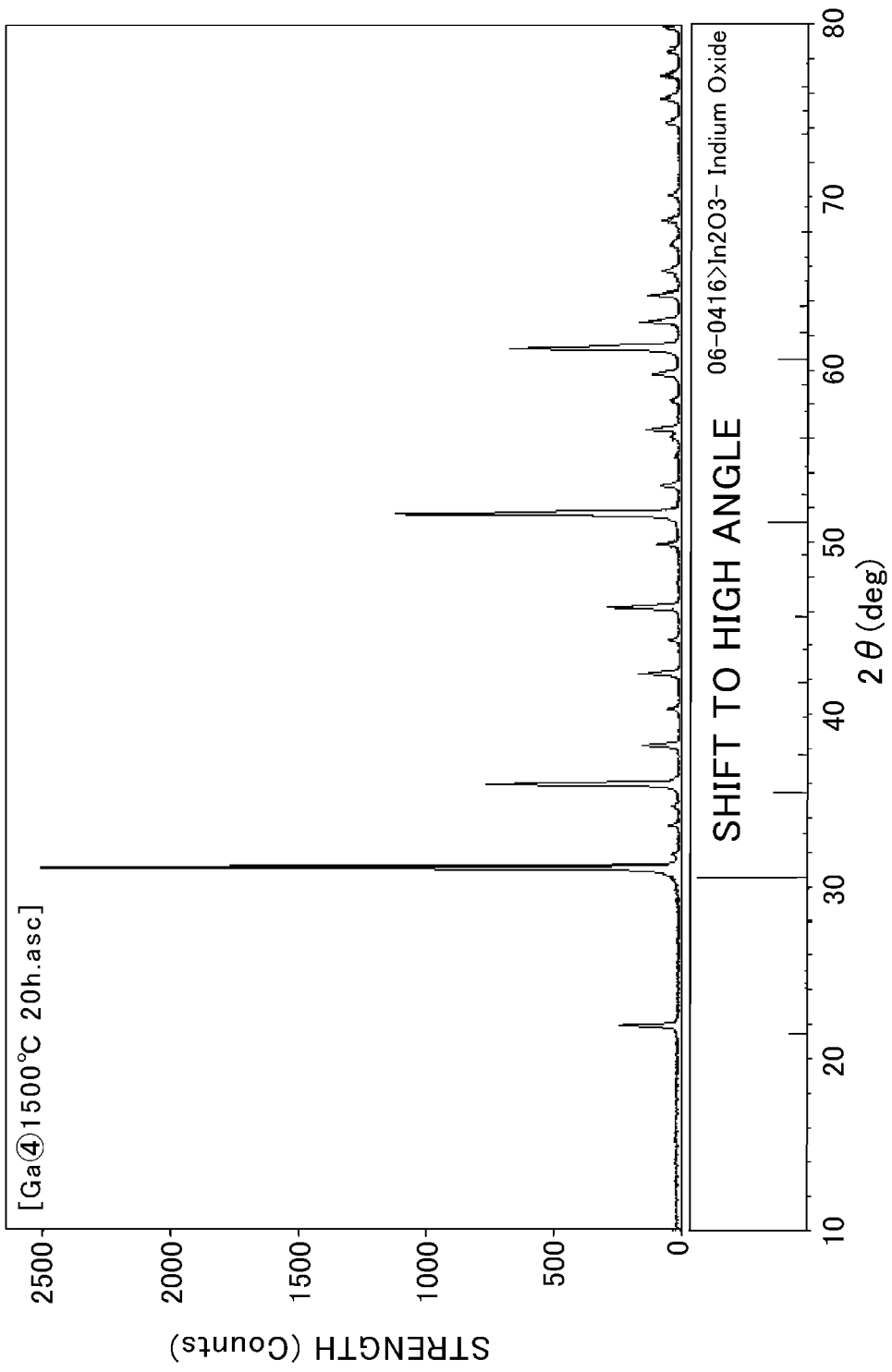
Figure 19:
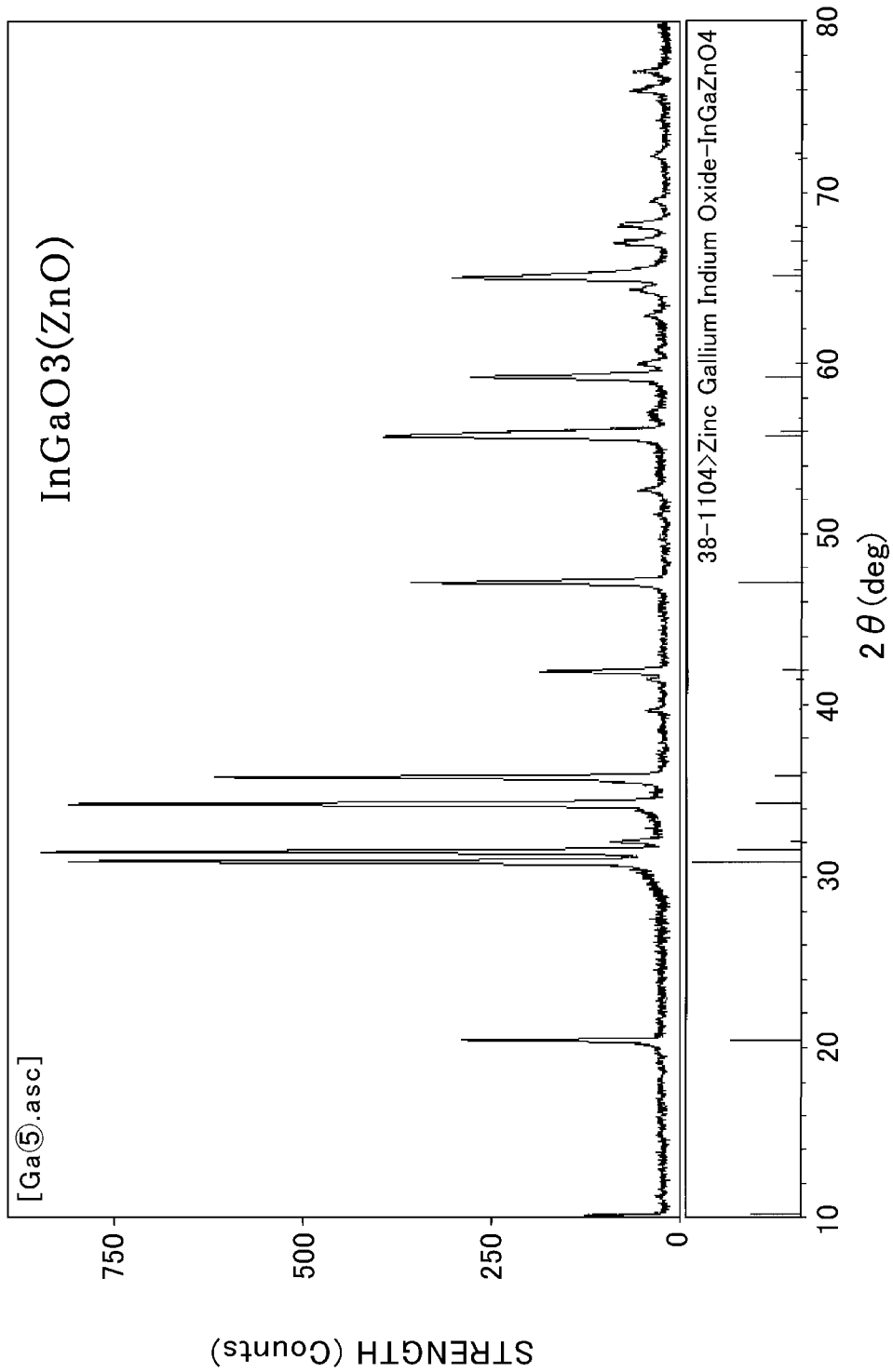
Figure 20:
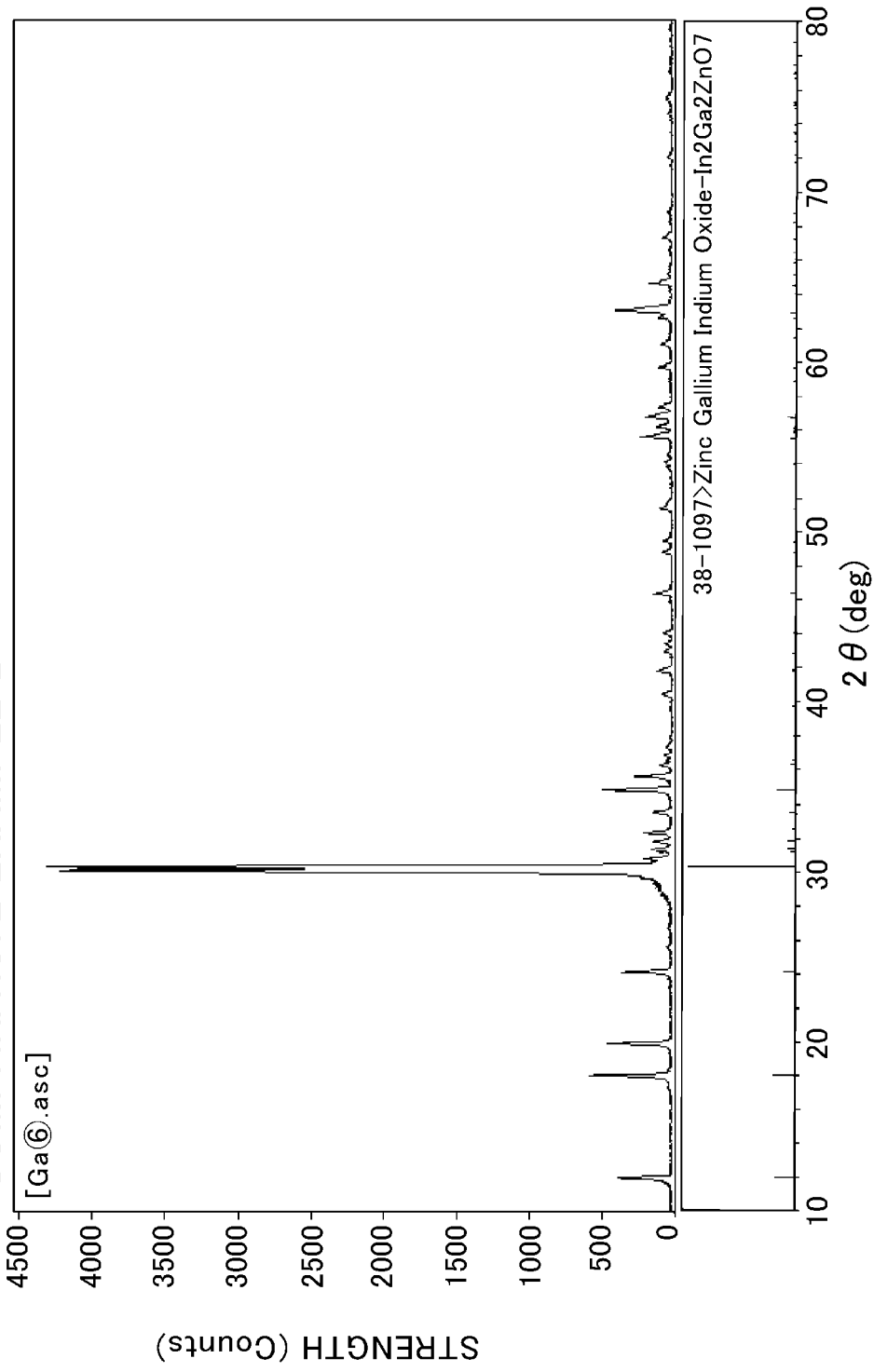
Figure 21:
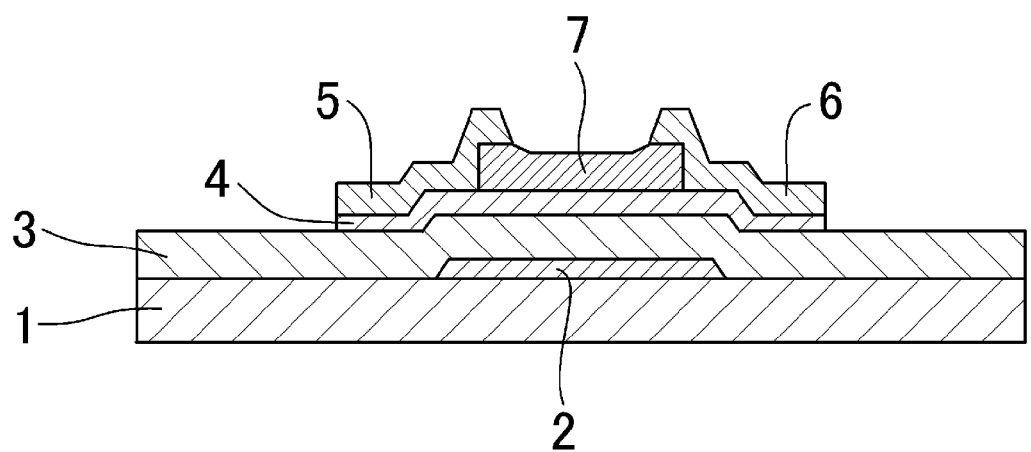
Figure 22:
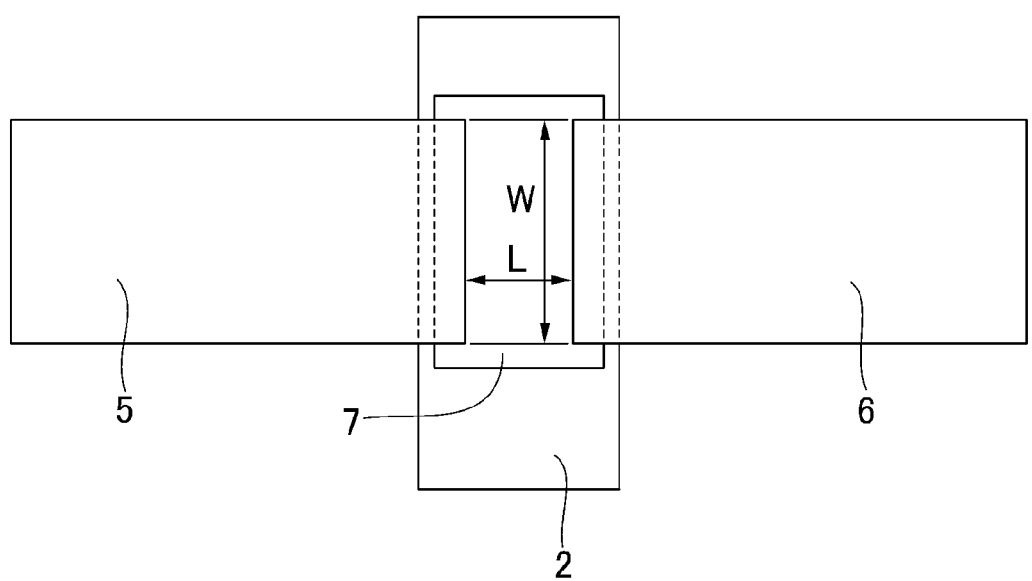

| Explanation for numbers | |
|---|---|
| 1 | Substrate |
| 2 | Gate electrode |
| 3 | Gate insulation film |
| 4 | Channel layer |
| 5 | Source electrode |
| 6 | Drain electrode |
| 7 | Protective film |
| 11 | Substrate |
| 12 | Gate electrode |
| 13 | Gate insulation film |
| 14 | Channel layer |
| 15 | Source electrode |
| 16 | Drain electrode |
| 17 | Protective film |

We claim:
1. An oxide sintered body comprising:
a) indium oxide having a bixbyite structure and
b) either:
   i) a compound having a $Yb_2Fe_3O_7$ structure compound represented by the formula: $In_2Ga_2ZnO_7$, or
   ii) a homologous structure compound represented by $InGaO_3(ZnO)_m$, where m is 1,
in which a composition amount of indium (In), gallium (Ga) and zinc (Zn) by atom ratio in the oxide sintered body is in a composition range of the following formula

$$In/(In+Ga+Zn)<0.75.$$

2. The oxide sintered body of claim 1, in which the composition amount of indium (In), gallium (Ga) and zinc (Zn) by atom ratio meets the following formula $$0.10<Ga/(In+Ga+Zn)<0.49.$$

3. The oxide sintered body of claim 1, in which the composition amount of indium (In), gallium (Ga) and zinc (Zn) by atom ratio meets the following formula $$0.05<Zn/(In+Ga+Zn)<0.65.$$

4. An oxide sintered body comprising indium oxide having a bixbyite structure, and a $Yb_2Fe_3O_7$ structure compound represented by the formula: $In_2Ga_2ZnO_7$.

5. The oxide sintered body of claim 4, in which a composition amount of indium (In), gallium (Ga) and zinc (Zn) by atom ratio is in a composition range of the following formula $$0.5<In/(In+Ga)<0.98, 0.6<Ga/(Ga+Zn)<0.99.$$

6. The oxide sintered body of claim 4, in which a part of In in said indium oxide and $In_2Ga_2ZnO_7$ is subjected to solid solution substitution by a metal element (X) having positive four or more valence.

7. An oxide sintered body comprising indium oxide having a bixbyite structure, and a homologous structure compound represented by $InGaO_3(ZnO)_m$, wherein m is 1.

8. The oxide sintered body of claim 7, in which a composition amount of indium (In), gallium (Ga) and zinc (Zn) in said oxide sintered body by atom ratio is in a composition range of the following formula $$0.5<In/(In+Ga)<0.99, 0.2<Zn/(In+Ga+Zn)<0.7.$$

9. The oxide sintered body of claim 7, in which a part of In in said indium oxide or said one or more homologous structure compounds is subjected to solid solution substitution by a metal element having positive four or more valence.

10. The oxide sintered body of claim 1 in which relative density is 80% or more.

11. The oxide sintered body of claim 1 in which relative density is 90% or more.

12. The oxide sintered body of claim 1 in which bulk resistance is in a range of 0.1 to 100 mΩ·cm.

13. The oxide sintered body of claim 1 in which bulk resistance is $1\times10^{-2}$ Ωcm or less.

14. The oxide sintered body of claim 1 in which lattice constant a is a<10.12 Å.

15. The oxide sintered body of claim 6, comprising a metal element having positive four or more valence in an amount of 10 to 10000 ppm based on the atomicity of all the atoms other than oxide as 100 atom %.

16. The oxide sintered body of claim 6, in which said metal element (X) having positive four or more valence is subjected to solid solution substitution at a ratio of (the metal element (X) having positive four or more valence)/(all the metal elements in the oxide sintered body)=100 ppm to 10000 ppm.

17. The oxide sintered body of claim 15, in which said metal element (X) having positive four or more valence is one or more elements selected from the group consisting of tin, zirconium, germanium, cerium, niobium, tantalum, molybdenum, tungsten, and titanium.

18. A sputtering target composed of the oxide sintered body of claim 1.

19. A method for preparing the oxide sintered body of claim 1 comprising the following steps;
  (a) mixing a crude oxide powder;
  (b) forming the obtained mixture; and
  (c) sintering the obtained formed body at 1200° C. or more and less than 1600° C.

20. A method for preparing the oxide sintered body of claim 1 comprising the following steps;
  (a) mixing a crude oxide powder;
  (b) forming the obtained mixture; and
  (c) sintering the obtained formed body at 1200° C. or more and 1400° C. or less.

21. An oxide thin film formed by a sputtering method using said sputtering target of claim 18.

22. A method for forming an amorphous oxide thin film having electric carrier concentration of less than $1\times10^{18}/cm^3$, in which said method comprises a step of conducting sputtering using the sputtering target of claim 18 at a film forming temperature from 25 to 450° C.

23. The method of claim 22 wherein the amorphous oxide thin film is a thin film used for a channel layer of a thin film transistor.

24. A method for producing a thin film transistor containing an amorphous oxide thin film and an oxide insulation layer, comprising the steps of
  (i) heat-treating the amorphous oxide thin film formed by the method of claim 22 within oxidation atmosphere; and
  (ii) forming the oxide insulation layer on the heat-treated amorphous oxide thin film.

25. A semi-conductor device having the thin film transistor prepared by the method for producing a thin film transistor of claim 24.

* * * * *